US008133783B2

(12) United States Patent
Gogoi

(10) Patent No.: US 8,133,783 B2
(45) Date of Patent: Mar. 13, 2012

(54) SEMICONDUCTOR DEVICE HAVING DIFFERENT STRUCTURES FORMED SIMULTANEOUSLY

(75) Inventor: Bishnu P. Gogoi, Scottsdale, AZ (US)

(73) Assignee: HVVi Semiconductors, Inc., Phoenix, AZ (US)

( * ) Notice: Subject to any disclaimer, the term of this patent is extended or adjusted under 35 U.S.C. 154(b) by 83 days.

(21) Appl. No.: 12/255,424

(22) Filed: Oct. 21, 2008

(65) Prior Publication Data

US 2009/0261396 A1 Oct. 22, 2009

Related U.S. Application Data

(60) Provisional application No. 60/983,037, filed on Oct. 26, 2007.

(51) Int. Cl.
*H01L 21/336* (2006.01)
*H01L 21/8238* (2006.01)
*H01L 21/8234* (2006.01)
*H01L 21/70* (2006.01)

(52) U.S. Cl. ........ 438/267; 438/201; 438/210; 438/275; 257/501; 257/E21.681; 257/E27.016

(58) Field of Classification Search .................. 438/201, 438/210, 209, 267, 304, 596, 275; 257/500, 257/501, E21.681, E27.016
See application file for complete search history.

(56) References Cited

U.S. PATENT DOCUMENTS

| | | | | |
|---|---|---|---|---|
| 5,156,993 | A | 10/1992 | Su | |
| 5,321,298 | A | 6/1994 | Moslehi | |
| 5,395,778 | A * | 3/1995 | Walker | 438/265 |
| 5,550,072 | A * | 8/1996 | Cacharelis et al. | 438/201 |
| 5,850,093 | A | 12/1998 | Tarng et al. | |
| 5,903,500 | A * | 5/1999 | Tsang et al. | 365/189.05 |
| 6,020,227 | A * | 2/2000 | Bulucea | 438/194 |
| 6,037,625 | A * | 3/2000 | Matsubara et al. | 257/315 |
| 6,211,549 | B1 | 4/2001 | Funaki et al. | |
| 6,709,931 | B2 | 3/2004 | Kim | |
| 7,081,394 | B2 | 7/2006 | Kim et al. | |
| 7,094,652 | B2 | 8/2006 | Watanabe et al. | |
| 7,372,104 | B2 | 5/2008 | Wu et al. | |
| 2003/0067050 | A1 | 4/2003 | Kim | |
| 2004/0065917 | A1 * | 4/2004 | Fan et al. | 257/315 |
| 2004/0084721 | A1 | 5/2004 | Kocon et al. | |
| 2004/0203207 | A1 | 10/2004 | Watanabe et al. | |

(Continued)

FOREIGN PATENT DOCUMENTS

JP 2004087818 A 3/2004

(Continued)

OTHER PUBLICATIONS

International Preliminary Report on Patentability/ Written Opinion received for PCT Application No. PCT/US2008/080960, mailed on May 6, 2010, 7 pages.

(Continued)

*Primary Examiner* — Matthew Landau
*Assistant Examiner* — Daniel Luke
(74) *Attorney, Agent, or Firm* — Cool Patent, P.C.; Kenneth J. Cool

(57) ABSTRACT

In various embodiments, semiconductor structures and methods to manufacture these structures are disclosed. In one embodiment, a method includes forming a portion of the unidirectional transistor and a portion of a bidirectional transistor in or over a semiconductor material simultaneously. Other embodiments are described and claimed.

4 Claims, 52 Drawing Sheets

U.S. PATENT DOCUMENTS

| | | | | |
|---|---|---|---|---|
| 2006/0003518 | A1* | 1/2006 | Harter et al. | 438/222 |
| 2006/0084226 | A1 | 4/2006 | Nakamura | |
| 2007/0132033 | A1 | 6/2007 | Wu et al. | |
| 2007/0194378 | A1 | 8/2007 | Richter et al. | |
| 2009/0261421 | A1 | 10/2009 | Gogoi et al. | |
| 2009/0261446 | A1 | 10/2009 | Gogoi | |

FOREIGN PATENT DOCUMENTS

| | | | |
|---|---|---|---|
| JP | 2005064529 | A | 3/2005 |
| JP | 2007220736 | A2 | 8/2007 |
| KR | 2001065328 | A | 11/2001 |
| WO | 2009/055565 | A2 | 4/2009 |
| WO | 2009/055570 | A2 | 4/2009 |
| WO | 2009/055572 | A2 | 4/2009 |
| WO | 20091055570 | A3 | 7/2009 |

OTHER PUBLICATIONS

International Preliminary Report on Patentability/ Written Opinion received for PCT Application No. PCT/US2008/080957, mailed on May 6, 2010, 6 pages.

International Preliminary Report on Patentability/ Written Opinion received for PCT Application No. PCT/US2008/080951, mailed on May 6, 2010, 5 pages.

International Search Report/Written Opinion received for PCT Patent Application No. PCT/US2008/080957 mailed on May 25, 2009, 11 pages.

International Search Report/Written Opinion received for PCT Patent Application No. PCT/US2008/080951 mailed on Jun. 25, 2009, 9 pages.

International Search Report and Written Opinion received for PCT Patent Application No. PCT/US2008/080960, mailed on Aug. 26, 2009, 13 pages.

Non Final Office Action received for U.S. Appl. No. 12/255,429, mailed on Sep. 1, 2010, 19 Pages.

Office Action received for U.S. Appl. No. 12/255,429, mailed on Dec. 7, 2010, 11 Pages.

Notice of Allowance received for U.S. Appl. No. 12/255,421, mailed on Dec. 6, 2010, 20 Pages.

"Final Office Action received for U.S. Appl. No. 12/255,429 dated Oct. 3, 2011", (Oct. 3, 2011), 11 pages.

* cited by examiner

10

10

710
284
262
264
266
12
712
44
46
48
76
78
80
82
424
290
280
282
142
504
404
352
510
506
508
512
514
516
518
520
522

SEMICONDUCTOR DEVICE HAVING DIFFERENT STRUCTURES FORMED SIMULTANEOUSLY

CROSS-REFERENCE TO RELATED APPLICATIONS

The present application claims the benefit of U.S. Provisional Application No. 60/983,037 filed Oct. 26, 2007. Said Application No. 60/983,037 is hereby incorporated by reference.

Embodiments disclosed in the present disclosure relate generally to electrical and semiconductor technology, and more specifically to a semiconductor structure that includes an integrated circuit.

BACKGROUND

Integrated active and passive devices may be formed together using semiconductor processing technology. Semiconductor designers may balance cost and complexity to integrate devices of different types. One challenge is finding effective isolation techniques to effectively isolate devices of different types within the semiconductor die. For example, higher voltage transistors may be formed together with lower voltage transistors on the same semiconductor substrate, and isolation between these transistors may be achieved to provide isolation, reduced cost, and/or reduced complexity.

Figure 1:
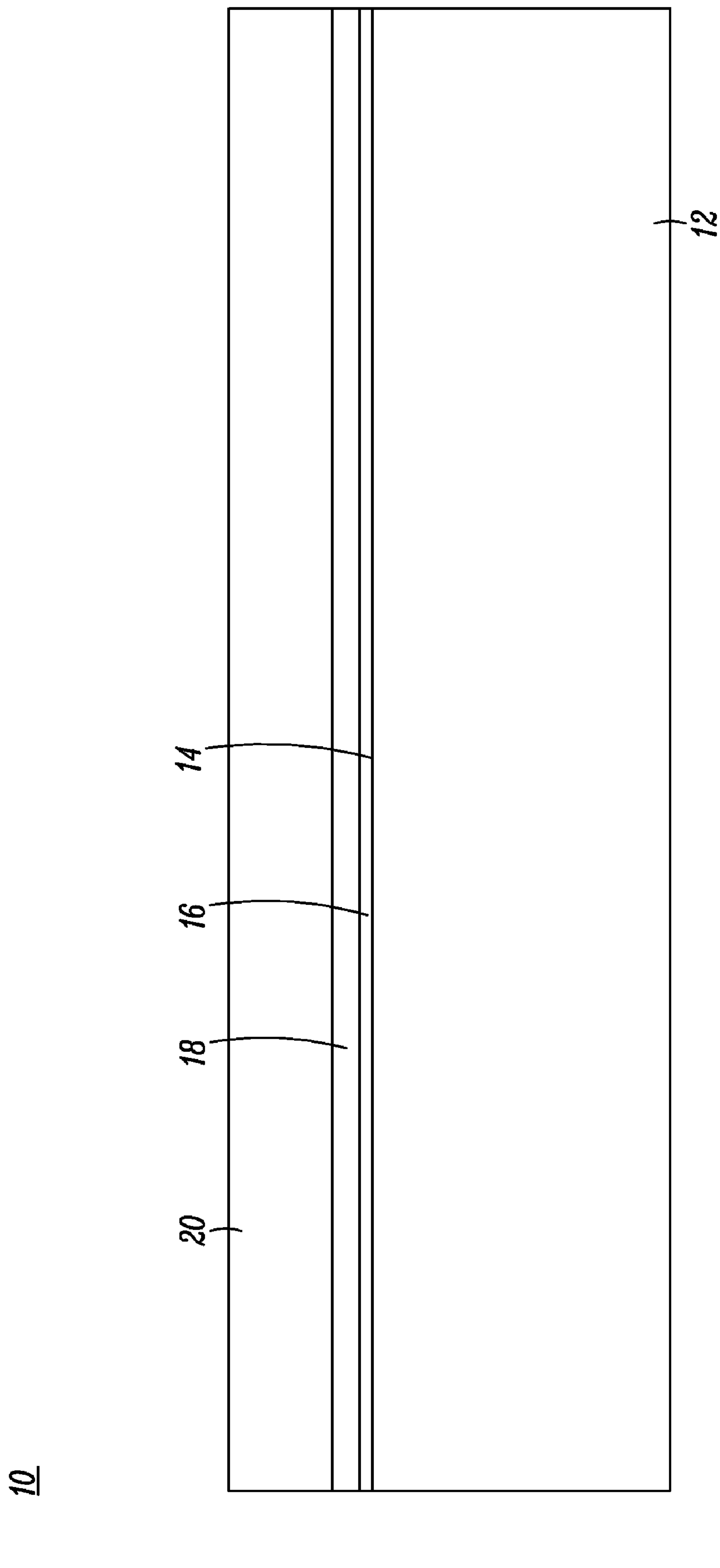
FIG. 1 is a cross-sectional side view of a portion of a semiconductor structure during manufacture in accordance with one or more embodiments.

For simplicity of illustration and ease of understanding, elements in the various figures are not necessarily drawn to scale, unless explicitly so stated. Further, if considered appropriate, reference numerals have been repeated among the figures to indicate corresponding and/or analogous elements. In some instances, well-known methods, procedures, components and circuits have not been described in detail so as not to obscure the present disclosure. The following detailed description is merely exemplary in nature and is not intended to limit the disclosure of this document and uses of the disclosed embodiments. Furthermore, there is no intention that the appended claims be limited by the title, technical field, background, or abstract.

DETAILED DESCRIPTION

In the following description and claims, the terms "comprise" and "include," along with their derivatives, may be used and are intended as synonyms for each other. In addition, in the following description and claims, the terms "coupled" and "connected," along with their derivatives, may be used. "Connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. For example, "coupled" may mean that two or more elements do not contact each other but are indirectly joined together via another element or intermediate elements. Finally, the terms "on," "overlying," and "over" may be used in the following description and claims. "On," "overlying," and "over" may be used to indicate that two or more elements are in direct physical contact with each other. However, "over" may also mean that two or more elements are not in direct contact with each other. For example, "over" may mean that one element is above another element but not contact each other and may have another element or elements in between the two elements.

FIG. 1 is a cross-sectional side view of a portion of an integrated circuit 10 during manufacture in accordance with an embodiment. As will be discussed below, integrated circuit 10 may also be referred to as a semiconductor device, a semiconductor component, or a semiconductor structure. While an integrated circuit is discussed herein, the methods and apparatuses discussed herein may also be used with other devices, such as, discrete devices.

In one or more embodiments, integrated circuit 10 may comprise one or more transistors. Transistors may be referred to generally as active elements or active devices and resistors, inductors, and capacitors may be referred to generally as passive elements or passive devices. As is generally understood, a bipolar transistor includes a collector region, a base region, and an emitter region and a field effect transistor (FET) includes a gate, a drain region, a source region, and a channel region. The drain region, the source region, the channel region, or the gate of a FET may each be referred to as a portion, a part, a component, or an element of the FET, and similarly, the collector region, the base region, and the emitter region of a bipolar transistor may each be referred to as a portion, a part, a component, or an element of the bipolar transistor.

Generally, transistors such as bipolar transistors and field effect transistors (FETs) discussed herein are understood to provide a conduction path between first and second conduction electrodes when a control signal is applied to a control electrode. For example, in a FET a channel region formed between the drain and source regions provides the conduction path which is controlled in accordance with the magnitude of the control signal. The gate electrode of a FET may be referred to as a control electrode and the drain and source electrodes of a FET may be referred to as current carrying electrodes or conduction electrodes. Likewise, the base of a bipolar transistor may be referred to as the control electrode and the collector and emitter electrodes of the bipolar transistor may be referred to as conduction electrodes or current carrying electrodes. In addition, the drain and source electrodes of a FET may be referred to as power electrodes and the collector and emitter electrodes of a bipolar transistor may also be referred to as power electrodes.

What is shown in FIG. 1 is a substrate 12 having a major surface 14. Although not shown, substrate 12 also has an opposing boundary or bottom surface that is parallel to, or substantially parallel to, top surface 14. In accordance with one embodiment, substrate 12 comprises silicon doped with an impurity material of P-type conductivity such as, for example, boron. By way of example, the conductivity of substrate 12 ranges from about 5 ohm-centimeters (Ω-cm) to about 20 Ω-cm, although the methods and apparatuses described herein are not limited in this regard. The type of material for substrate 12 is not limited to being silicon, and the conductivity type of substrate 12 is not limited to being P-type conductivity. An impurity material is also referred to as a dopant or impurity species. In other embodiments, substrate 12 may comprise germanium, silicon germanium, a semiconductor-on-insulator ("SOI") material, substrates with epitaxial layers, and the like. In addition, substrate 12 can be comprised of a compound semiconductor material such as Group III-V semiconductor materials, Group II-VI semiconductor materials, etc.

A layer of dielectric material 16 is formed over surface 14, and a layer of dielectric material 18 is formed over dielectric layer 16. In accordance with one embodiment, dielectric material 16 comprises a thermally grown oxide having a thickness ranging from about 50 Angstroms (Å) to about 500 Å, and dielectric material 18 comprises silicon nitride ($Si_3N_4$) having a thickness ranging from about 500 Å to about 2,500 Å. Oxide layer 16 may also be referred to as a buffer oxide layer. Silicon nitride layer 18 can be formed using chemical vapor deposition ("CVD") techniques such as, for example, lower pressure chemical vapor deposition ("LPCVD") or plasma enhanced chemical vapor deposition ("PECVD").

A layer of photoresist 20 is formed over silicon nitride layer 18. Photoresist layer 20 can comprise positive or negative photoresist. Other photoresist layers described herein can also comprise positive or negative photoresist.

Figure 2:
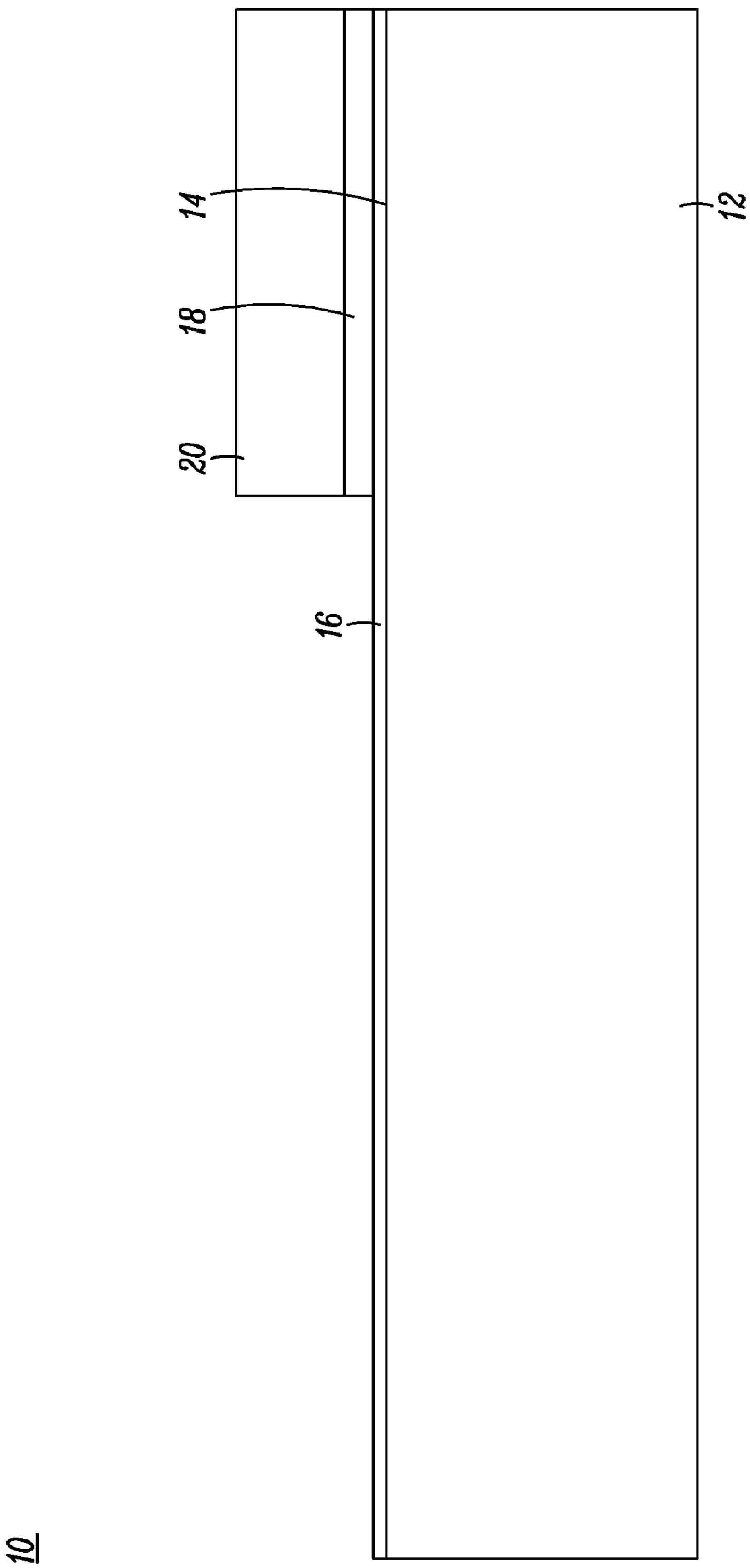
FIG. 2 is a cross-sectional view of the semiconductor structure of FIG. 1 at a later stage of manufacture.

Referring now to FIG. 2, photoresist layer 20 is patterned so that a portion of photoresist layer 20 is removed and a portion of layer 20 remains over and protects a portion of silicon nitride layer 18. In other words, an opening is formed in photoresist layer 20 to expose a portion of silicon nitride layer 18. The remaining portion of layer 20 is also referred to as a masking structure or simply a mask. The exposed portion of silicon nitride layer 18 can be anisotropically etched to expose a portion of oxide layer 16. The remaining portions of silicon nitride layer 18 and photoresist layer 20 define an edge of a doped region that will be formed in substrate 12 and described with reference to FIG. 3.

Figure 3:
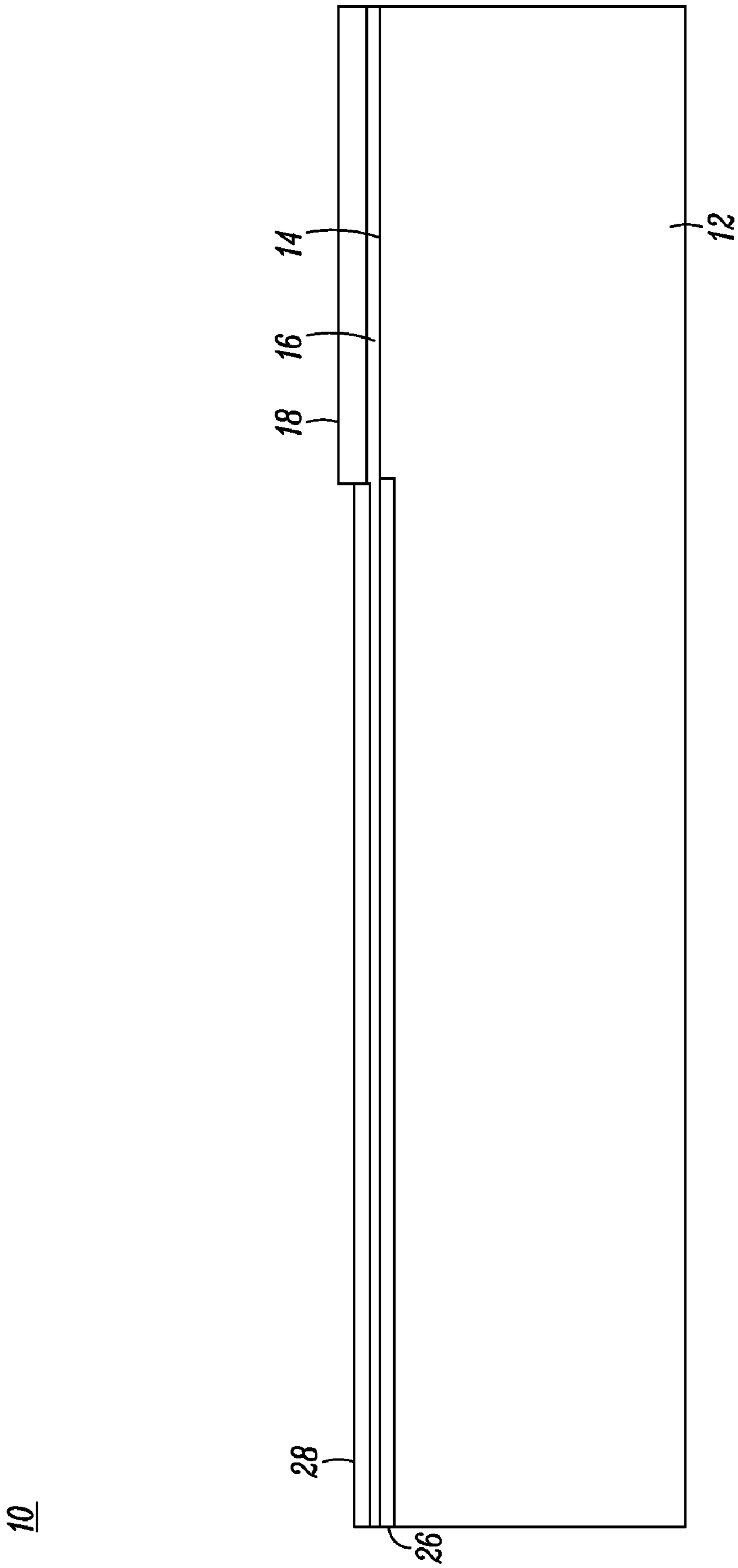
FIG. 3 is a cross-sectional view of the semiconductor structure of FIG. 2 at a later stage of manufacture.

Referring now to FIG. 3, an impurity material of N-type conductivity can be implanted through the opening of mask 20 (FIG. 2) and through the exposed portion of oxide layer 16 to form a doped region 26 of N-type conductivity in substrate 12. A doped region can also be referred to as an implant region. The implant can include implanting a dopant of N-type conductivity such as, for example, phosphorus at a dose ranging from about 1011 ions per square centimeter (ions/cm$^2$) to about $10^{13}$ using an implant energy ranging from about 100 kilo-electron Volts (keV) to about 300 keV. Other suitable N-type conductivity impurity materials include arsenic and antimony. The implant can be a zero degree implant or a tilt angle implant. After the implant, mask 20 (FIG. 2) is removed.

An oxide layer 28 having a thickness ranging from about 50 Å to about 300 Å can be formed over the exposed portion of oxide layer 16. Oxide layer 28 can be self-aligned to doped region 26. Oxide layer 28 can be formed by thermal oxidation of substrate 12 so that a discontinuity (not shown) forms in oxide layer 16 that serves as an alignment key or alignment mark at a lateral boundary of doped region 26. The discontinuity or alignment mark results from the difference in oxidation rates between doped and undoped portions of silicon substrate 12.

Figure 4:
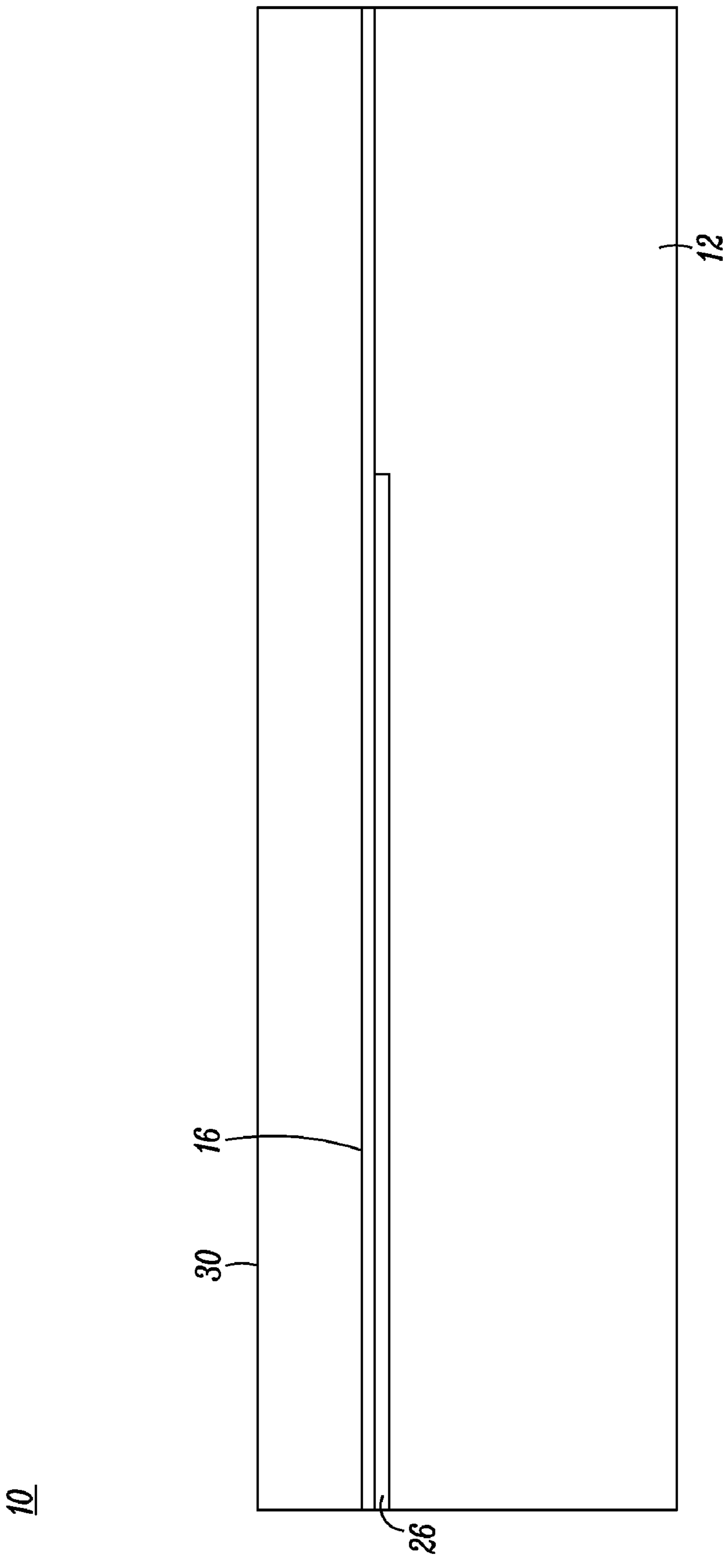
FIG. 4 is a cross-sectional view of the semiconductor structure of FIG. 3 at a later stage of manufacture.

Referring now to FIG. 4, nitride layer 18 (FIG. 3) and oxide layer 28 (FIG. 3) can be stripped from integrated circuit 10, and oxide layer 16 can be thinned to serve as a screen oxide. By way of example, oxide layer 16 is thinned to have a thickness ranging from about 50 Å to about 100 Å. A layer of photoresist 30 can be formed over oxide layer 16.

Figure 5:
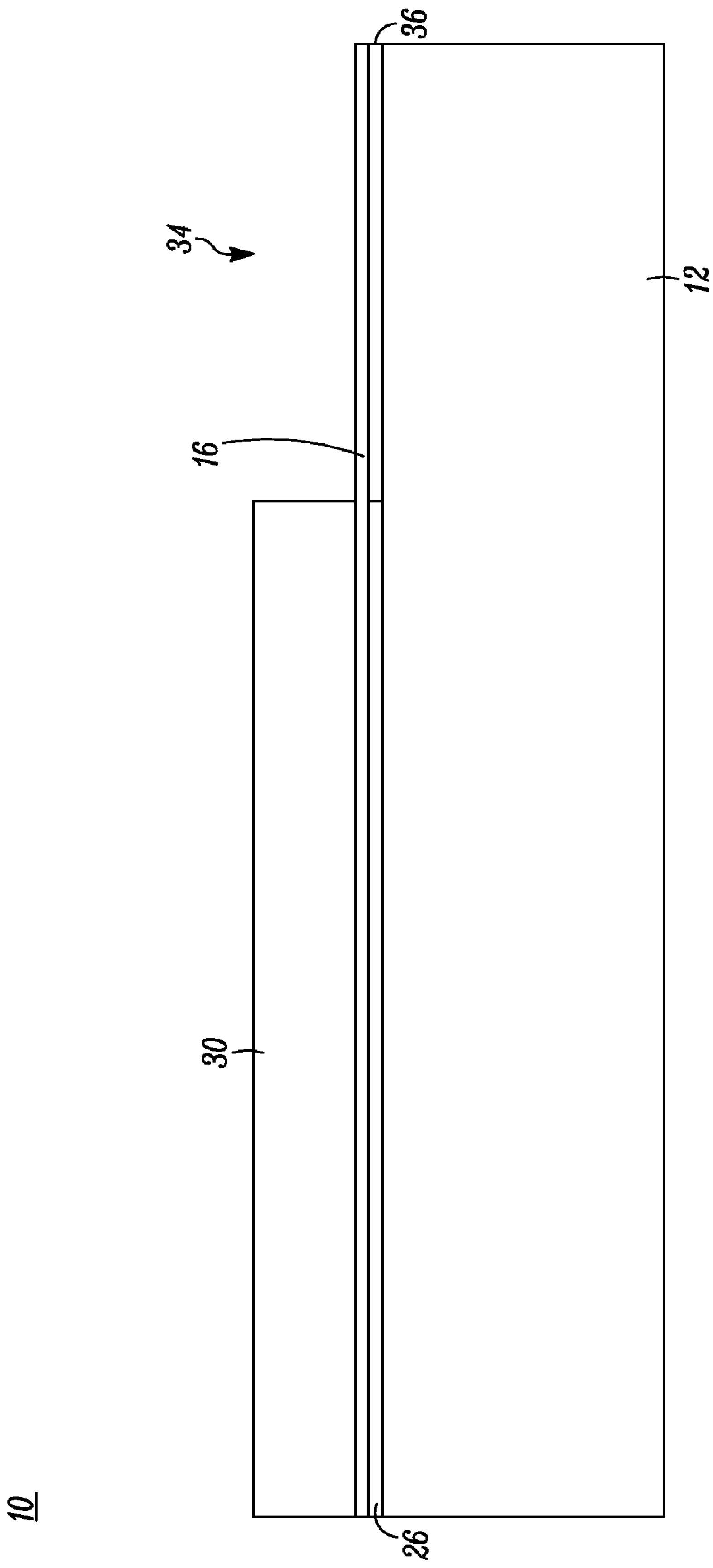
FIG. 5 is a cross-sectional view of the semiconductor structure of FIG. 4 at a later stage of manufacture.

Referring now to FIG. 5, photoresist layer 30 can be patterned so that a portion of the photoresist layer is removed to form a mask 30 and an opening 34. Opening 34 can be formed in photoresist layer 30 to expose a portion of oxide layer 16.

An impurity material of P-type conductivity can be implanted through opening 34 and through the exposed portion of oxide layer 16 to form a doped region 36 of P-type conductivity in substrate 12. The implant can include implanting the dopant at a dose ranging from about $10^{11}$ ions/cm$^2$ to about 1013 ions/cm$^2$ using an implant energy ranging from about 50 keV to about 200 keV. Suitable dopants of P-type conductivity include boron and indium. The implant can be a zero degree implant or a tilt angle implant. After the implant, mask 32 can be removed.

Figure 6:
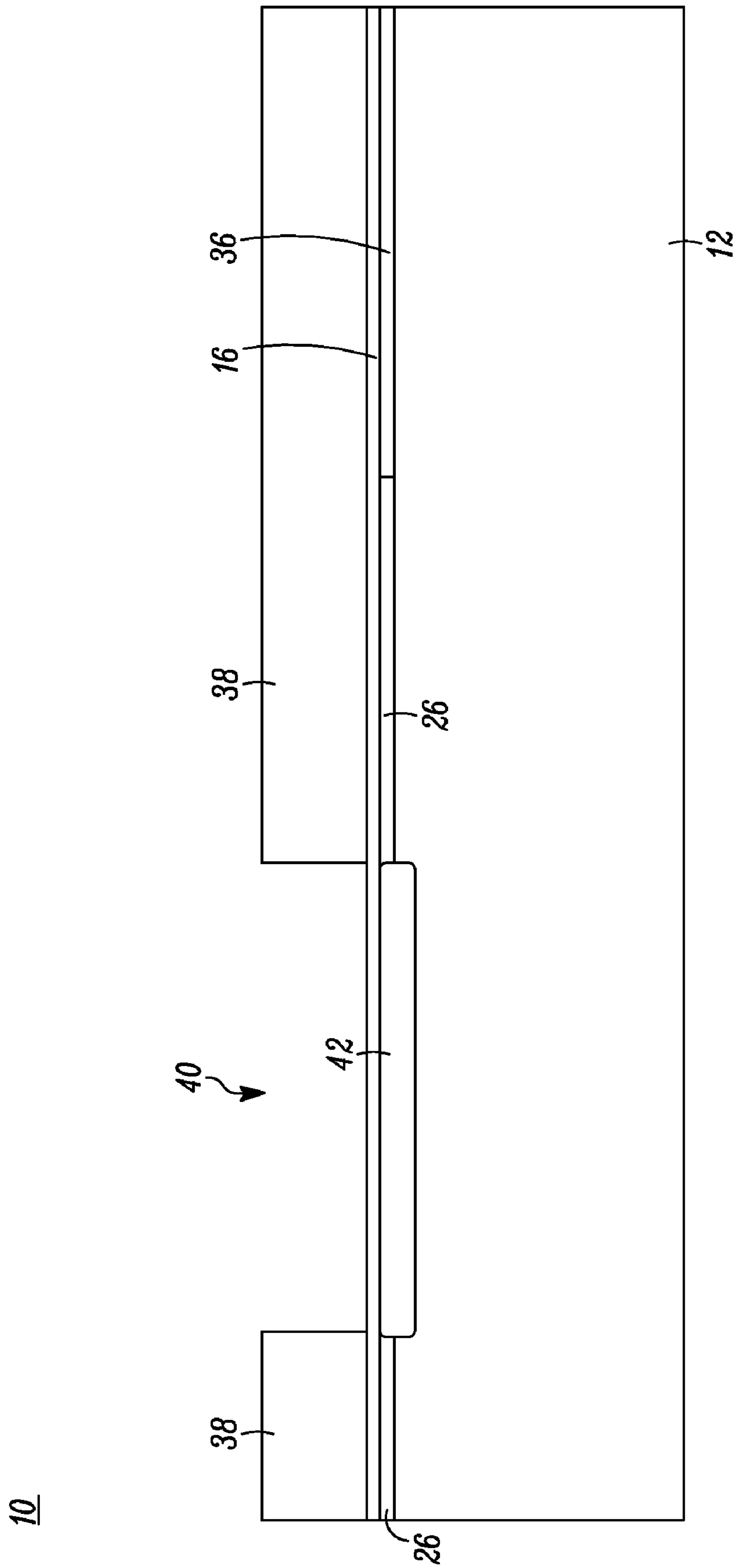
FIG. 6 is a cross-sectional view of the semiconductor structure of FIG. 5 at a later stage of manufacture.

Referring now to FIG. 6, a layer of photoresist 38 can be formed over oxide layer 16 and patterned to form a mask 38 and an opening 40 that exposes a portion of oxide layer 16. An impurity material of N-type conductivity can be implanted through opening 40 and through the exposed portion of oxide layer 16 to form a doped region 42 of N-type conductivity in substrate 12. In one embodiment, doped region 42 has a higher N-type concentration than doped region 26. The implant can include implanting a dopant of N-type conductivity such as, for example, phosphorus, at a dose ranging from about $10^{11}$ ions/cm$^2$ to about $10^{13}$ ions/cm$^2$ using an implant energy ranging from about 100 keV to about 300 keV. The implant can be a zero degree implant or a tilt angle implant. After the implant, photoresist layer 38 can be removed.

Figure 7:
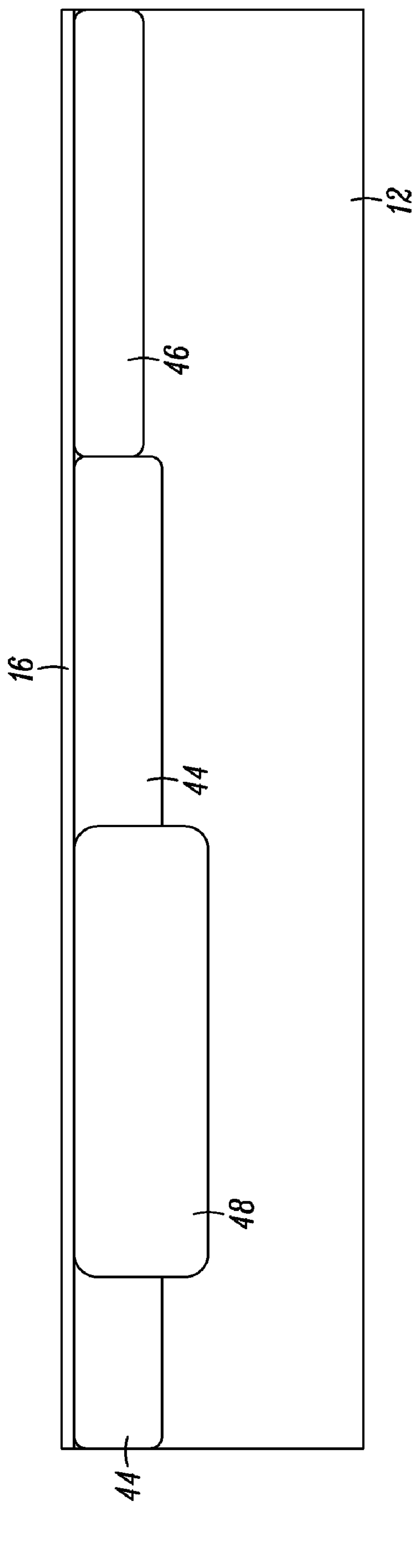
FIG. 7 is a cross-sectional view of the semiconductor structure of FIG. 6 at a later stage of manufacture.

Referring now to FIG. 7, an anneal can be performed which includes heating integrated circuit 10 to a temperature ranging from about 800 degrees Celsius (° C.) to about 1,100° C. in a nitrogen or nitrogen/oxygen ambient. Heating integrated circuit 10 anneals the portions of semiconductor substrate 12 that may have been damaged by implantation. Annealing semiconductor substrate 12 also drives the impurity material of doped regions 26 (FIG. 6), 36 (FIG. 6), and 42 (FIG. 6) deeper into semiconductor substrate 12 so that the depths and widths of doped regions 26 (FIG. 6), 36 (FIG. 6), and 42 (FIG. 6) increases. To distinguish doped regions 26 (FIG. 6), 36 (FIG. 6), and 42 (FIG. 6) before the anneal step from the doped regions after the anneal step, reference numbers 44, 46, and 48, respectively, are used to identify the doped regions after the anneal. In other words, the doped regions are identified by reference characters 26 (FIG. 6), 36 (FIG. 6), and 42 (FIG. 6) before the anneal and by reference characters 44, 46, and 48, respectively, after the anneal. A portion of doped region 44 between doped regions 46 and 48 serves as an N-well from which a P-channel transistor may be manufactured. Doped region 46 serves as a P-well from which an N-channel transistor may be manufactured, and doped region 48 serves as an N-well from which a higher voltage semiconductor transistor may be manufactured. In one embodiment, doped region 48 can be referred to as the active area of the higher voltage semiconductor transistor, and doped regions 44 and 46 can be referred to as the active areas of two of the complementary metal-oxide semiconductor (CMOS) devices. The N-channel MOSFET can also be referred to as an NMOS transistor and the P-channel MOSFET can also be referred to as a PMOS transistor.

Oxide layer 16 can be removed from the surface of semiconductor substrate 12. Although doped region 42 is discussed as being formed using a separate mask 38 (FIG. 6), the methods and apparatuses described herein are not limited in this regard. For example, depending on the desired doping concentration and depth for N-well 48, a portion of N-well 44 may serve as the N-well for a higher voltage transistor another portion of N-well 44 may serve as the N-well for a lower voltage N-channel transistor, In other words, the same doping and anneal operations may be used to form an N-well region, wherein portions of the N-well region may be used as the N-wells for different active devices in integrated circuit 10. Forming the N-well region in this manner can reduce the number of masks needed to form integrated circuit 10.

Figure 8:
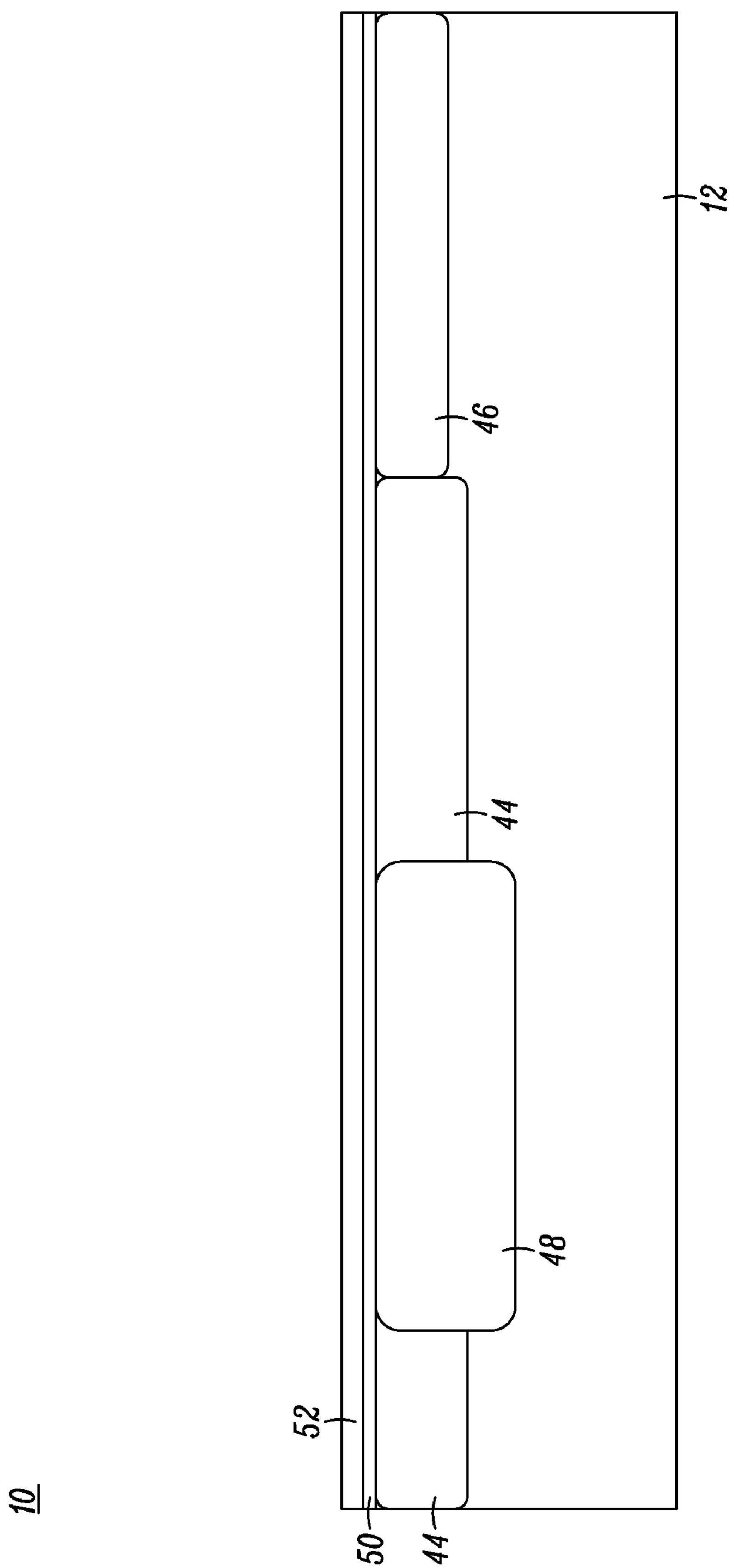
FIG. 8 is a cross-sectional view of the semiconductor structure of FIG. 7 at a later stage of manufacture.

Referring now to FIG. 8, a layer of dielectric material 50 can be formed over semiconductor substrate 12, and a layer of dielectric material 52 can be formed over dielectric layer 50. In accordance with one embodiment, dielectric material 50 can be a thermally grown oxide having a thickness ranging from about 50 Å to about 500 Å, and dielectric material 18 can comprise silicon nitride having a thickness ranging from about 500 Å to about 2,500 Å. Oxide layer 50 is also referred to as a buffer oxide layer, and it can reduce stress that occurs between a nitride layer and silicon. Oxide layer 50 may be formed between silicon substrate 14 and silicon nitride layer 52 to prevent damage that may result from forming silicon nitride layer 52 directly on substrate 14. Silicon nitride layer 52 may be formed using CVD, LPCVD, or PECVD techniques.

Figure 9:
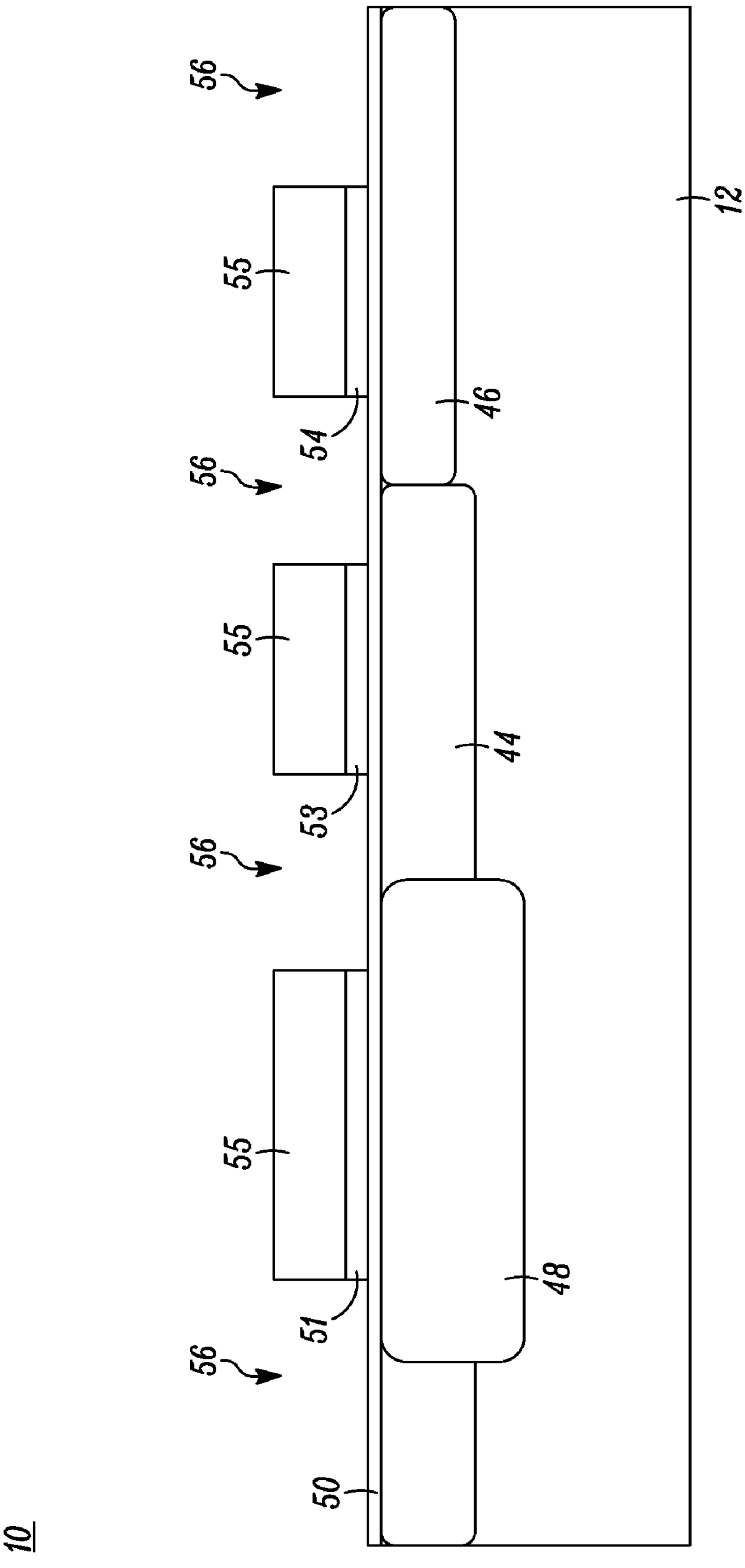
FIG. 9 is a cross-sectional view of the semiconductor structure of FIG. 8 at a later stage of manufacture.

Referring now to FIG. 9, a layer of photoresist can be formed over silicon nitride layer 52 and patterned to form a mask 55 and openings 56 that expose portions of silicon nitride layer 52 (FIG. 8). Mask 55 covers the regions that will be the active areas of integrated circuit 10 and the regions not covered by mask 55 will be processed further to be the isolation regions between the active areas. The exposed portions of silicon nitride layer 52 can be etched using an etch chemistry that preferentially etches silicon nitride. By way of example, silicon nitride layer 52 can be etched using anisotropic reactive ion etching. Other methods may also be used to remove portions of layer 52. For example, wet etching techniques and isotropic etching techniques can be used to etch silicon nitride layer 52. The anisotropic etching of silicon nitride layer 52 stops in or on oxide layer 50. After etching silicon nitride layer 52, at least portions 51, 53, and 54 of silicon nitride layer 52 remain on oxide layer 50. Then mask 55 can be removed.

Figure 10:
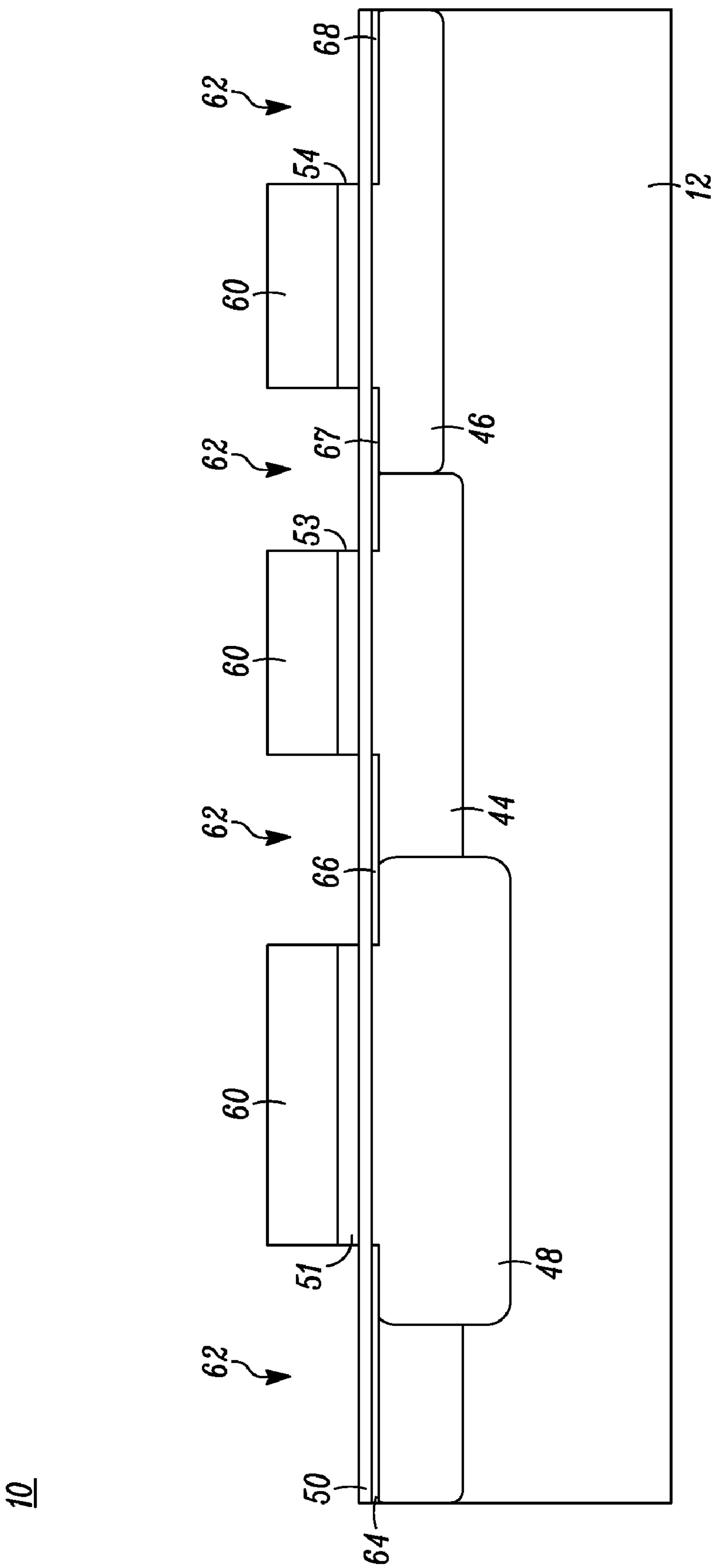
FIG. 10 is a cross-sectional view of the semiconductor structure of FIG. 9 at a later stage of manufacture.

Referring now to FIG. 10, a layer of photoresist can be formed over portions 51, 53, and 54 of silicon nitride layer 52 and over the exposed portions of oxide layer 50. The layer of photoresist can be patterned to form a mask 60 and openings 62. Mask 60 remains over portions 51, 53, and 54 of silicon nitride layer 52 (FIG. 8), and openings 62 expose portions of oxide layer 50 that are between portions 51, 53, and 54 of silicon nitride layer 52. In a different embodiment, mask 55 (FIG. 9) is not removed and remains over substrate 12, and mask 60 is not formed.

An impurity material of P-type conductivity can be implanted through openings 62 and through the exposed portions of oxide layer 50 to form doped regions 64, 66, 67, and 68 of P-type conductivity. The implant is referred to as a field implant and can serve to inhibit parasitic devices from turning on or becoming active by increasing their threshold voltages ("$V_T$"). The implant can include implanting the dopant of P-type conductivity such as, for example, boron at a dose ranging from about $10^{11}$ ions/cm$^2$ to about $10^{12}$ ions/cm$^2$ using an implant energy ranging from about 50 keV to about 100 keV. The implant can be a zero degree implant or a tilt angle implant.

Figure 11:
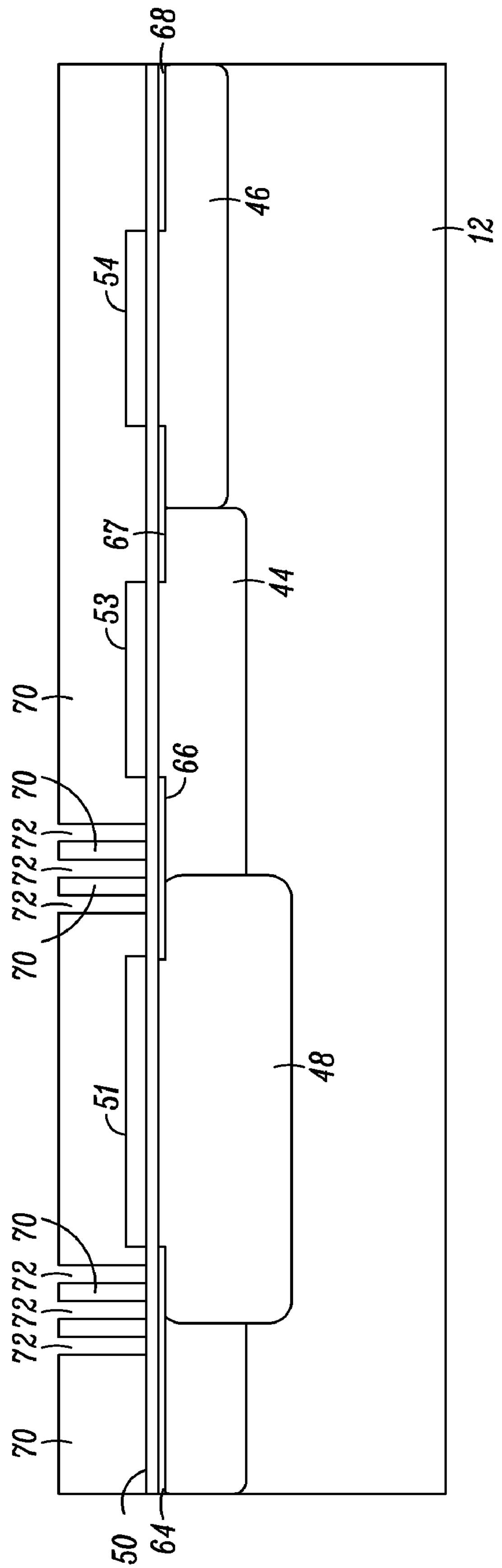
FIG. 11 is a cross-sectional view of the semiconductor structure of FIG. 10 at a later stage of manufacture.

Referring now to FIG. 11, mask 60 (FIG. 10) can be removed. A layer of photoresist can be formed over silicon nitride portions 51, 53, and 54 and over the exposed portions of oxide layer 50. The layer of photoresist can be patterned to form a mask 70 and openings 72. Mask 70 remains over and silicon nitride portions 51, 53, and 54 and portions of oxide layer 50. Openings 72 expose portions of oxide layer 50 that are adjacent to silicon nitride portion 51. In accordance with one embodiment, openings 72 are formed adjacent opposing sides of portion 51, wherein at least one of openings 72 exposes portions of oxide layer 50 over N-well 44, at least one of openings 72 exposes portions of oxide layer 50 over a region at which N-wells 44 and 48 abut each other, and at least one of openings 72 exposes portions of oxide layer 50 over N-well 44. Openings 72 can be formed as annular structures circumscribing portion 51, although the methods and apparatuses described herein are not limited in this regard. The regions over which openings 72 are formed and the number of openings 72 are not limitations of the claimed subject matter. For example, there can be more or fewer than three openings 72.

Figure 12:
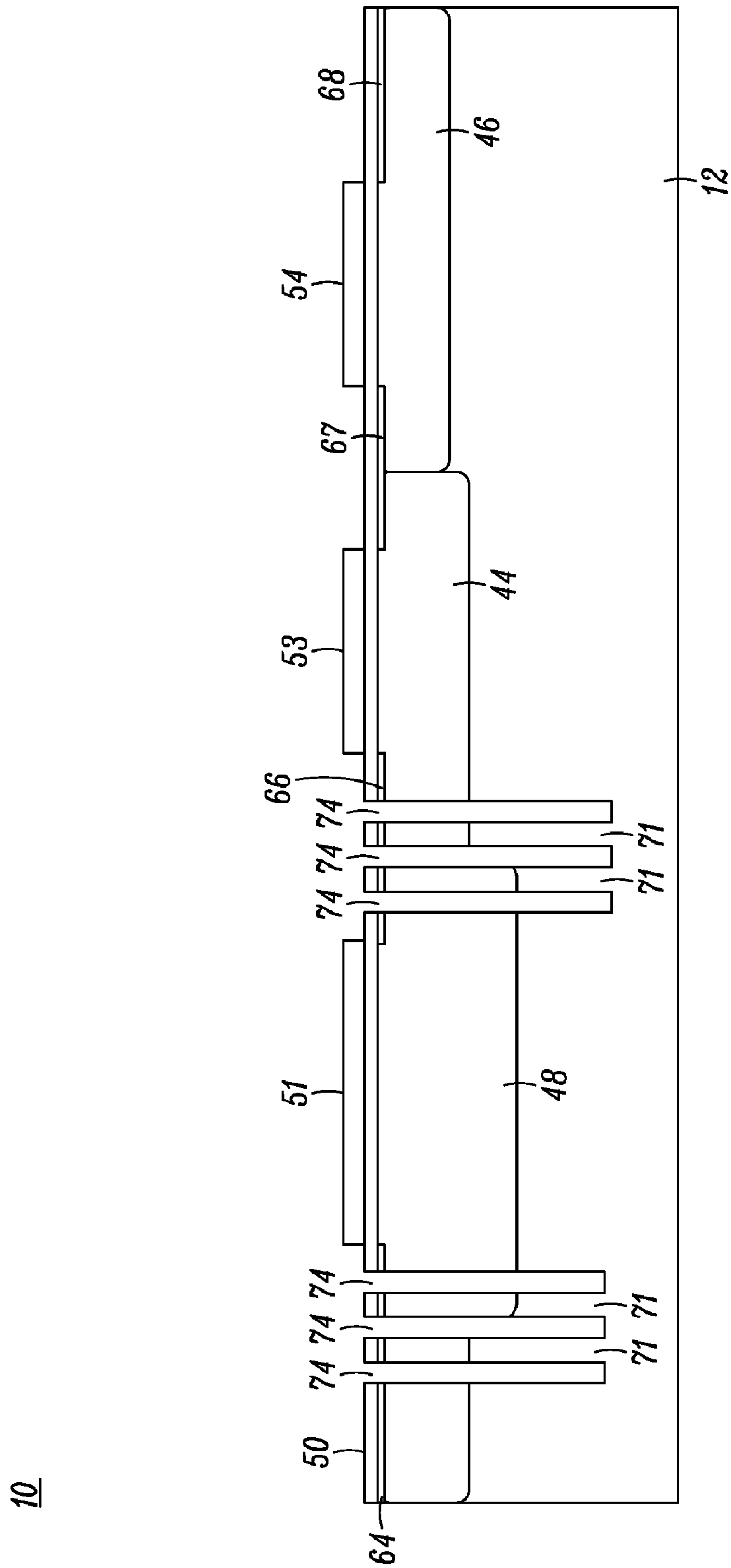
FIG. 12 is a cross-sectional view of the semiconductor structure of FIG. 11 at a later stage of manufacture.

Referring now to FIG. 12, portions of oxide layer 50 and substrate 12 can be removed using mask 70 (FIG. 11) and one or more etch operations. For example, trenches 74 can be formed in oxide layer 50 and substrate 12 by using mask 70 (FIG. 11) and etching the exposed portions of oxide layer 50 with an etch chemistry that preferentially etches oxide. After etching through oxide layer 50 and exposing portions of substrate 12, the etch chemistry can be changed to one that preferentially etches silicon if substrate 12 comprises silicon. Anisotropic reactive ion etching can be used to etch trenches 74 in substrate 12. The method for etching oxide layer 50 and substrate 12 are not limitations of the claimed subject matter. For example, wet etching techniques or isotropic etching techniques can be used to etch oxide layer 50 and substrate 12. Trenches 74 extend through oxide layer 50 and into portions of substrate 12. Trenches 74 can extend to a greater depth into substrate 12 than does N-well 48. In accordance with one embodiment, trenches 74 extend from about one micron to about 100 microns ("μm") into substrate 12, have a width of about 0.5 micron to about 1.5 micron, and have a pitch of about 0.25 μm to about 1 μm. Accordingly, in this embodiment, each portion of substrate 12 located between adjacent ones of trenches 74 has a width of about 0.5 μm to about 1 μm. Trenches 74 can also have other depths, widths, and pitches. The portions of substrate 12 located between trenches 74 can have various shapes. For example, the portions of substrate 12 between trenches 74 can be pillars or walls, and may be referred to as vertical structures 71. Mask 70 can be removed or stripped after forming trenches 74, and then, integrated circuit 10 can be annealed.

Figure 13:
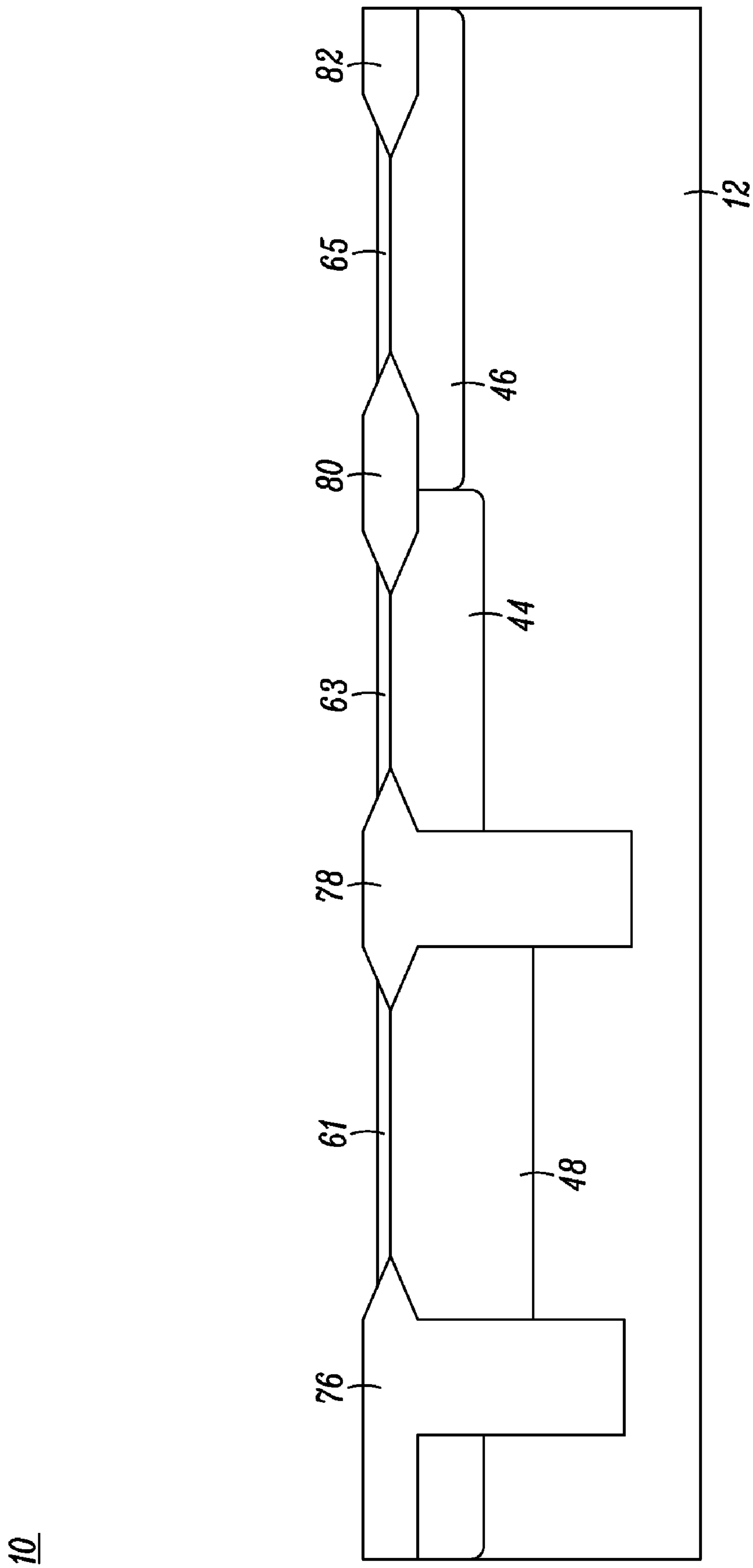
FIG. 13 is a cross-sectional view of the semiconductor structure of FIG. 12 at a later stage of manufacture.

Referring now to FIG. 13, isolation structures 76, 78, 80, and 82 can be formed at least in part by oxidizing portions of substrate 12 that are not masked by nitride layers 51, 53, and 54. More particularly, the regions in and around doped regions 67 and 68 (FIG. 12) are oxidized to form isolation structures 80 and 82, respectively. In some embodiments, the regions in and around doped regions 64 and 66 (FIG. 12) and the portions of substrate 12 abutting trenches 74, including vertical structures 71, can be oxidized to convert all of, or substantially all of, vertical structures 71 to silicon dioxide. Performing a thermal oxidation to form silicon dioxide along the sidewalls of vertical structures 71 may also be referred to as forming a dielectric material in openings 74. The growth of silicon dioxide from the portions of substrate 12 abutting trenches 74 may reduce the width of trenches 74. Depending on the widths and pitches of trenches 74, the oxidation may reduce the width of trenches 74 so that no air gaps or voids are present in isolation structures 76 and 78 after the oxidation process so that isolation structures are filled or solid isolation structures devoid of any air gaps. In other embodiments, the pitches and widths of trenches 74 may be such that air gaps or voids are present in isolation structures 76 and 78 after the oxidation process. In some embodiments, these gaps or voids may be filled with one or more dielectric materials such as, for example, an oxide, a nitride, or undoped polysilicon to form a filled, or solid isolation structure devoid of any air gaps. Accordingly, the dielectric material in isolation structures 76 and 78 can be from the oxidation of portions of substrate 12 and/or from depositing a separate dielectric material into trenches 74. Although not illustrated in FIG. 13, after forming the oxide in trenches 74, trenches 74 can have air gaps or voids. For example, the embodiment illustrated in FIGS. 45 to 48 discussed below includes a dielectric structure that has air gaps or voids. Regardless of whether isolation structures 76 and 78 have voids, isolation structures 76 and 78 can be continuous isolation regions and, in another embodiment, can be part of a single continuous isolation region circumscribing or surrounding the higher voltage semiconductor transistor that includes N-well 48.

Isolation structures 76, 78, 80, and 82 may also be referred to as dielectric structures, isolation regions, dielectric regions, or dielectric platforms. Isolations structures 76 and 78 may be two separate isolation structures, or in other embodiments, structures 76 and 78 can be parts of a single isolation structure having an annular shape laterally surrounding N-well 48.

Isolation structures 80 and 82, and the upper portions of isolation structures 76 and 78, can be formed using a Local Oxidation of Silicon ("LOCOS") technique. A LOCOS process can include a thermal oxidation process to oxidize regions in and around doped regions 64, 66, 67, and 68 (FIGS. 10 and 11). The oxidation process, when applied to portions of semiconductor materials which have been doped, produces relatively thicker regions of oxide along doped regions 64, 66, 67, and 68 (FIGS. 10 and 11). In other words, subjection of doped regions 64, 66, 67, and 68 (FIGS. 10 and 11) to a thermal oxidation process can result in a greater portion, that is, wider and/or thicker portion, of oxide than in areas of substrate 12 with less or no dopant concentrations. As is shown in FIG. 13, isolation structures 80 and 82, and the upper portions of isolation structures 76 and 78, have a “birds beak” type structure as a result of the LOCOS process. In other embodiments, other techniques such as, for example, a shallow trench isolation (“STI”) technique can be used to form isolation structures 80 and 82. Although not shown in the figures, a STI technique may involve forming a trench, depositing a polysilicon material in the trench, and performing a thermal oxidation process to convert all or part of the polysilicon material to silicon dioxide.

An oxynitride may form along the surfaces of silicon nitride portions 51 (FIG. 12), 53 (FIG. 12), and 54 (FIG. 12) during the thermal oxidation process that is used to form isolation structures 76, 78, 80, and 82. After forming isolation structures 76, 78, 80, and 82, an oxide etch can be performed to remove any oxynitride, followed by a nitride strip to remove the remaining silicon nitride portions 51 (FIG. 12), 53 (FIG. 12), and 54 (FIG. 12).

Oxide portions 61, 63, and 65 can serve as a screen oxide such that subsequent doping or implant operations in regions 44, 46, 48, and are dependent on the thicknesses of oxide portions 61, 63, and 65. Oxide portions 61, 63, and 65 may be altered during the processing of integrated circuit 10. For example, the thicknesses of oxide portions 61, 63, and 65 may be altered, and therefore, it may be desirable to, for example, add more oxide to oxide portions 61, 63, and 65 or remove portions 61, 63, and 65 and form another oxide layer in place of oxide portions 61, 63, and 65.

Figure 14:
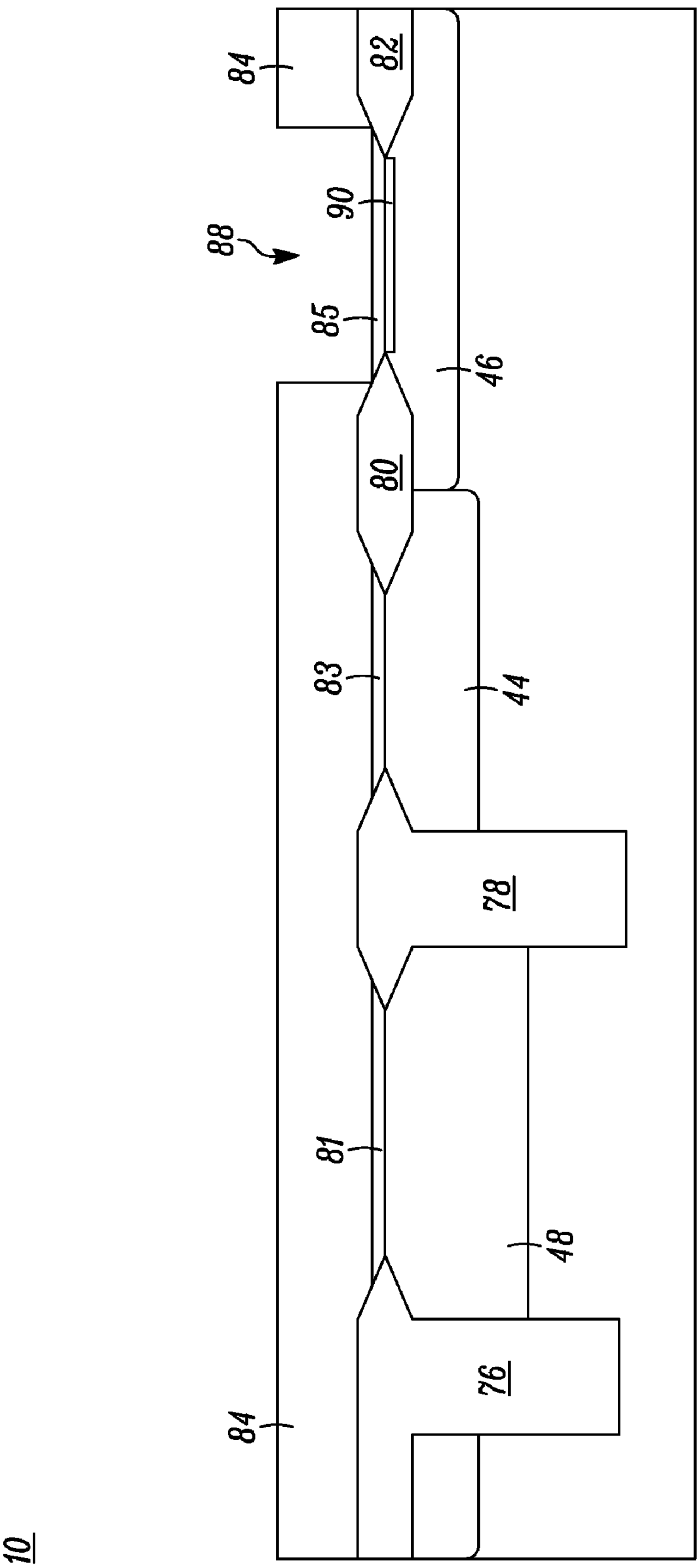
FIG. 14 is a cross-sectional view of the semiconductor structure of FIG. 13 at a later stage of manufacture.

Referring now to FIG. 14, in some embodiments, portions 61 (FIG. 13), 63 (FIG. 13), and 65 (FIG. 13) are removed using an oxide etch and sacrificial oxide layers 81, 83, and 85 each having a thickness ranging from about 50 Å to about 500 Å can be formed over doped regions 48, 44, and 46, respectively.

A layer of photoresist can be formed over isolation structures 76, 78, 80, and 82 and over oxide layers 81, 83, and 85 and then this layer of photoresist can be patterned to form a mask 84 having an opening 88 to expose all or, or a portion of, oxide layer 85. An impurity material of P-type conductivity can be implanted through opening 88 and through the exposed portion of screen oxide layer 85 to form a doped region 90 of P-type conductivity in substrate 12. Thus, the impurity material can be implanted into P-well 46. The implant is referred to as a threshold voltage (“$V_T$”) adjust implant that will be used to set the threshold voltage for a P-channel metal-oxide semiconductor field effect transistor (MOSFET) or PMOS device that may be subsequently formed using P-well 46. The implant can include implanting the dopant of P-type conductivity such as, for example, boron at a dose ranging from about $10^{11}$ ions/cm$^2$ to about $10^{12}$ ions/cm$^2$ using an implant energy ranging from about 50 keV to about 100 keV. The implant can be a zero degree implant or a tilt angle implant. After the implants, mask 84 can be removed. It should be noted that this p-type implant could also be used to simultaneously form a P-type region in N-well 48. In other words, if the desired doping concentration and depth of a P-type region in N-well 48 is the same, or substantially the same, as doping concentration and depth of P-type region 90, then at least one mask operation may be eliminated if the P-type regions in P-well 46 and N-well 48 can be formed simultaneously using the same implant operations.

Figure 15:
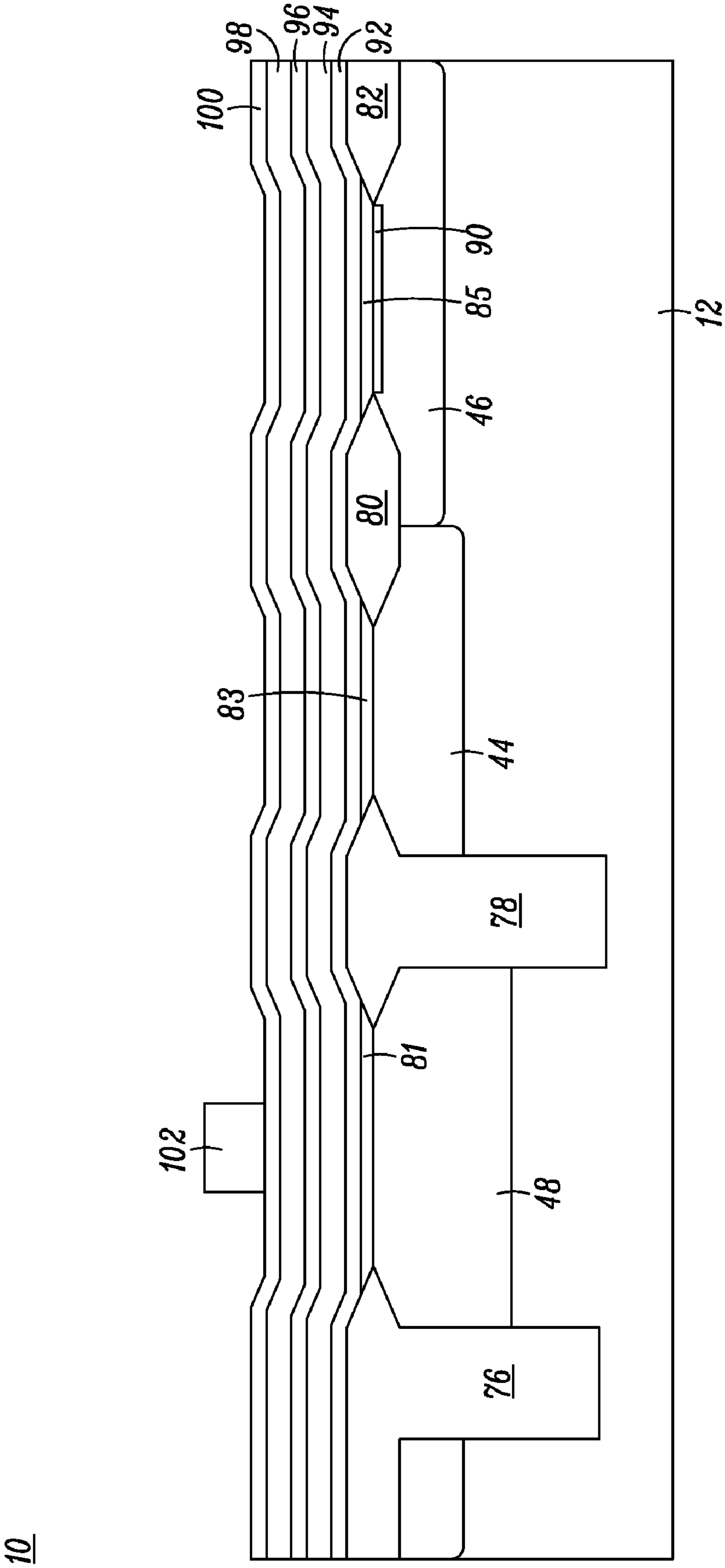
FIG. 15 is a cross-sectional view of the semiconductor structure of FIG. 14 at a later stage of manufacture.

Referring now to FIG. 15, layers 92, 94, 96, 98 and 100 are sequentially formed over portions oxide portions 81, 83, and 85 and over isolation structures 76, 78, 80, and 82. In accordance with one embodiment, layers 92, 96, and 100 comprise silicon nitride, and each of layers 92, 96 and 100 can have a thickness ranging from about 10 Å to about 1000 Å. Also, layers 94 and 98 comprise polysilicon, and each of layers 94 and 98 can have a thickness ranging from about 500 Angstroms to about 0.3 microns. Layers 92, 94, 96, 98, and 100 can be conformal materials and can be formed using CVD techniques such as, for example LPCVD, PECVD, or the like. Polysilicon layers 94 and 98 can be doped with either an N-type conductivity impurity material or a P-type conductivity impurity material. N-type conductivity impurity materials can include phosphorus, arsenic, and antimony, and P-type conductivity impurity materials can include boron and indium. Polysilicon layers 94 and 96 can be doped during or after being deposited.

A layer of photoresist can be formed over silicon nitride layer 100 and patterned to form a mask 102 over portions of layers 92, 94, 96, 98, and 100 that are above N-well 48.

Figure 16:
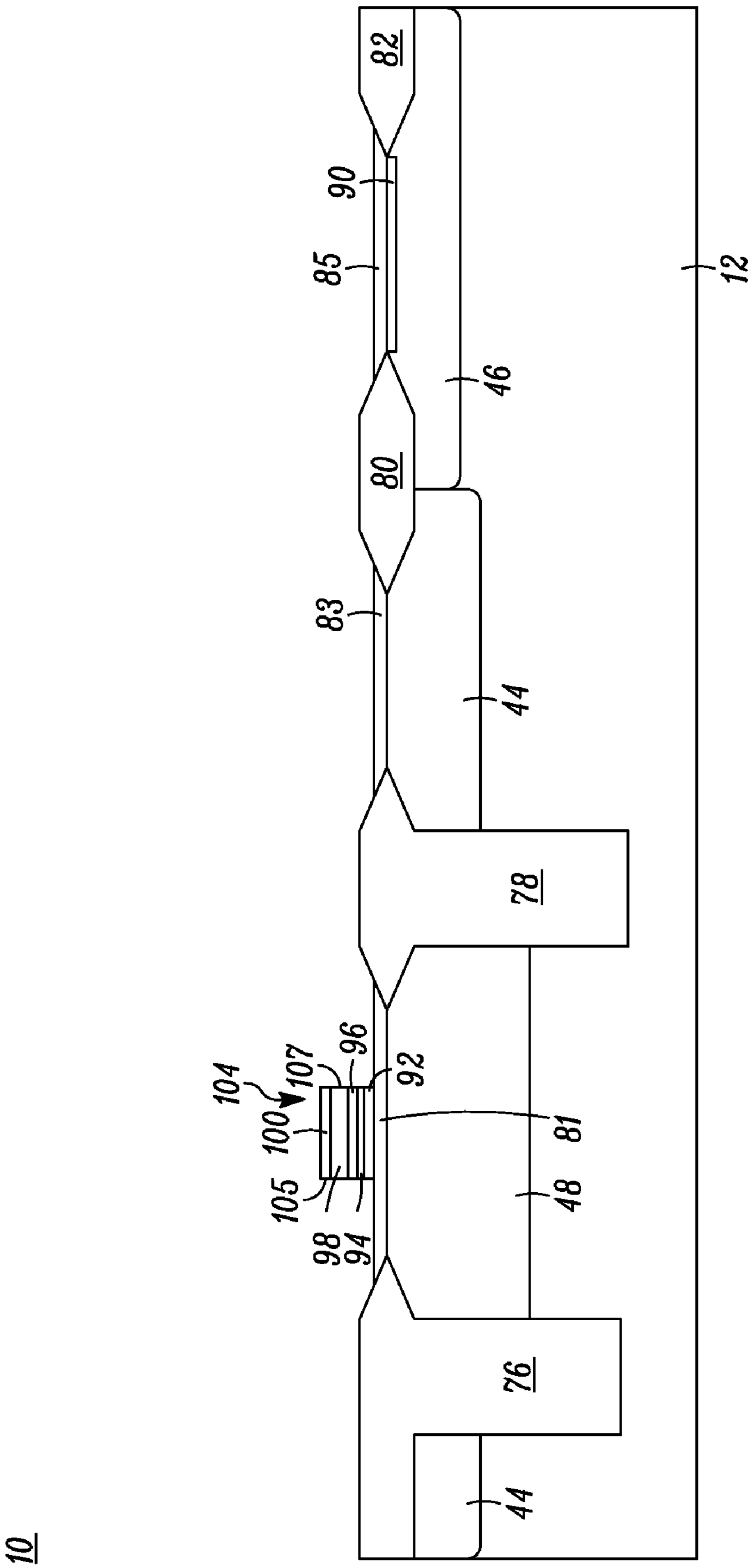
FIG. 16 is a cross-sectional view of the semiconductor structure of FIG. 15 at a later stage of manufacture.

Referring now to FIG. 16, the portions of layers 92, 94, 96, 98, and 100 unprotected by mask 102 (FIG. 15) can be anisotropically etched using, for example, an anisotropic reactive ion etching technique. The etch stops on or in portions of oxide layers 81, 83, and 85 and on or in isolation structures 76, 78, 80, and 82. The remaining portions 92, 94, 96, 98, and 100 form a pedestal structure 104 having sidewalls 105 and 107. The pedestal structure can be used in the manufacture of a higher voltage semiconductor device such as, for example, a higher voltage lateral transistor as will be described below. An advantage of using the pedestal structure is that the width of the pedestal structure will set the width of the transistor’s drift region as shown with reference to FIG. 43.

Figure 17:
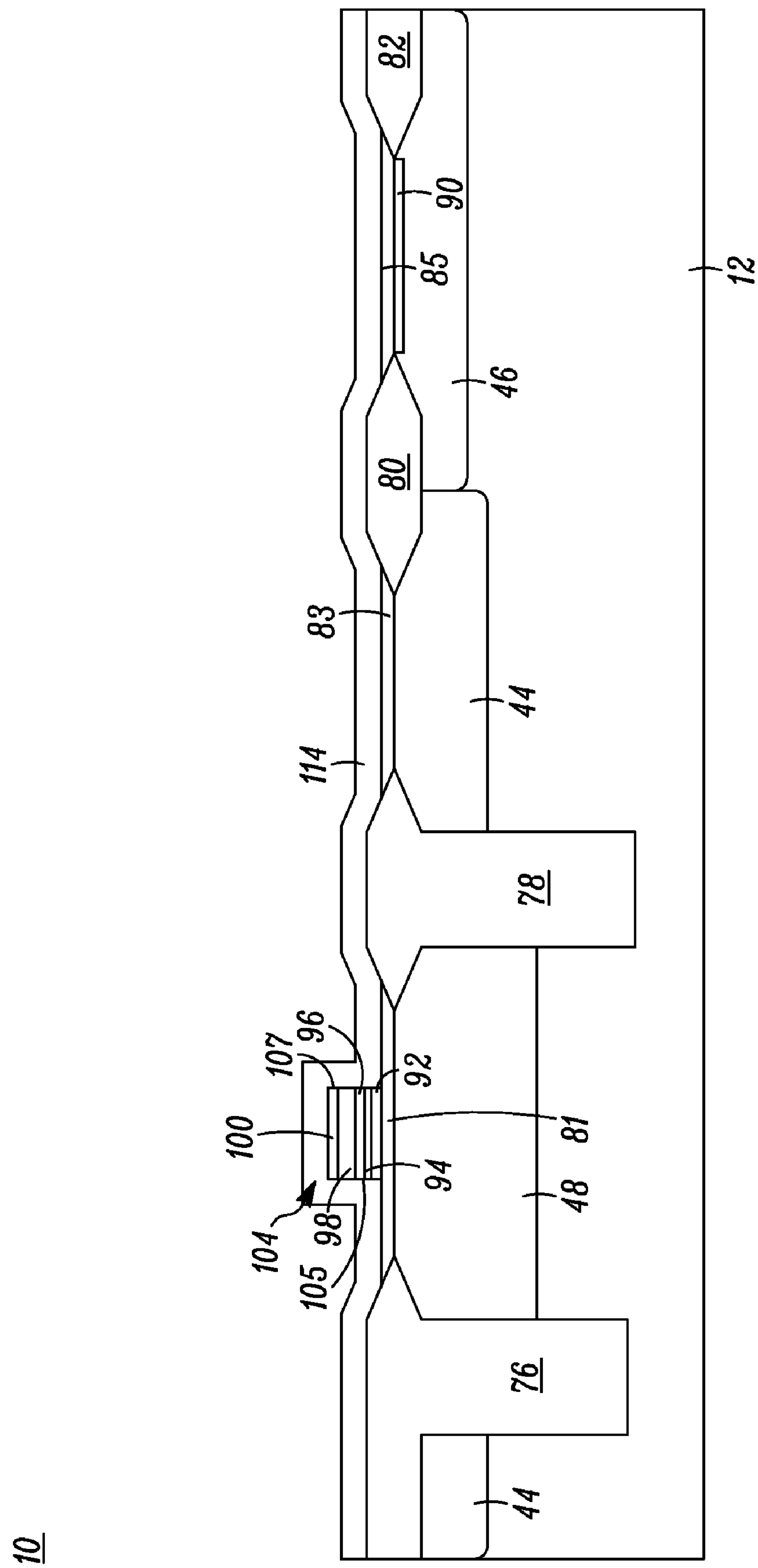
FIG. 17 is a cross-sectional view of the semiconductor structure of FIG. 16 at a later stage of manufacture.

Referring now to FIG. 17, a layer of dielectric material 114 such as, for example, silicon nitride can be formed over pedestal structure 104, isolation structures 76, 78, 80, and 82, and the exposed portions of dielectric layers 81, 83, and 85. In some embodiments, dielectric layer 114 can be formed to have a thickness ranging from about 50 Å to about 400 Å using a CVD technique.

Figure 18:
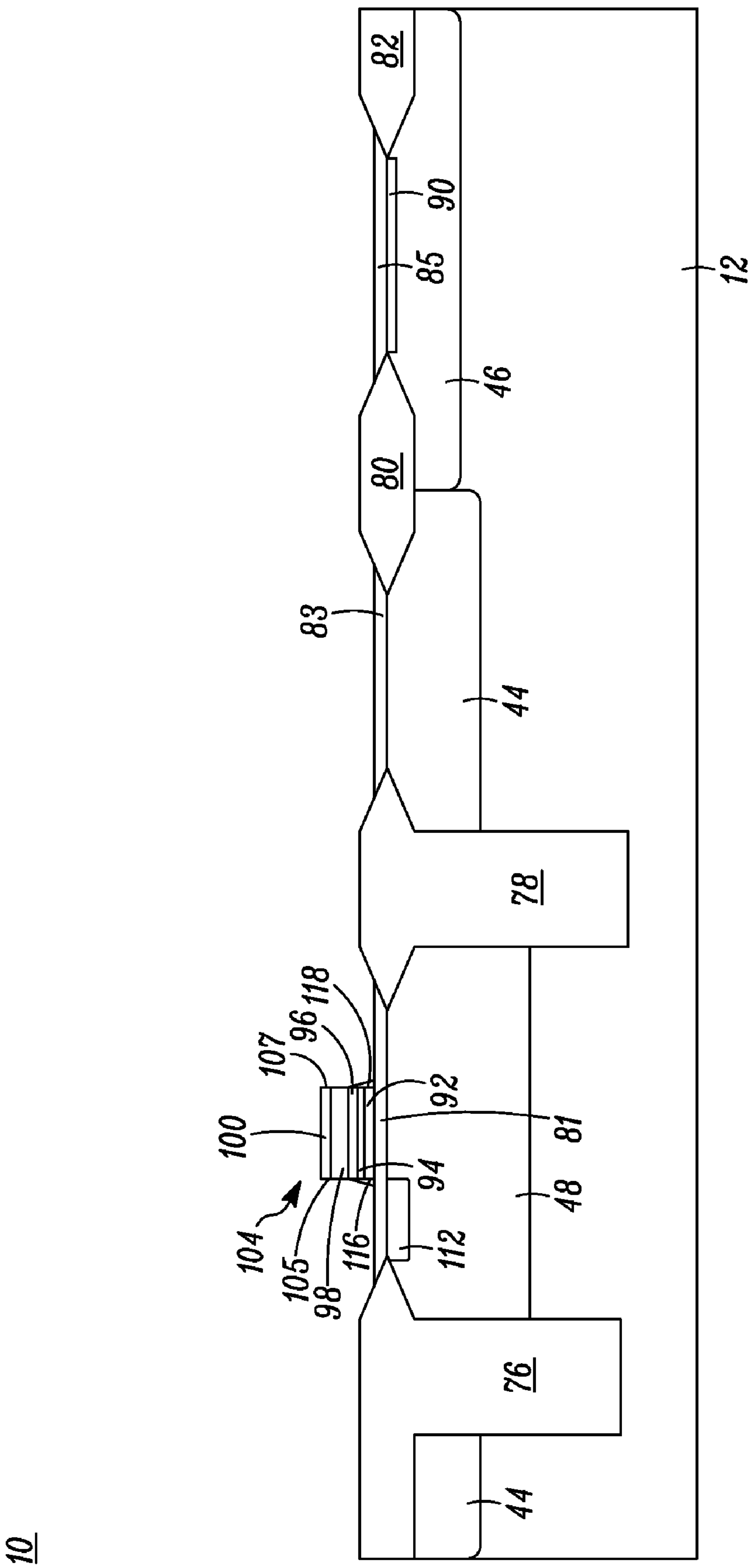
FIG. 18 is a cross-sectional view of the semiconductor structure of FIG. 17 at a later stage of manufacture.

Referring now to FIG. 18, dielectric layer 114 can be anisotropically etched using, for example, an anisotropic reactive ion etching technique to form spacers 116 and 118 adjacent sidewalls 105 and 107, respectively, of pedestal structure 104. The etch can be a blanket etch that removes dielectric layer 114 from the regions above N-well 44 and P-well 46. Silicon nitride spacers 116 and 118 protect the portion of the pedestal sidewalls 105 and 107 formed by portions 92 and 94 of pedestal structure 104. The portion of pedestal sidewalls 105 and 107 formed by portion 98 of pedestal structure 104 remains unprotected and exposed. Portion 94 serves as a shield layer or region for a lateral higher voltage semiconductor transistor, and portion 98 serves as a gate interconnect for the lateral higher voltage semiconductor transistor. Portion 98 is located over portion 94. In particular, dielectric spacers 116 and 118 prevent electrical shorting of conductive layer 94 from other conductive layers.

After forming silicon nitride spacers 116 and 118, an impurity material of P-type conductivity can be implanted through a mask (not shown) that the has an opening exposing a portion of layer 81 to form a doped region 112. The impurity material to form doped region 112 is implanted into a portion of N-well 48. The implant is referred to as a P-body implant and can be a chain implant comprising three implants of the same dosage and different energy levels to form a doped region with a substantially uniform doping profile after annealing and driving in the doped regions formed by the chain implant. A chain implant may be achieved by programming an implanter to do a series or chain of implants at different energies and doses. The higher the energy, the deeper the penetration for the implant. The use of a chain implant allows the formation of a doped region having a square profile. The implant can include a first implant in which the dopant of P-type conductivity is implanted at a dose ranging from about $10^{12}$ ions/cm$^2$ to about $10^{13}$ ions/cm$^2$ using an implant energy ranging from about 50 keV to about 300 keV. In a second implant, the impurity material is implanted at a dose ranging from about $10^{12}$ ions/cm$^2$ to about $10^{13}$ ions/cm2 using an implant energy ranging from about 50 keV to about 300 keV. In a third implant, the impurity material is implanted at a dose ranging from about 1012 ions/cm$^2$ to about $10^{13}$ ions/cm$^2$ using an implant energy ranging from about 50 keV to about 300 keV. The implants can be zero degree implants, or they can be tilt angle implants. The number of implants and the doses and energies of each implant are not limitations of the claimed subject matter. In addition, the order of the implants is not a limitation of claimed subject matter 10, i.e., the higher energy implants can be at the beginning, near the middle, or at the end of the implant sequence. Doped region 112 can be self-aligned to the edges of isolation structure 76 and nitride spacer 116. Oxide layer 81 can serve as a screen oxide during the implant operations, wherein some of the dopants get trapped in, or absorbed by, the screen oxide.

Figure 19:
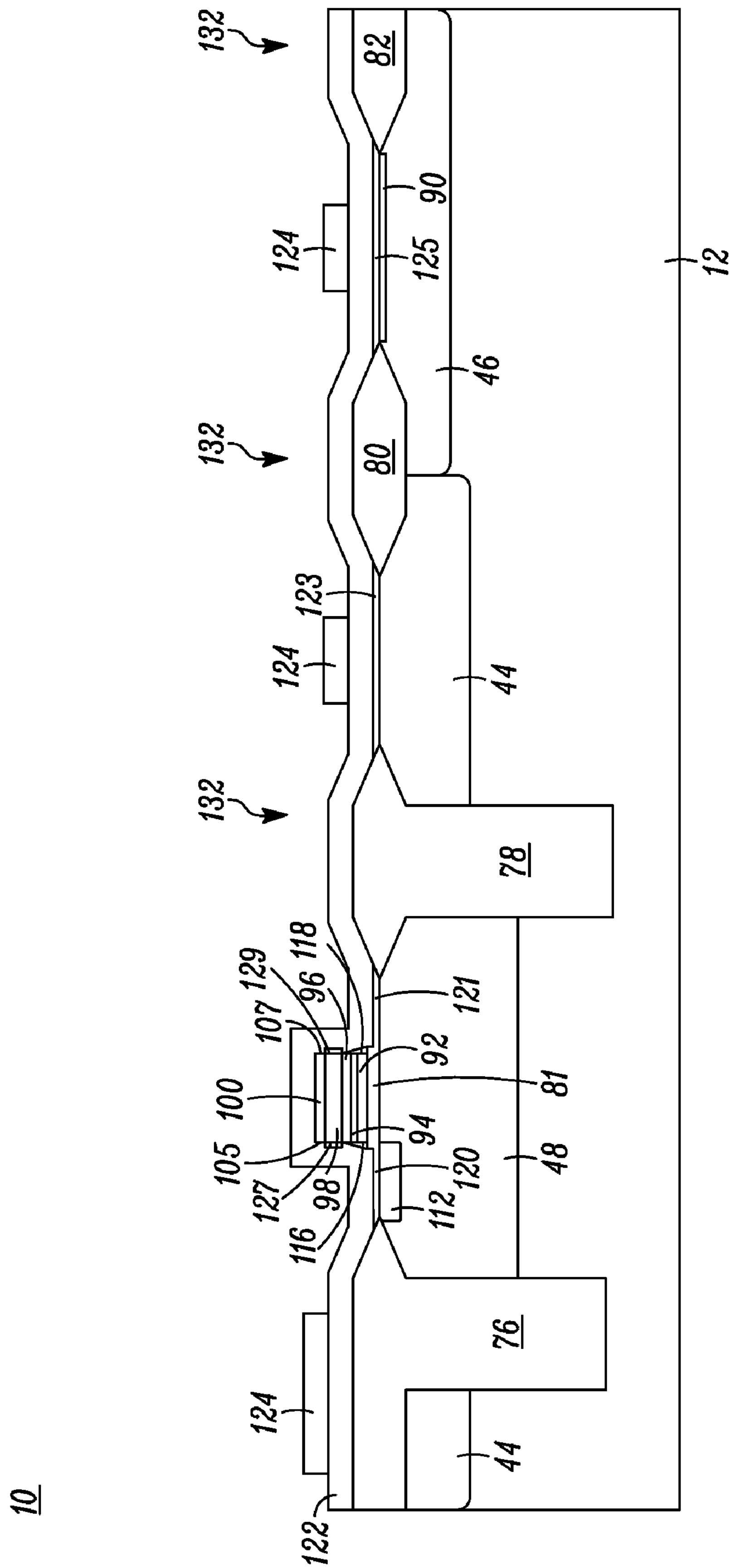
FIG. 19 is a cross-sectional view of the semiconductor structure of FIG. 18 at a later stage of manufacture.

Referring now to FIG. 19, the exposed portion of oxide layer 81 (FIG. 18) and oxide layers 83 and 85 can be etched away using, for example, a wet etch. This etch cleans the surfaces of dopant wells 44, 46, and 48. In addition, this etch can undercut the remaining portion of oxide layer 81 under pedestal structure 104 giving it curvature thereby decreasing the electric field in this region. Dielectric layers 120 and 121 can be formed over the exposed surface of doped region 44. Further, dielectric layers 123 and 125 can be formed over the exposed surfaces of doped regions 44 and 46, respectively. In addition, dielectric layers 127 and 129 may be formed over the exposed portions of sidewalls 105 and 107 of gate interconnect 98, respectively. In some embodiments, dielectric layers 120, 121, 123, 127, and 129 can comprise oxide, and may be grown simultaneously using a thermal oxidation process. As will be discussed below, a portion of oxide layer 125 may serve as a gate oxide for a lower voltage N-channel FET, a portion of oxide layer 123 may serve as a gate oxide for a lower voltage P-channel FET, and a portion of oxide layer 120 may serve as a gate oxide for a higher voltage lateral FET. Together the lower voltage P-channel FET and the lower voltage N-channel FET may form a CMOS device. As is discussed above, oxide layers 120, 123, and 125 may be formed simultaneously using the same thermal oxidation process. By forming elements of integrated circuit 10 simultaneously, additional process steps can be eliminated, thereby reducing the cost of fabricating integrated circuit 10.

In other embodiments, a relatively thicker oxide layer may be desired for layer 120. For example, if oxide layer 120 is to be used as a gate oxide layer for a higher voltage device, then gate oxide layer 120 may be made relatively thicker to withstand relatively higher voltages. Various options may be used to form a relatively thicker oxide for layer 120. In some embodiments, to form a relatively thicker oxide layer for layer 120, after removing layers 81, 83, an 84, an oxide layer can be grown in the region of layer 120 using a thermal oxidation process, which could simultaneously form oxide layers in the region of layers 123 and 125. Then the oxide layers in the regions of layers 123 and 125 could be etched away, and not removed in the region of layer 120. Another oxidation process could be used to form oxide layers 123 and 125, and this oxidation process could be used to thicken oxide layer 120, so that oxide layer 120 is relatively thicker than oxide layers 123 and 125. In other embodiments, gate oxide 120 and gate electrode 134 can be formed separately from the formation of gate oxides 123 and 125 and gate electrodes 144 and 146, and gate oxide 120 can be formed in these embodiments to be relatively thicker than gate oxide layers 123 and 125. Accordingly, oxide layer 120 could be used in a relatively higher voltage device compared to relatively thinner layers 123 and 125.

A layer of polysilicon 122 having a thickness ranging from about 0.1 microns to about 0.4 microns can be formed over the structure shown in FIG. 18. In particular, polysilicon layer 122 can be formed over oxide layers 120, 121, 123, 125, 127 and 129, isolation structures 76, 78, 80, and 82, spacers 116 and 118, and the exposed portion of pedestal 104. In one embodiment, polysilicon layer 122 can be deposited using a chemical vapor deposition (CVD) process. An impurity material of N-type conductivity can be implanted into polysilicon layer 122. The implant can include implanting the dopant of N-type conductivity such as, for example, arsenic at a dose ranging from about $10^{14}$ ions/cm$^2$ to about 1016 ions/cm$^2$ using an implant energy ranging from about 50 keV to about 200 keV. The implant can be a zero degree implant or a tilt angle implant. In a different embodiment, polysilicon layer 122 can be doped in-situ or during its deposition.

A layer of photoresist can be formed over polysilicon layer 122. The layer of photoresist can be patterned to form a mask 124 having openings 132. Openings 132 expose portions of polysilicon layer 122.

Figure 20:
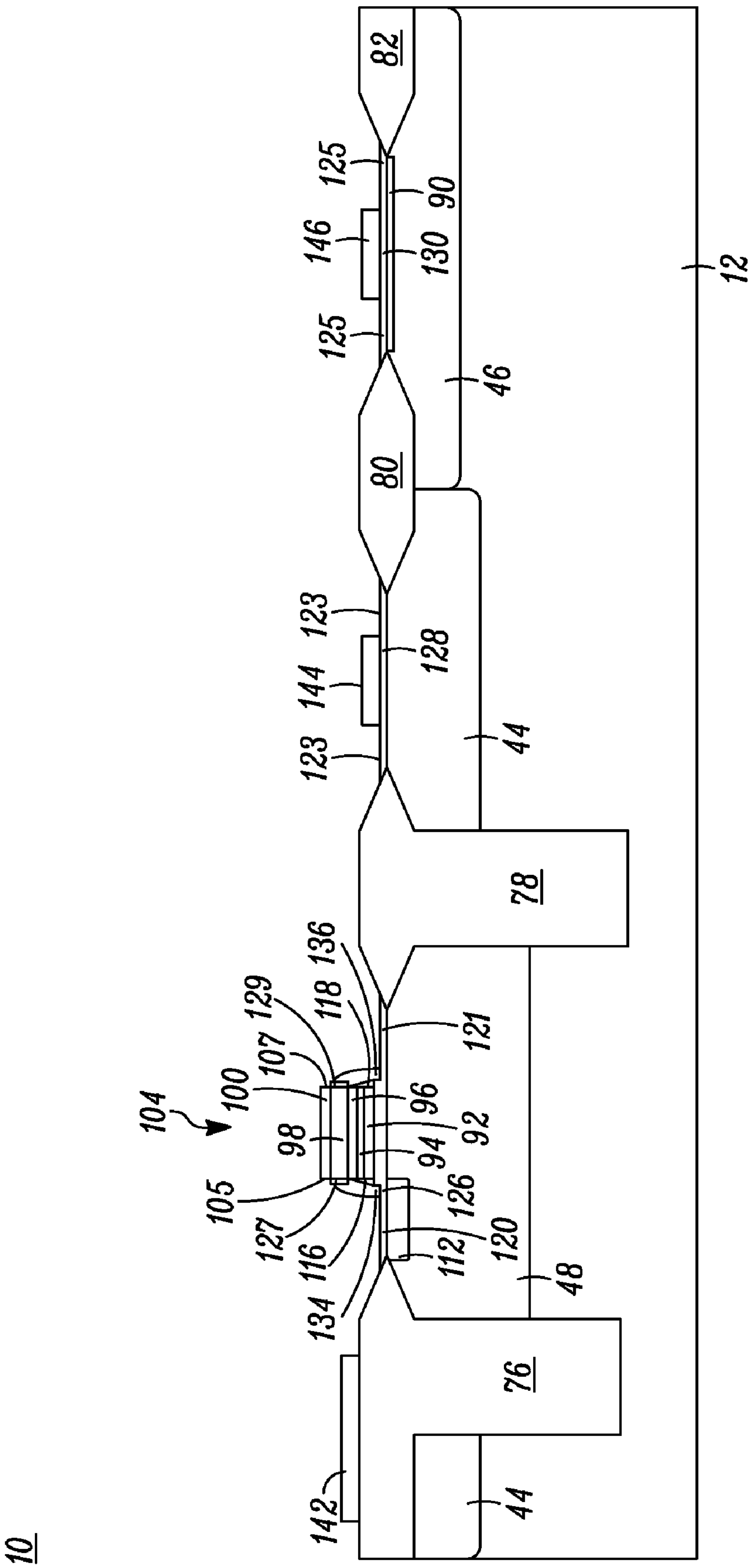
FIG. 20 is a cross-sectional view of the semiconductor structure of FIG. 19 at a later stage of manufacture.

Referring now to FIG. 20, the exposed portions of polysilicon layer 122 (FIG. 19) can be anisotropically etched to form a spacer gate electrode 134, a spacer extension 136, and layers 142, 144, and 146. After the etch of layer 122 (FIG. 19), mask 124 (FIG. 19) can be removed. Spacer gate electrode 134 is formed over a portion of dielectric spacer 116, a portion of dielectric layer 120, and over a portion of dielectric layer 127. Spacer extension 136 is formed over a portion of a portion of dielectric spacer 118, a portion of dielectric layer 121, and over a portion of dielectric layer 129. Spacer gate electrode 134 may also be referred to as a vertical gate electrode or a sidewall gate electrode and can serve as a gate electrode of a higher voltage lateral FET, and a portion 126 of oxide layer 120 between gate electrode 134 and N-well 48 serves as a gate oxide layer of the higher voltage lateral FET. Dielectric layers 127 and 129 serve as isolation structures that electrically isolate gate interconnect 98 from gate electrode 134 and from spacer extension 136, respectively. As will be discussed below with reference to FIGS. 25 and 26, gate interconnect 98 will be electrically connected to gate electrode 134. Polysilicon layer 142 is over a portion of isolation structure 76; polysilicon layer 144 is over a portion N-well 44; and polysilicon layer 146 is over a portion of P-well 46. In this embodiment, gate electrode 134 is located laterally adjacent to conductive layer 94, which serves as the gate shield for the higher voltage lateral FET. Gate shield 94 may be included to reduce parasitic capacitive coupling between gate electrode 134 and the drain of the higher voltage lateral FET.

Layer 142 can serve as an electrode of an integrated capacitive device; layer 144 can serve as a gate electrode of a lower voltage P-channel Field Effect Transistor ("FET"); and layer 146 can serve as a gate electrode of a lower voltage N-channel FET, which are further described with reference to FIG. 30. In this embodiment, gate electrode 134, layers 142, 144, and 146 are formed simultaneously with each other such that gate electrode 134 can be much shorter than each of layers 142, 144, and 146. Portion 128 of oxide layer 123 that is between gate electrode 144 and N-well 44 serves as a gate oxide layer of the P-channel FET, and portion 130 of oxide layer 125 that is between gate electrode 146 and P-well 46 serve as a gate oxide layer of the N-channel FET. As is discussed, layers 134, 142, 144, and 146 are formed simultaneously using the same deposition and etching operations. By forming elements of integrated circuit 10 simultaneously, additional process steps can be eliminated, thereby reducing the cost of fabricating integrated circuit 10.

Figure 21:
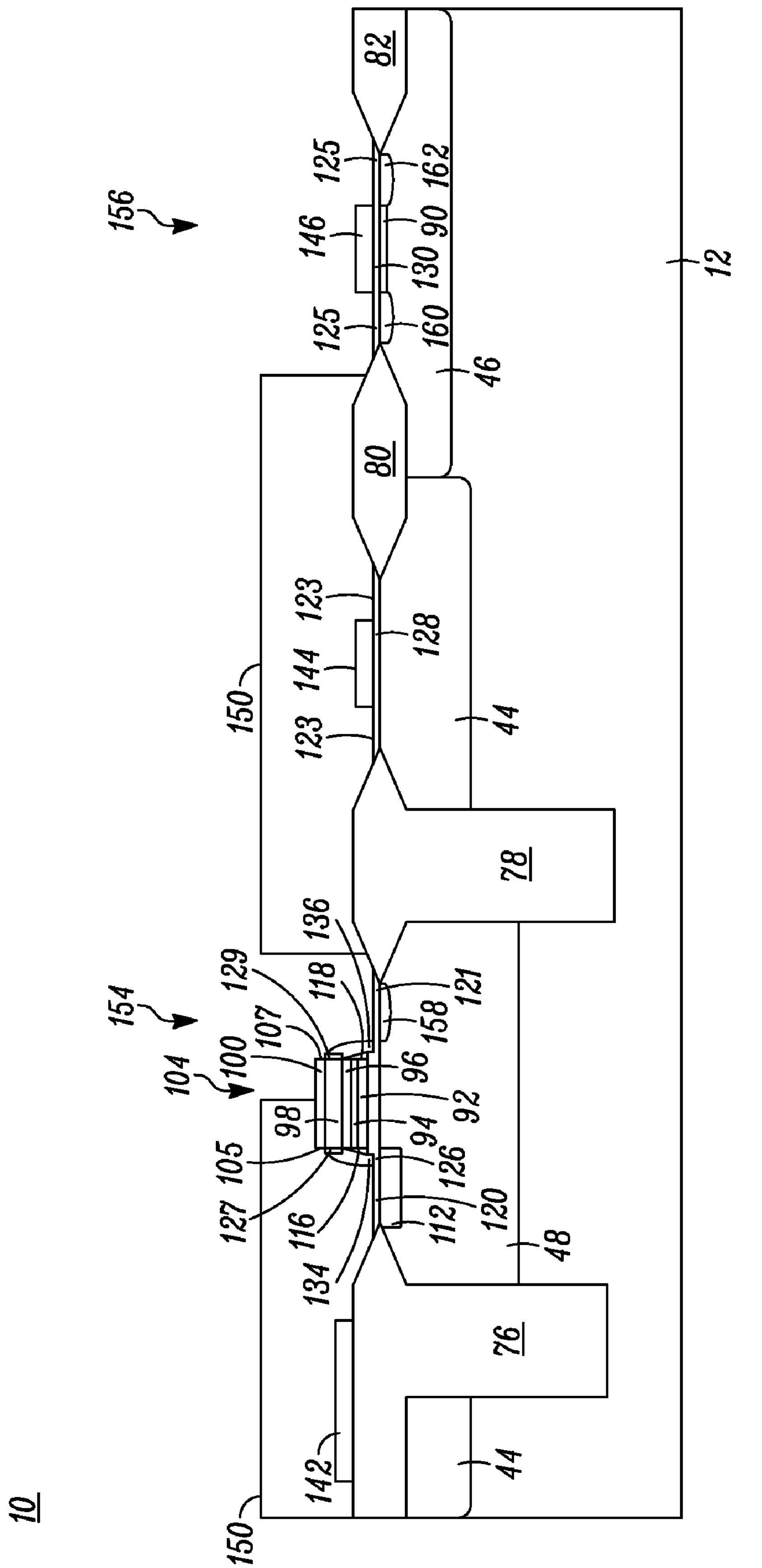
FIG. 21 is a cross-sectional view of the semiconductor structure of FIG. 20 at a later stage of manufacture.

Referring now to FIG. 21, a layer of photoresist can be formed over the structure shown in FIG. 20. In particular, the layer of photoresist can be formed over the exposed portions of isolation structures 76, 78, 80, and 82, oxide layers 120, 121, 123, 125, gate electrode 134, spacer extension 136, pedestal structure 104, and polysilicon layers 142, 144, and 146. The layer of photoresist can be patterned to form a mask 150 having openings 154 and 156. Opening 154 exposes a portion of pedestal structure 104, oxide layer 121, and a portion of isolation structure 78. Opening 156 exposes layer 146, oxide layer 125, and portion of isolation structures 80 and 82.

An impurity material of N-type conductivity can be implanted into a portion of N-well 48, pedestal structure 104, and spacer extension 136 exposed by opening 154. In addition, the impurity material of N-type conductivity can be simultaneously implanted into a portion of P-well 46 that is unprotected by mask 150 and into gate electrode 146. The implant can include implanting the dopant of N-type conductivity such as, for example, arsenic at a dose ranging from about $10^{12}$ ions/$cm^2$ to about $10^{13}$ ions/$cm^2$ using an implant energy ranging from about 50 keV to about 100 keV. The implant can be a zero degree implant or a tilt angle implant and serves as a Lightly Doped Drain ("LDD") implant. More particularly, the implant simultaneously forms lightly doped region 158 in N-well 48 and lightly doped regions 160 and 162 in P-well 46. The implant also dopes gate electrode 146. If a different doping profile is desired for doped region 158 compared to doped regions 160 and 162, then doped region 158 can be formed as part of a different implant operation, and not simultaneous with, the implant operation used to form doped regions 160 and 162. If the implant is a zero degree implant, an edge of doped region 158 is aligned with an edge of polysilicon spacer 136. Similarly, if the implant if a zero degree implant, edges of doped region 160 are aligned with edges of isolation structure 80 and layer 146 and edges of doped region 162 are aligned with edges of isolation structure 82 and layer 146. Photomask 150 can be stripped after the implant operation.

Doped region 158 may serve as the drain for the higher voltage lateral FET, and doped regions 160 and 162 may serve as the source and drain regions for the lower voltage N-channel FET.

Figure 22:
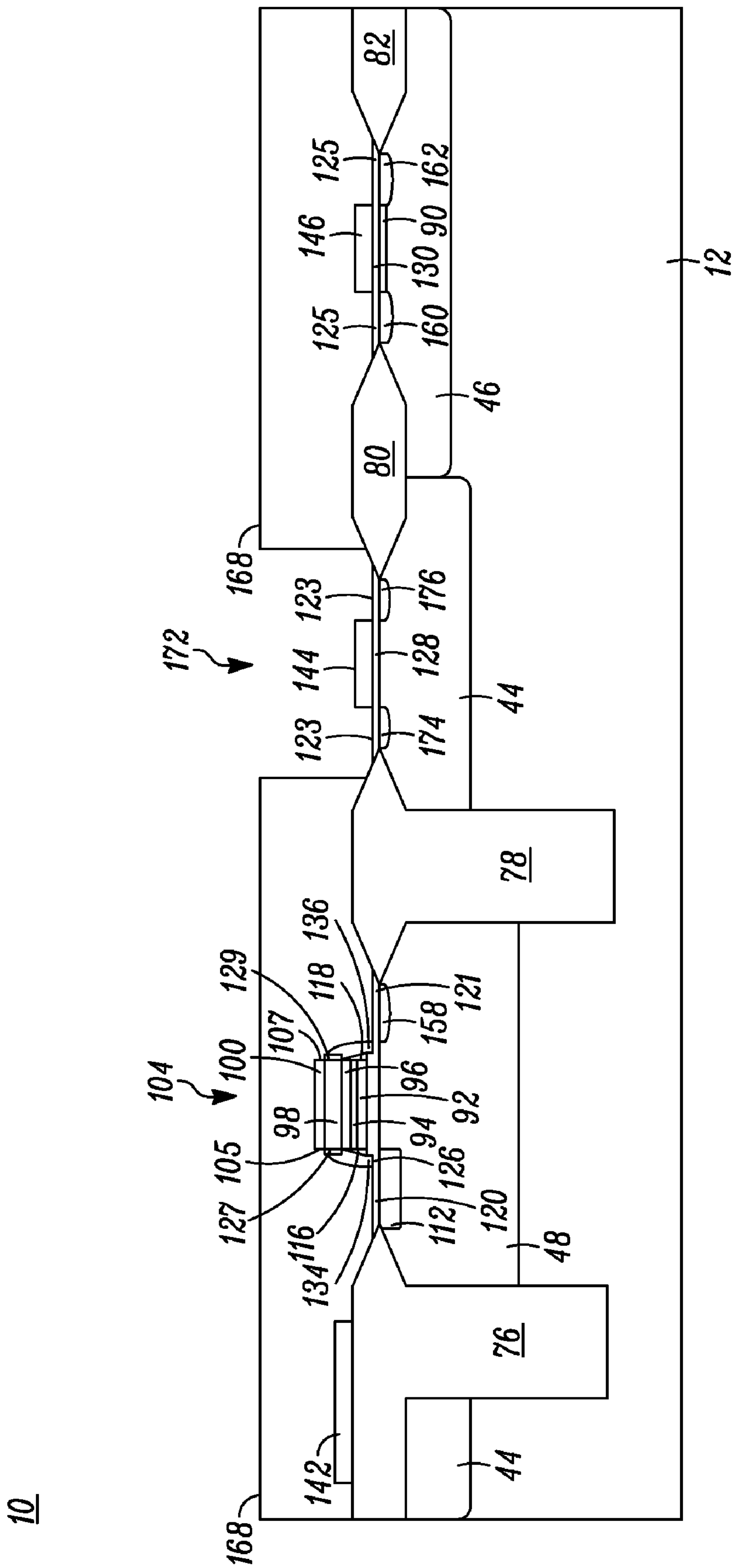
FIG. 22 is a cross-sectional view of the semiconductor structure of FIG. 21 at a later stage of manufacture.

Referring now to FIG. 22, after mask 150 is stripped, another layer of photoresist can be formed over the structure shown in FIG. 21. In particular, this layer of photoresist can be formed over the exposed portions of isolation structures 76, 78, 80, and 82, oxide layers 120, 121, 123, and 125, gate electrode 134, spacer extension 136, pedestal structure 104, and polysilicon layers 142, 144, and 146. The layer of photoresist can be patterned to form a mask 168 having an opening 172. Opening 172 exposes gate 144, a portion of oxide layer 123, and portions of isolation structures 78 and 80.

An impurity material of P-type conductivity can be implanted into the portion of N-well 44 that is unprotected by mask 168 and into gate electrode 144. The implant can include implanting the dopant of P-type conductivity such as, for example, boron at a dose ranging from about $10^{12}$ ions/$cm^2$ to about 1013 ions/$cm^2$ using an implant energy ranging from about 50 keV to about 100 keV. The implant can be a zero degree implant or a tilt angle implant and serves as a LDD implant. The implant forms lightly doped regions 174 and 176 in N-well 44. The implant also dopes gate electrode 144. If the implant if a zero degree implant, edges of doped region 174 are aligned with edges of isolation structure 78 and layer 146 and edges of doped region 176 are aligned with edges of isolation structure 80 and layer 146. Photomask 168 can be stripped after the implant operation.

Figure 23:
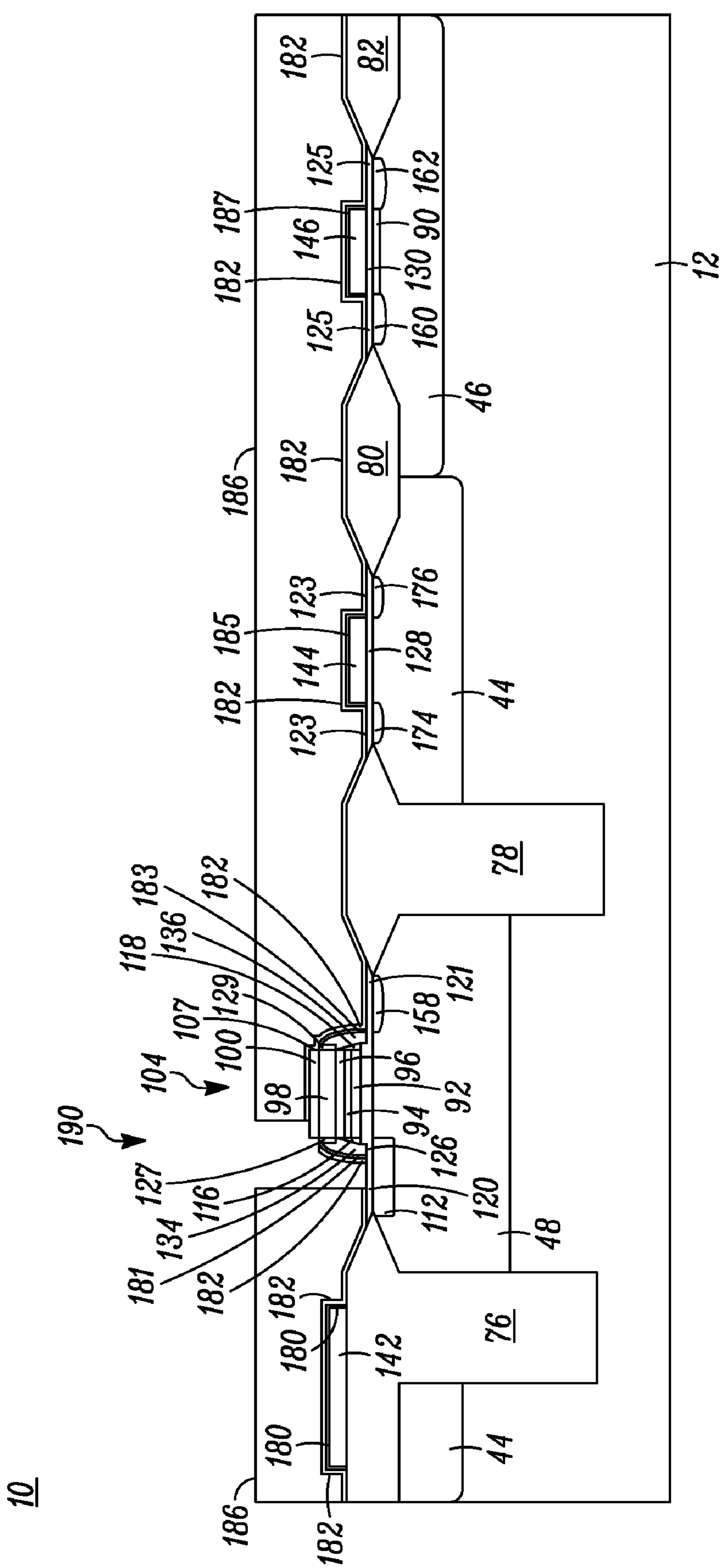
FIG. 23 is a cross-sectional view of the semiconductor structure of FIG. 22 at a later stage of manufacture.

Referring now to FIG. 23, after mask 168 (FIG. 22) is removed, a thermal oxidation process can be performed to form oxide layers 180, 181, 183, 185, and 187 over the exposed portions of polysilicon layers 142, 134, 163, 144, 146, respectively. Oxide layers 180, 181, 183, 185, and 187 can have a thickness ranging up to about 200 Å. This same thermal oxidation process may also thicken thermal oxide layers 120, 121, 123, and 125.

A dielectric layer 182 can be conformally formed over integrated circuit 10. In some embodiments, dielectric layer 182 is silicon nitride having a thickness up to about 600 Å and may be formed using LPCVD.

A layer of photoresist can be formed over nitride layer 182. The layer of photoresist can be patterned to form a photomask 186 an opening 190. Opening 190 exposes a portion of nitride layer 182 that is over gate electrode 134, dielectric material 127, a portion of pedestal structure 104, and a portion of oxide layer 120.

The exposed portions of nitride layer 182 can be anisotropically etched using, for example, a reactive ion etch technique. Due the anisotropic etch, the exposed portions of nitride layer 182 are removed, except a portion of nitride layer 182 remains over oxide layer 181. After the etch of nitride layer 182, oxide material 127 is exposed. As is discussed above with reference to FIG. 20, dielectric material 127 electrically isolates gate interconnect 98 from gate electrode 134. After the nitride etch, mask 186 can be removed.

Figure 24:
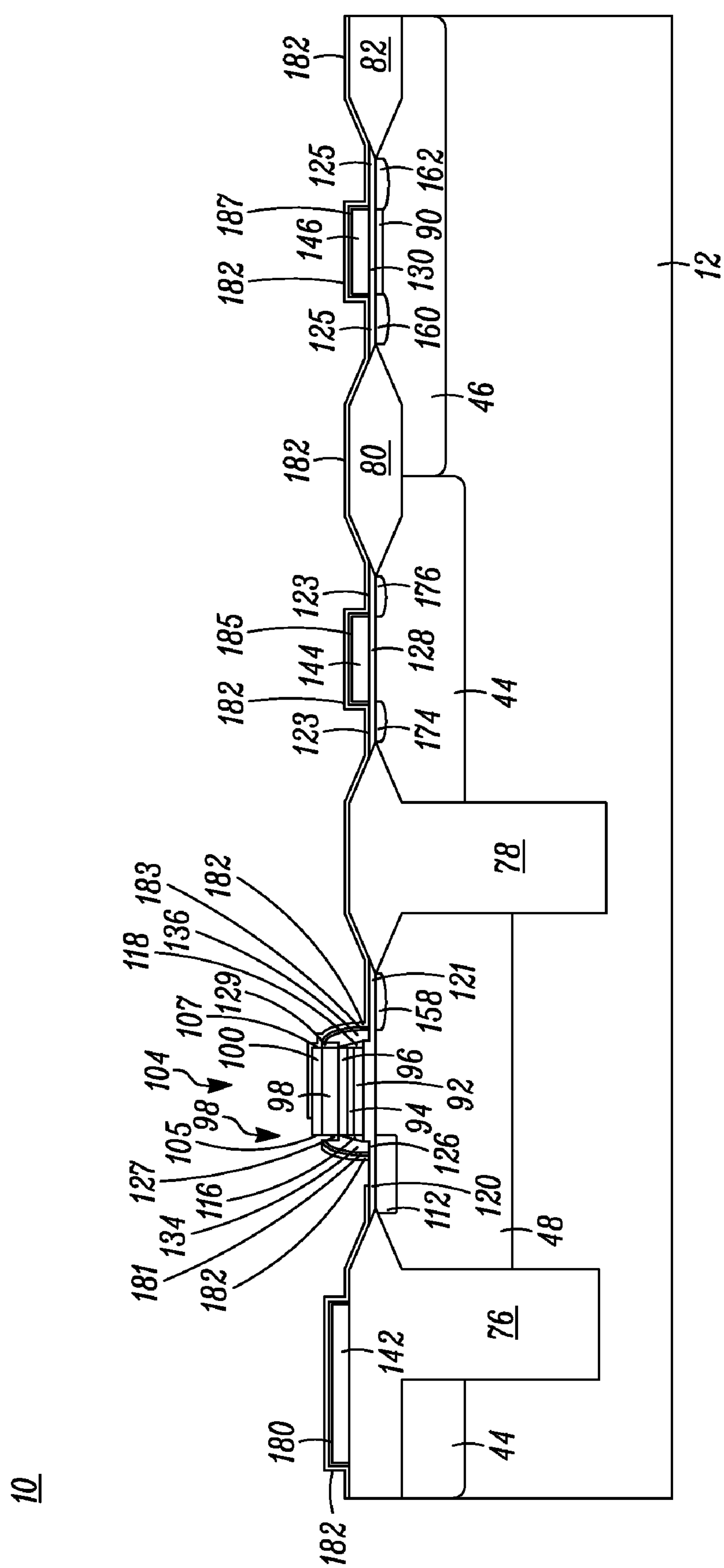
FIG. 24 is a cross-sectional view of the semiconductor structure of FIG. 23 at a later stage of manufacture.

Referring now to FIG. 24, a portion of oxide 127 and a portion of the exposed portion of oxide layer 120 exposed by opening 190 (FIG. 23) of mask 186 (FIG. 23) are removed using a wet oxide etch. For example, about 10 Å to about 100 Å of oxides 127 and 120 are removed. Removing a portion of oxide 127 forms a slit or gap 198 between gate electrode 134 and gate interconnect 98 of pedestal structure 104, thereby exposing a portion of gate electrode 134 and gate interconnect 98. Thus, gate electrode 134 and gate interconnect 98 remain electrically isolated from each other.

Figure 25:
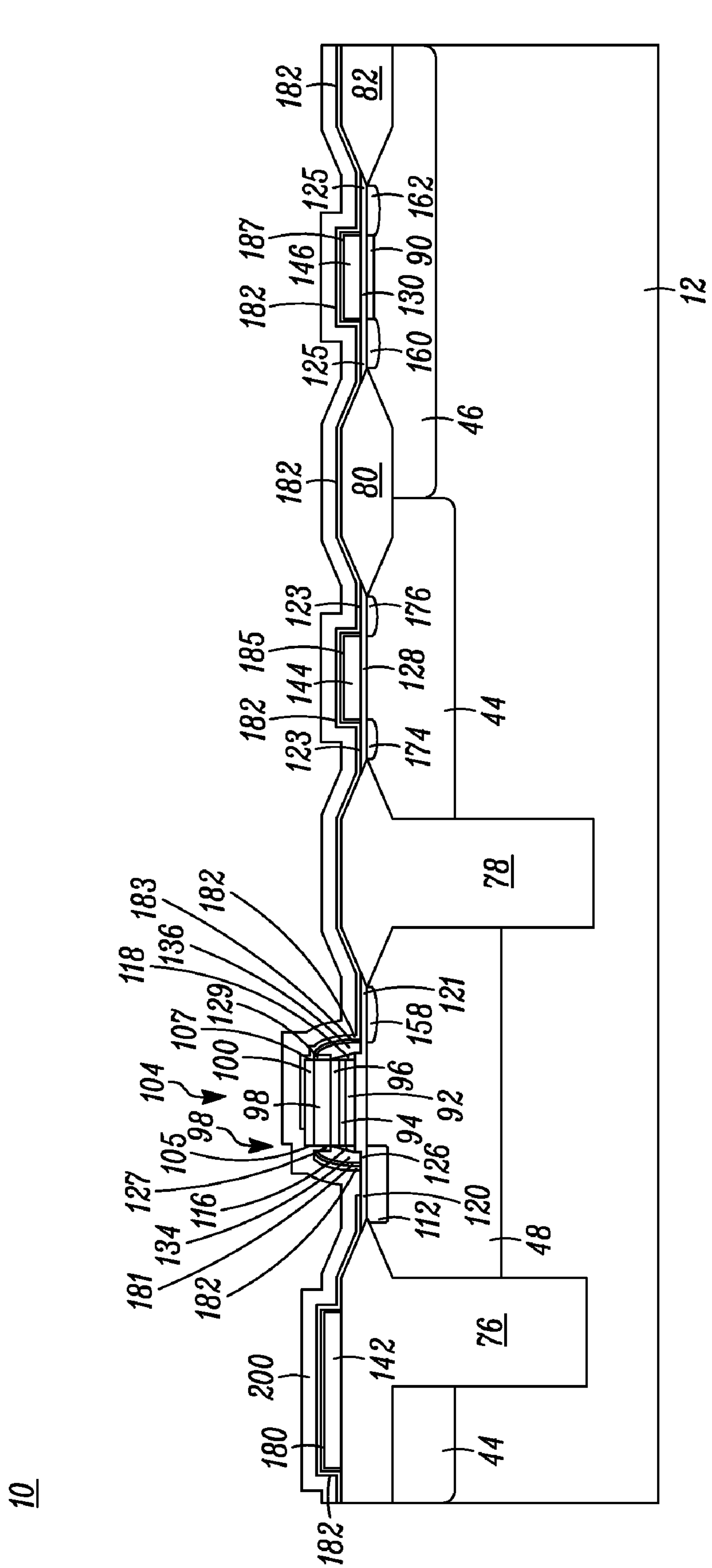
FIG. 25 is a cross-sectional view of the semiconductor structure of FIG. 24 at a later stage of manufacture.

Referring now to FIG. 25, after the oxide etch, a layer of polysilicon 200 having a thickness ranging from about 100 Å to about 500 Å can be conformally formed over nitride layer 182 and over the exposed portions of pedestal structure 104, oxide 127, and oxide layer 120. In some embodiments, polysilicon layer 200 can be formed using LPCVD. Polysilicon layer 200 fills slit 198 during deposition of polysilicon layer 200. Polysilicon layer 200 can also be doped with an impurity material of the same conductivity type as gate interconnect 98 of pedestal structure 104. Thus, polysilicon layer 200 electrically couples gate electrode 134 with gate interconnect 98.

Figure 26:
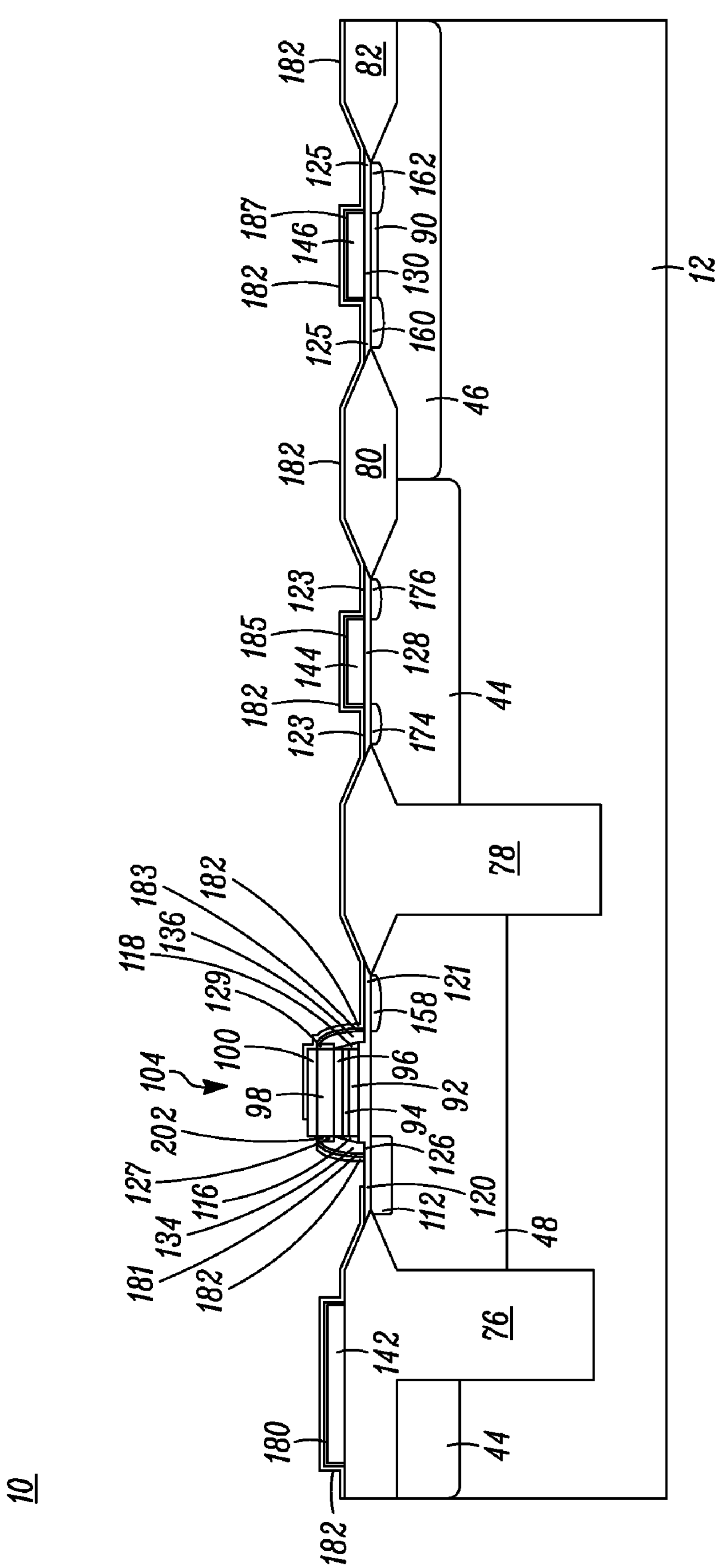
FIG. 26 is a cross-sectional view of the semiconductor structure of FIG. 25 at a later stage of manufacture.

Referring now to FIG. 26, polysilicon layer 200 can be anisotropically etched using, for example, a reactive ion etch to remove substantially all of layer 200. After the etch, only a relatively small portion, or a sliver 202 of polysilicon layer 200 remains in slit 198 over oxide 127. Sliver 202 electrically couples gate electrode 134 to gate interconnect 98 of pedestal structure 104. Thus, sliver 202 is also referred to as an interconnect structure.

Figure 27:
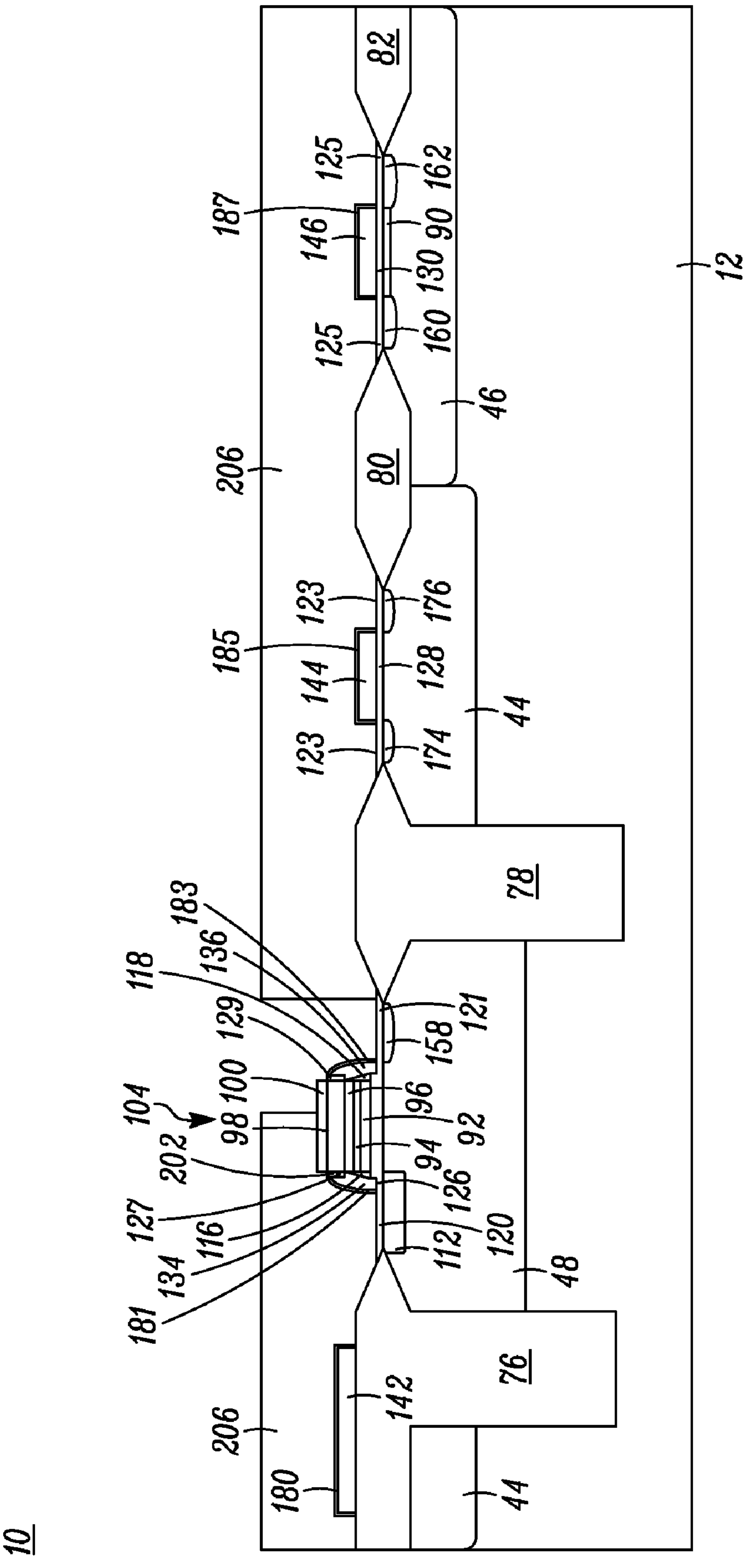
FIG. 27 is a cross-sectional view of the semiconductor structure of FIG. 26 at a later stage of manufacture.

Referring now to FIG. 27, nitride layer 182 (FIG. 26) can be removed using a blanket etch. Isolation structures 76, 78, 80, and 82, oxide layer 120, and oxide layer 180 can serve as etch stops for the removal of nitride layer 182 (FIG. 26). In other embodiments, polysilicon 136 may be removed to reduce drain side capacitive coupling.

In some embodiments, if relatively higher frequency operation is desired for the higher voltage lateral transistor, the gate-to-drain parasitic capacitance between gate interconnect 98 and the drain of the higher voltage lateral transistor can be reduced by removing the portion of gate interconnect 98 that is nearest the drain region. This may be achieved by forming a layer of photoresist can be formed over integrated circuit 10. The layer of photoresist can be patterned to form a mask 206 and an opening 209. Opening 209 exposes oxide layer 121 and oxide layer 183 that is over polysilicon material 136 and exposes the portion of pedestal structure 104 that is adjacent a region that will be the drain region of the higher voltage lateral transistor. The higher voltage lateral transistor will be asymmetric in that the source and drain regions of the lateral transistor will not be interchangeable, and therefore, the higher voltage lateral transistor may be referred to as an asymmetric, unilateral, or unidirectional transistor. Compare this to the lower voltage P-channel and N-channel devices that will have source and drain regions that are interchangeable, and therefore, the P-channel and N-channel devices may referred to as symmetrical, bilateral, or bidirectional transistors.

Figure 28:
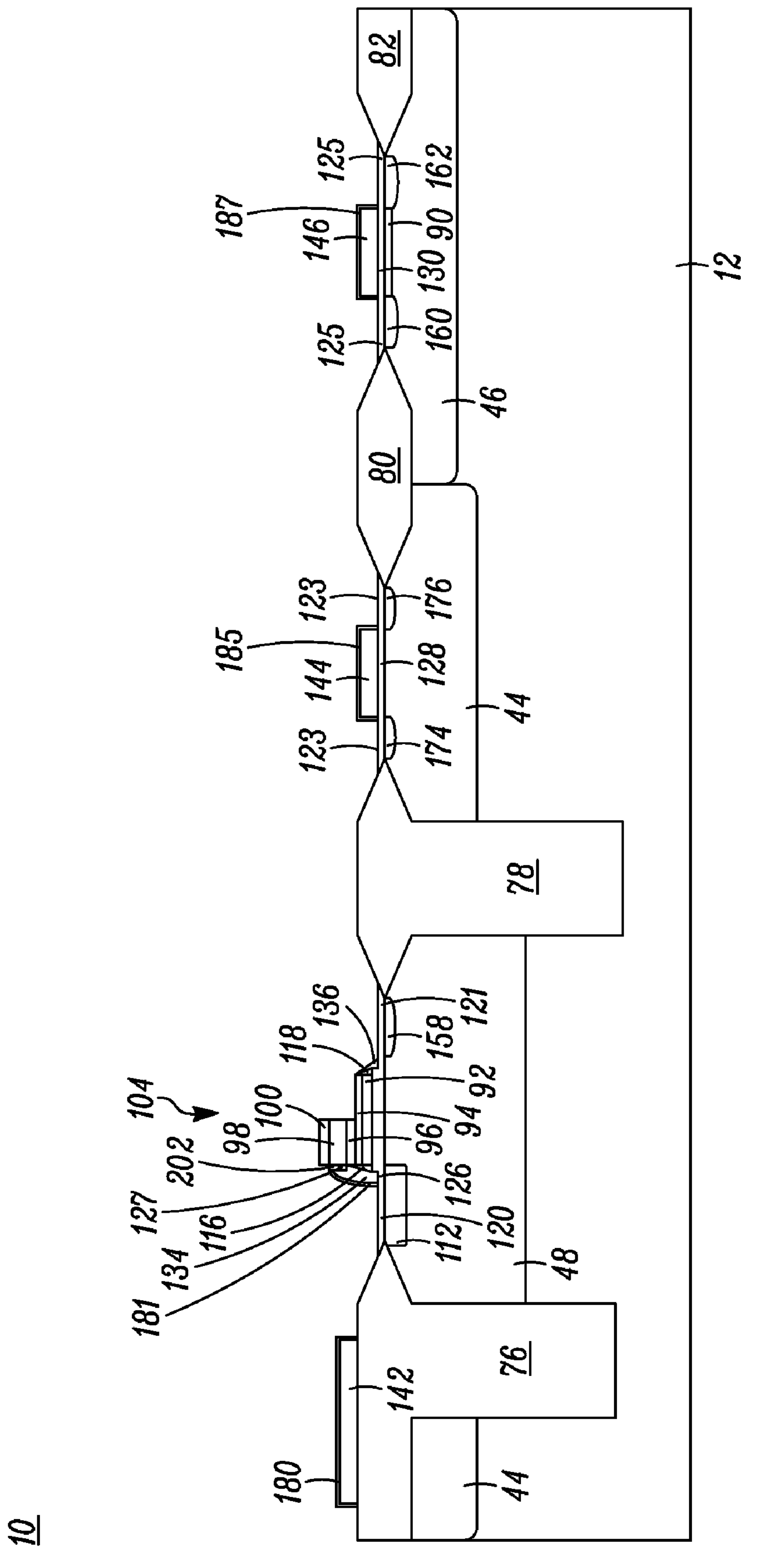
FIG. 28 is a cross-sectional view of the semiconductor structure of FIG. 27 at a later stage of manufacture.

Referring now to FIG. 28, after forming mask 206, using one or more etch operations, oxide layers 129 and 183 are removed and portions of nitride layer 100, gate interconnect 98, nitride layer 96, silicon nitride layer 118, and polysilicon layer 136 are removed. An advantage of removing the portion of gate interconnect 98 is that it decreases capacitive coupling between gate interconnect 98 and the drain by increasing the distance between gate interconnect 98 and the drain region. This is in addition to reducing the gate-to-drain capacitance by using a pedestal structure 104 to form gate interconnect 98, wherein pedestal structure 104 aids in reducing the-to-drain capacitance by increasing the vertical distance of gate interconnect 98 from the drain region of the higher voltage lateral transistor. Mask 206 can then be removed. However, the scope of the claimed subject matter is not limited in these respects.

The process steps described with reference to FIGS. 27 and 28, including the use of a mask 206 are optional and may be omitted in other embodiments. For example, in embodiments wherein relatively a higher frequency of operation is not desired for higher voltage lateral transistor, the process steps for removing a portion of gate interconnect 98 may be omitted.

Figure 29:
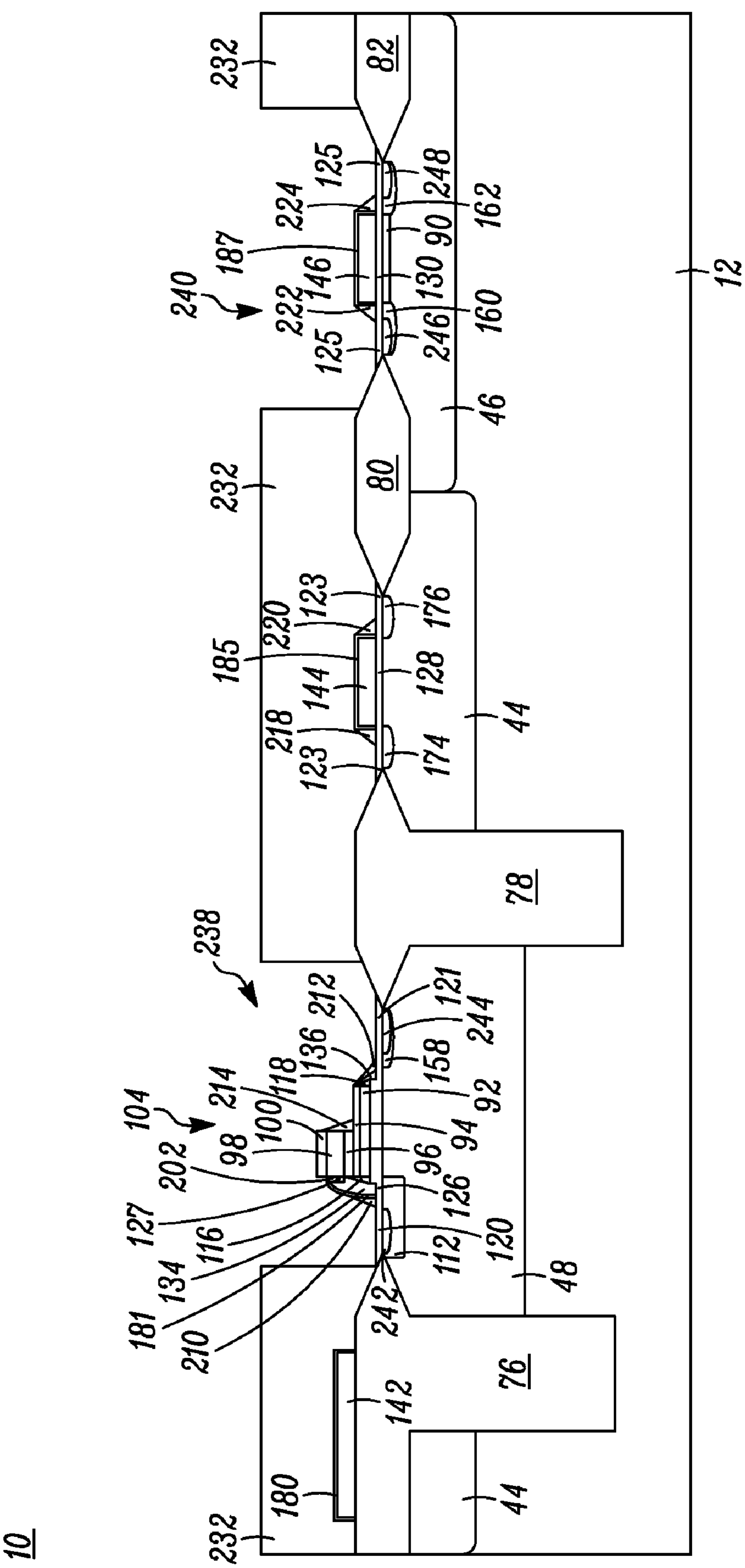
FIG. 29 is a cross-sectional view of the semiconductor structure of FIG. 28 at a later stage of manufacture.

FIG. 29 illustrates integrated circuit 10 at a later stage of manufacture. Integrated circuit 10 can be annealed to repair any damage that may have occurred to substrate 12 during the formation of doped regions 112, 158, 160, 162, 174, and 176. In some embodiments, this anneal can be performed at a temperature ranging from about 900° C. to about 1000° C. for a time period ranging from about 10 minutes to about 60 minutes. In other embodiments, a rapid thermal anneal (TRA) can be used. Doped regions 112, 158, 160, 162, 174, and 176 can be diffused as part of this anneal operation. In other words, doped regions 112, 158, 160, 162, 174, and 176 can be drove-in or activated as part of this anneal operation. Next, a layer of dielectric material (not shown) having a thickness ranging from about 500 Å to about 2000 Å can be formed over the structure shown in FIG. 28. By way of example, the dielectric layer comprises an oxide that is formed by decomposition of tetraethylorthosilicate ("TEOS"), and accordingly the dielectric layer may be referred to as a TEOS oxide in this example. The dielectric layer can be anisotropically etched to form dielectric sidewall spacers 210 and 212 adjacent gate electrode 134 and spacer extension 136, respectively, dielectric sidewall spacers 218 and 220 adjacent opposing sidewalls of gate electrode 144, dielectric sidewall spacers 222 and 224 adjacent opposing sidewalls of gate electrode 146, and a dielectric sidewall spacer 214 adjacent a sidewall of layers 100, 98, and 96.

Still referring to FIG. 29, a layer of photoresist can be formed over integrated circuit 10 after the formation of spacers 210, 212, 214, 218, 220, 222, and 224. The layer of photoresist can be patterned to form a mask 232 having openings 238 and 240. Opening 238 exposes portions of oxide layers 120, 121, 210, 212, 214, nitride layer 100, shield layer 94, polysilicon interconnect material 202, and isolation structures 76 and 78. Opening 240 exposes portions of oxide layers 125, 187, 222, and 224, and isolation structures 80 and 82.

An impurity material of N-type conductivity can be simultaneously implanted through openings 238 and 240 into N doped regions 112, 158, 160 and 162 to form doped regions 242, 244, 246, and 248, respectively. The implant can include implanting a dopant of N-type conductivity such as, for example, arsenic, at a dose ranging from about $10^{14}$ ions/cm$^2$ to about 1016 ions/cm$^2$ using an implant energy ranging from about 50 keV to about 100 keV. Because doped regions 242, 244, 246, and 248 have a relatively higher N-type doping concentration than N-type doped regions 112, 158, 160 and 162, doped regions 242, 244, 246, and 248 may be referred to as N+ doped regions. The implant can be a zero degree implant or a tilt angle implant.

Figure 30:
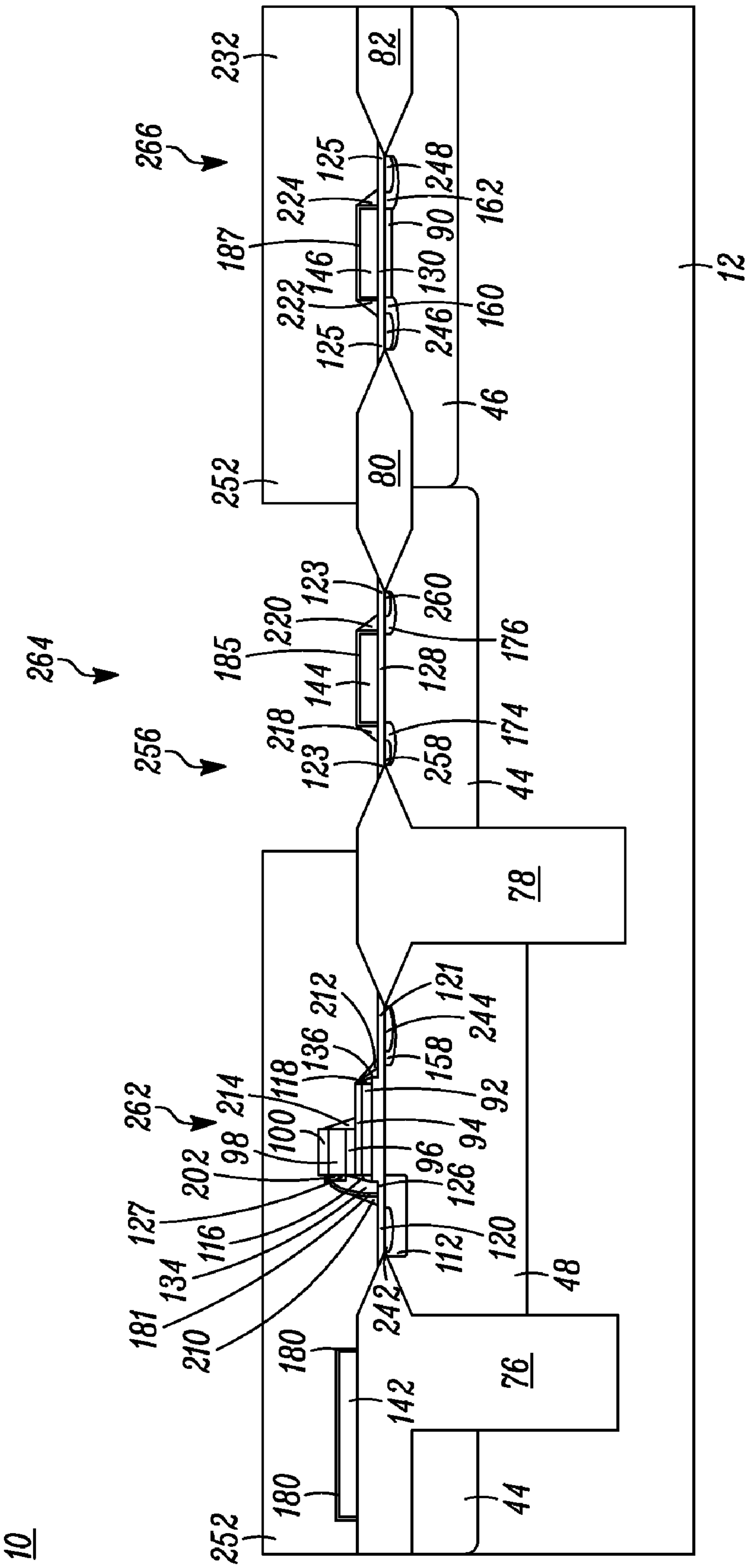
FIG. 30 is a cross-sectional view of the semiconductor structure of FIG. 29 at a later stage of manufacture.

Referring now to FIG. 30, mask 232 (FIG. 29) can be removed, and another layer of photoresist can be formed over integrated circuit 10. This layer of photoresist can be patterned to form a mask 252 having an opening 256. Opening 256 exposes portions of oxides 123, 185, 218, and 220 and isolation structures 78 and 80.

An impurity material of P-type conductivity can be implanted through opening 256 into P doped regions 174 and 176 to form doped regions 258 and 260, respectively. The implant can include implanting a dopant of P-type conductivity such as, for example, boron, at a dose ranging from about 1014 ions/cm$^2$ to about $10^{16}$ ions/cm$^2$ using an implant energy ranging from about 50 keV to about 100 keV. Because doped regions 258 and 260 have a relatively higher P-type doping concentration than P-type doped regions 174 and 176, doped regions 258 and 260 may be referred to as P+ doped regions. The implant can be a zero degree implant or a tilt angle implant.

Polysilicon layer 134 can serve as a gate of a lateral higher voltage transistor 262, and doped regions 242 and 244 serve as the source and drain regions, respectively, of higher voltage transistor 262. Doped region 158 serves as an LDD region of higher voltage transistor 262. Transistor 262 is a asymmetric, unilateral, or unidirectional transistor. Polysilicon layer 144 can serve as a gate of a FET 264, and doped regions 258 and 260 can serve as the source and drain regions of FET 264. FET 264 is a symmetric, bilateral, or bidirectional transistor. Therefore, doped region 258 may be either the source or drain region of FET 264, and doped region 260 may be either the drain or source region of FET 264. Polysilicon layer 146 can serve as a gate of a FET 266, and doped regions 246 and 248 can serve as the source and drain regions of FET 266. Like FET 264, FET 266 is a symmetric, bilateral, or bidirectional transistor. Therefore, doped region 246 may be either the source or drain region of FET 266, and doped region 248 may be either the drain or source region of FET 266.

Figure 31:
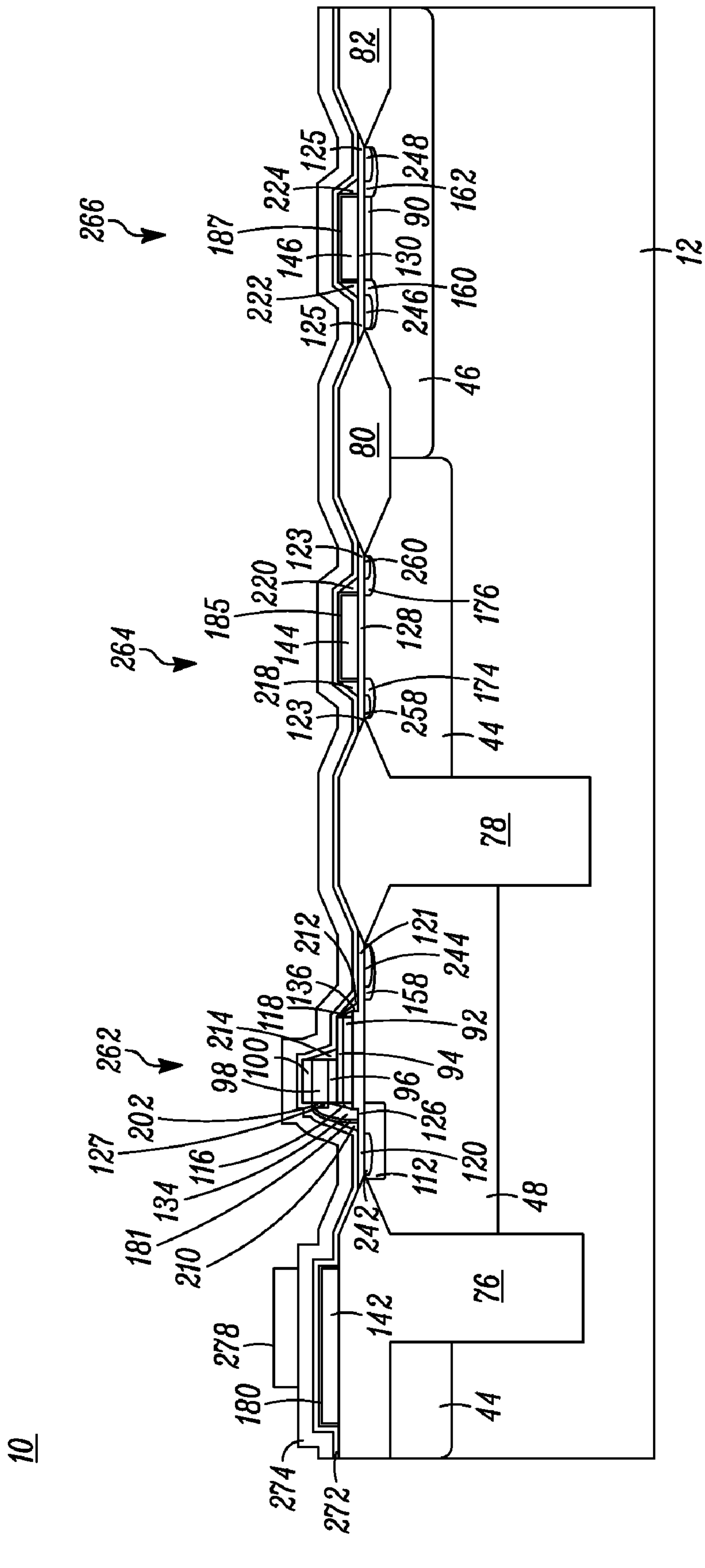
FIG. 31 is a cross-sectional view of the semiconductor structure of FIG. 30 at a later stage of manufacture.

Referring now to FIG. 31, implant mask 252 (FIG. 30) can be removed, and a layer of dielectric material 272 having a thickness ranging up to about 600 Å can be formed over integrated circuit 10 after mask 252 is removed. Integrated circuit 10 can be annealed using a rapid thermal anneal (RTA)

in an inert ambient, such as a nitrogen or argon ambient at a temperature ranging from about 900° C. to about 1000° C. for a time period ranging from about 30 seconds to about 60 second. After the anneal, a layer of electrically conductive material 274 having a thickness ranging from about 500 Å to about 2000 Å can be formed over dielectric layer 272. Dielectric layer 272 can be an oxide and can be formed by a deposition using TEOS, and conductive layer 274 can be doped polysilicon formed using LPCVD, and can be doped prior to, or during deposition of the polysilicon. A layer of photoresist can be formed over conductive layer 274 and can be patterned to form a mask 278 over electrode 142.

Figure 32:
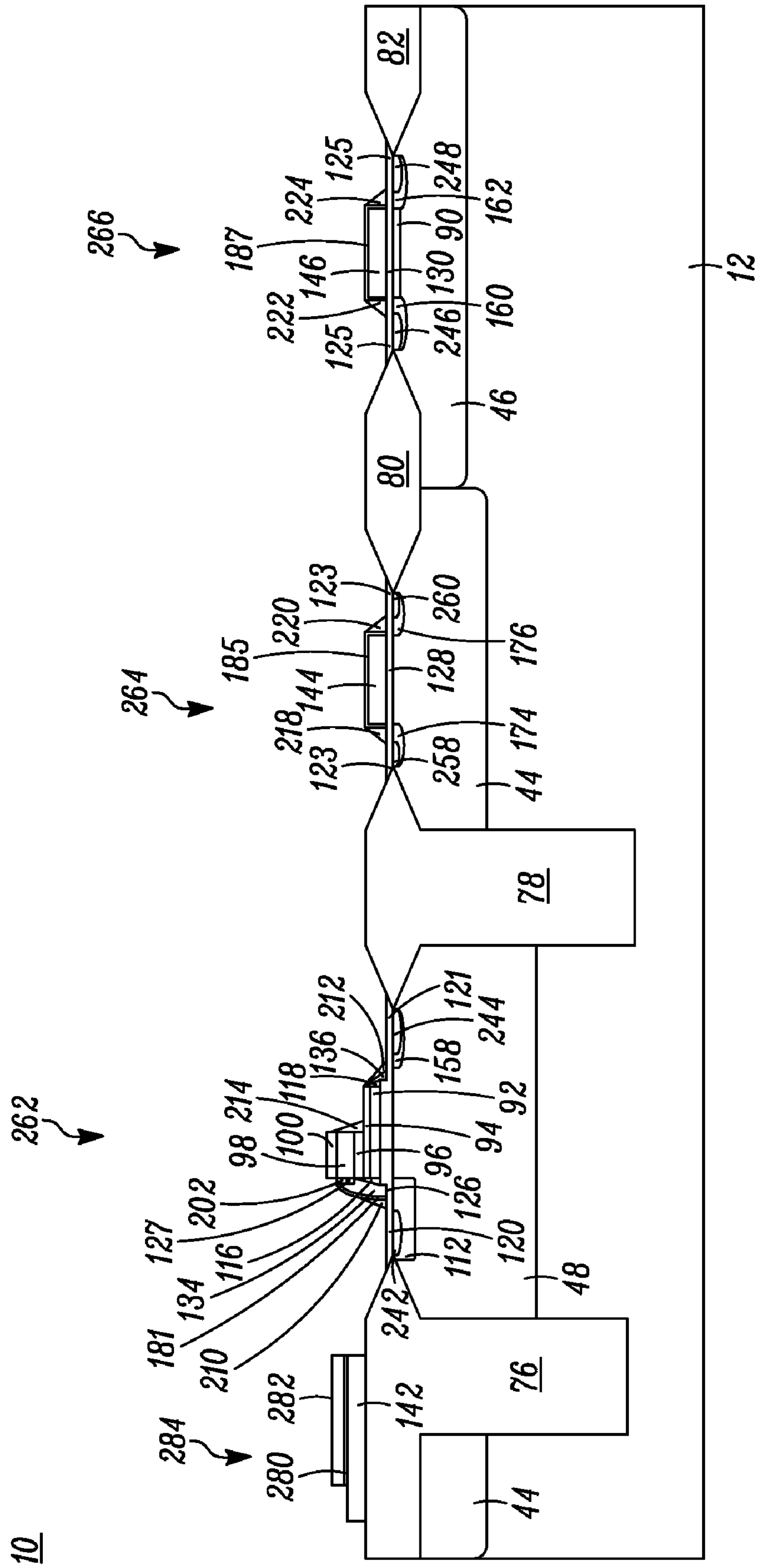
FIG. 32 is a cross-sectional view of the semiconductor structure of FIG. 31 at a later stage of manufacture.

Referring now to FIG. 32, the portions of conductive layer 274 (FIG. 31) and dielectric layer 272 (FIG. 31) unprotected by masking structure 278 can be removed using one or more etch operations. After the one or more etch operations, a portion 280 of dielectric layer 272 (FIG. 31) remains over a portion of oxide layer 180, and a portion 282 of conductive layer 274 (FIG. 31) remains over portion 280. Polysilicon layer 142 serves as one electrode or plate of a capacitor 284; oxide layers 180 and 280 together serve as an insulating material of capacitor 284; and polysilicon layer 282 serves as another electrode or plate of capacitor 284. Capacitor 284 can be referred to as integrated passive device as capacitor 284 is integrated with other semiconductor components and formed using semiconductor processes. Further, capacitor 284 may be referred to as a planar capacitor. After the one or more etch operations, mask 278 can be removed. Other embodiments to form integrated capacitor 284 may include simultaneously forming the dielectric and conductive layers of capacitor 284 using the same materials and processes as are used to form elements of higher voltage transistor 262 such as, for example, some of the materials used to form pedestal 104 may also be used to form capacitor 284.

Figure 33:
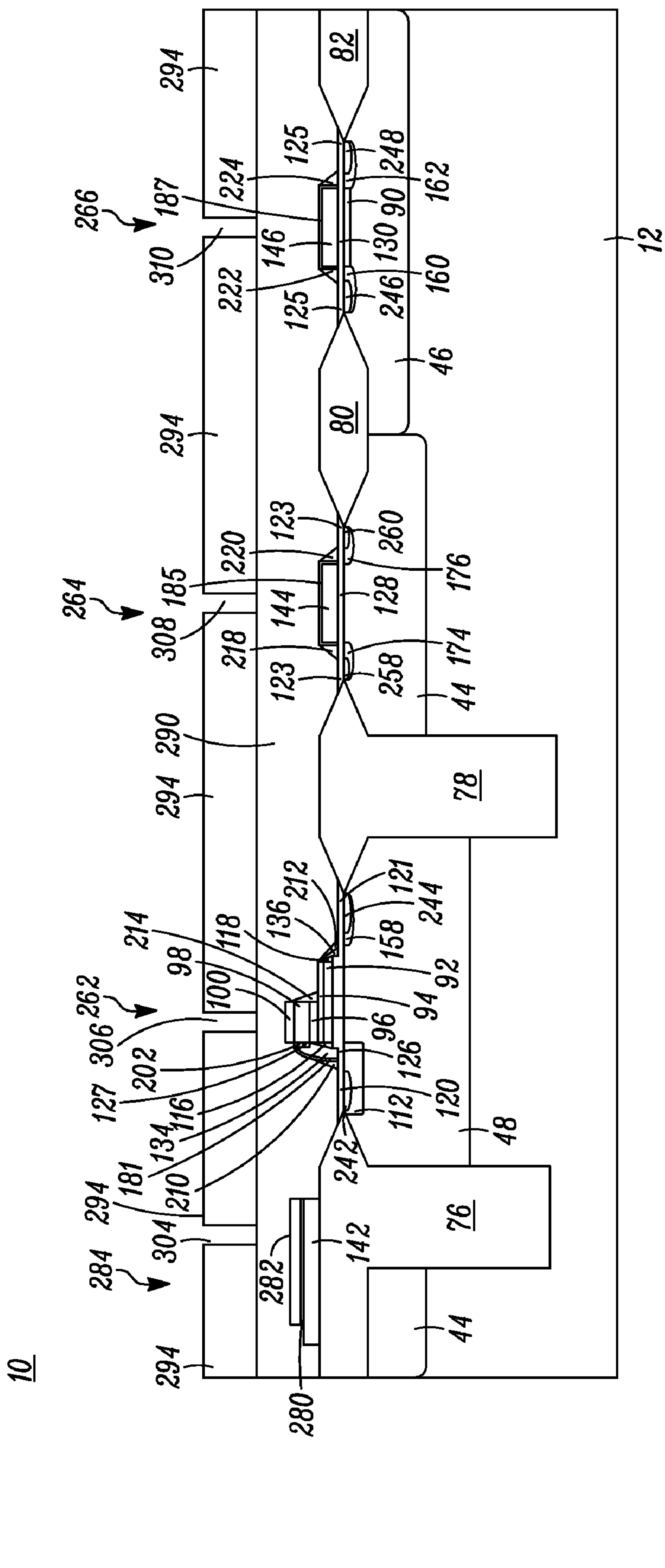
FIG. 33 is a cross-sectional view of the semiconductor structure of FIG. 32 at a later stage of manufacture.

Referring now to FIG. 33, a dielectric material 290 can be formed over the structure shown in FIG. 32. In some embodiments, dielectric material 290 can be phosphorus silicate glass (PSG), boron phosphorus silicate glass (BPSG), or an oxide formed using tetraethylorthosilicate (TEOS), and may be formed using either CVD or PECVD. Dielectric material 290 can be planarized using chemical mechanical planarization ("CMP"). A layer of photoresist can be formed over dielectric material 290 and patterned to form a mask 294 and openings 304, 306, 308, and 310. Opening 304 exposes a portion of dielectric material 290 over a portion of polysilicon layer 282 of capacitor 284, opening 306 exposes a portion of dielectric material 290 over gate interconnect 98 of pedestal structure 104, opening 308 exposes a portion of dielectric material 290 over gate electrode 144 of FET 264, and opening 310 exposes a portion of dielectric material 290 over gate electrode 146 of FET 266.

Figure 34:
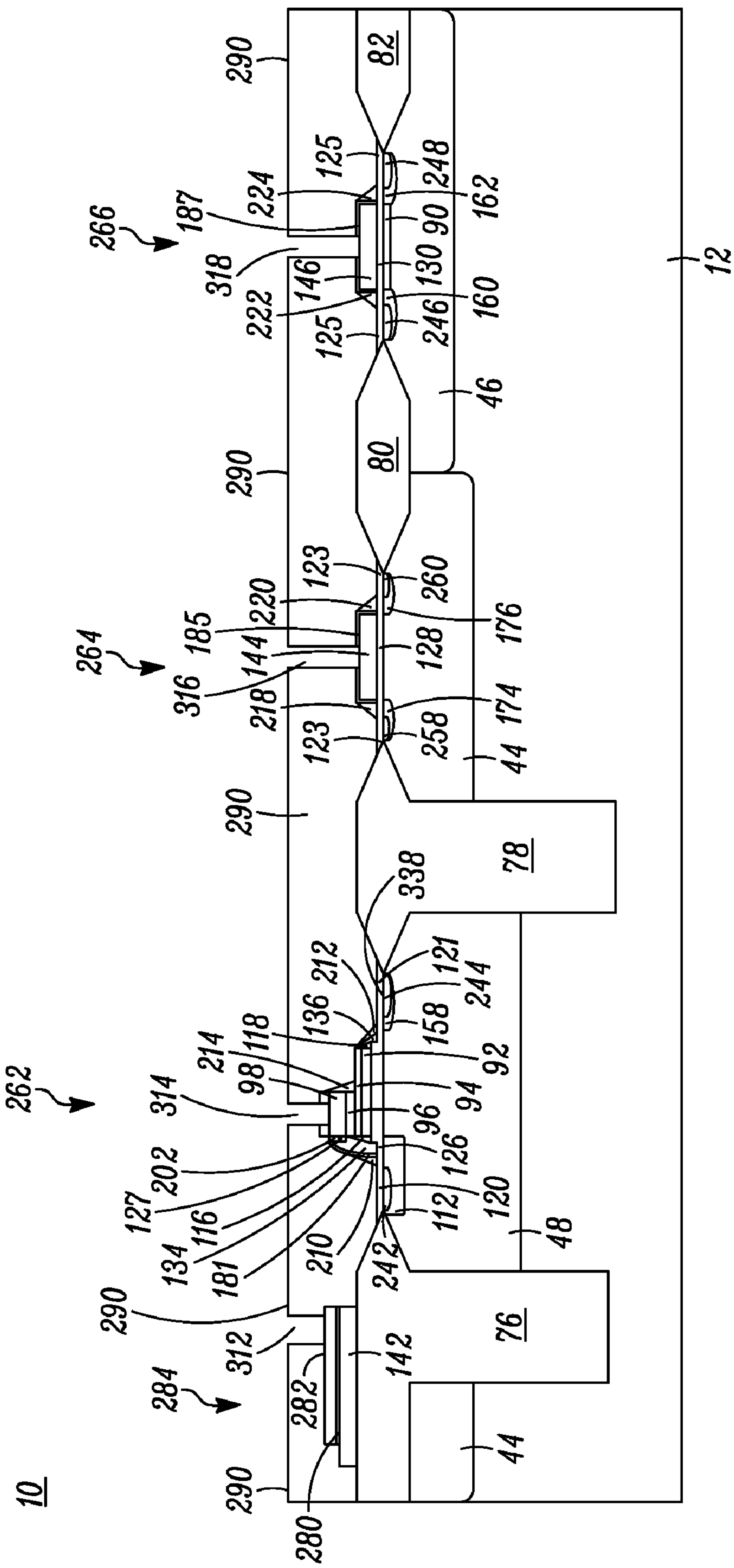
FIG. 34 is a cross-sectional view of the semiconductor structure of FIG. 33 at a later stage of manufacture.

Referring now to FIG. 34, the exposed portions of dielectric layer 290 can be anisotropically etched using, for example, a reactive ion etch to form openings that expose portions of transistors 262, 264, 266, and capacitor 284. More particularly, portions of dielectric layer 290 are remove to form openings 312, 314, 316, and 318. Opening 312 exposes a portion of plate 282 of capacitor 284, opening 314 exposes a portion of gate interconnect 98 of pedestal structure 104, opening 316 exposes a portion of gate electrode 144, and opening 318 exposes a portion of gate electrode 146. Mask 294 can be removed after forming openings 312, 314, 316, and 318.

Figure 35:
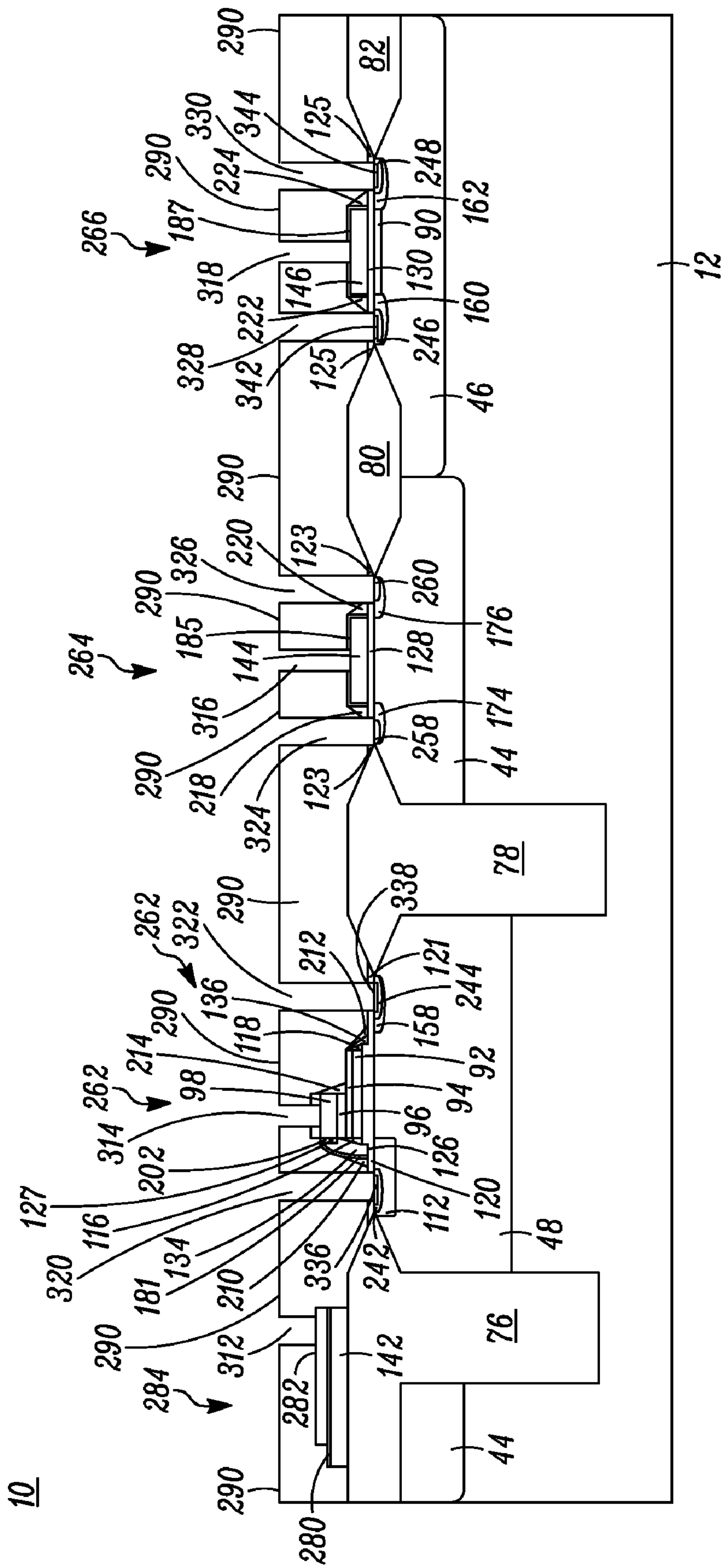
FIG. 35 is a cross-sectional view of the semiconductor structure of FIG. 34 at a later stage of manufacture.

Referring now to FIG. 35, a masking structure (not shown) can be formed over dielectric layer 290. The masking structure can be a photoresist having openings that expose portions of dielectric layer 290 that are over doped regions 242, 244, 256, 258, 246 and 248. The exposed portions of dielectric layer 290 can be anisotropically etched to form openings 320 and 322 that expose doped regions 242 and 244, respectively, of lateral higher voltage transistor 262. The anisotropic etch also forms openings 324 and 326 that expose doped regions 256 and 258, respectively, of transistor 264, and openings 328 and 330 that expose doped regions 246 and 248, respectively, of transistor 266.

Figure 36:
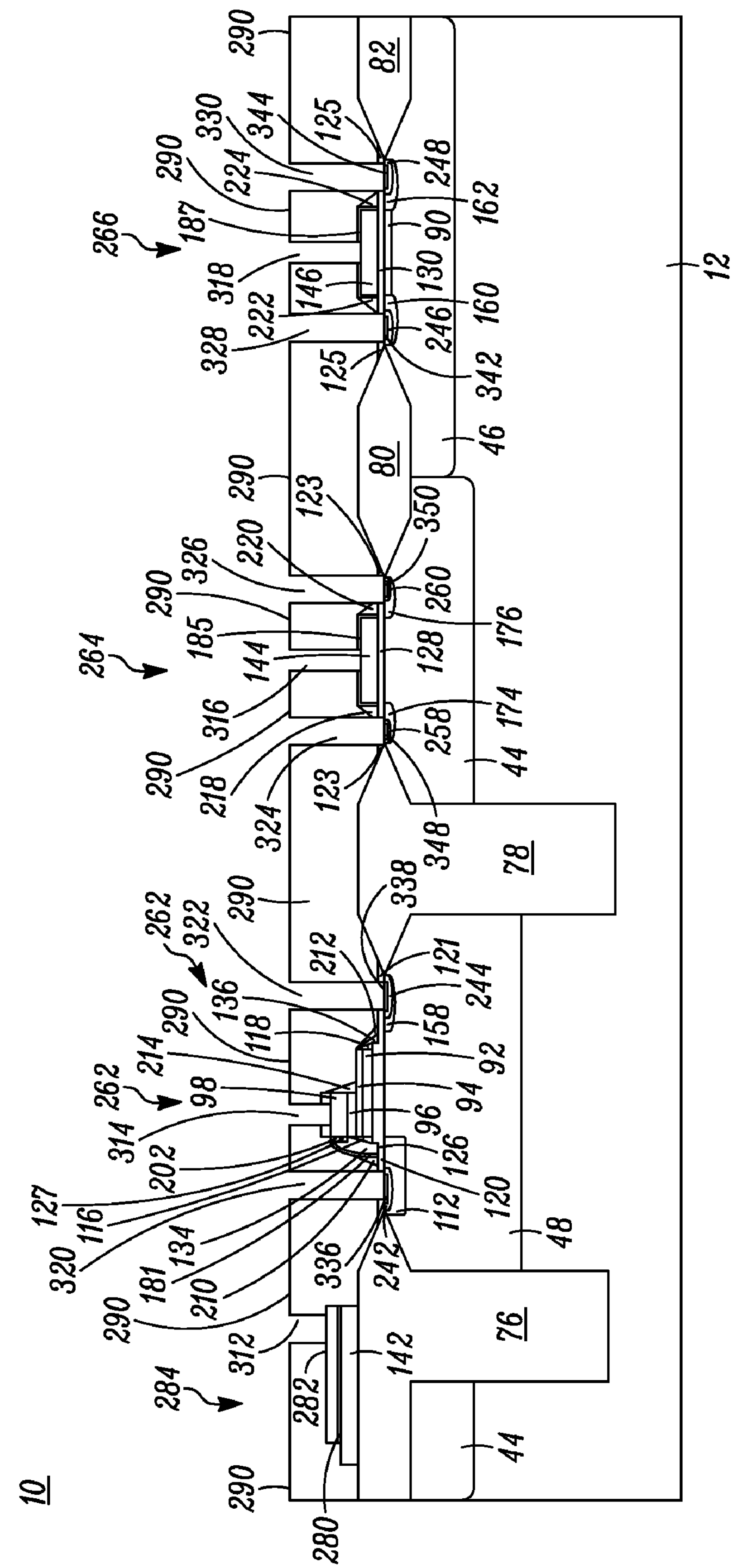
FIG. 36 is a cross-sectional view of the semiconductor structure of FIG. 35 at a later stage of manufacture.

The masking structure can be removed, and another photoresist mask (not shown) can be formed over dielectric layer 290 that re-opens openings 312, 314, 318, 320, 322, 328, and 330. An impurity material of N-type conductivity such as, for example, arsenic can be implanted through openings 320, 322, 328, and 330 to form doped regions 336, 338, 342, and 344, respectively. Doped regions 336, 338, 342, and 344 are formed to lower the contact electrical resistance to interconnects 360 (FIG. 37), 362 (FIG. 37), 368 (FIG. 37), and 370 (FIG. 37), respectively. This N-type implant operation can also simultaneously implant arsenic through openings 312, 314, and 318 to increase the doping concentration in the regions of polysilicon layers 282, 98, and 146 exposed by openings 312, 314, and 318, respectively. Doping the regions of polysilicon layers 282, 98, and 146 in this manner will lower the contact electrical resistance to interconnects 352 (FIG. 37), 354 (FIG. 37), and 358 (FIG. 37), Referring now to FIG. 36, the masking structure (not shown) used to form doped regions 336, 338, 342, and 344 and increase the doping concentration of polysilicon layers 282, 98, and 146 can be removed, and another photoresist mask (not shown) can be formed over dielectric layer 290 that re-opens openings 316, 324 and 326. An impurity material of P-type conductivity such as, for example, boron difluoride ($BF_2$) is implanted through openings 324 and 326 to form doped regions 348 and 350 in doped regions 256 and 258, respectively. Doped regions 348 and 350 are formed to lower the contact electrical resistance to interconnects 364 (FIG. 37) and 366 (FIG. 37), respectively. This P-type implant operation can also simultaneously implant boron difluoride through opening 316 to increase the doping concentration in the region of polysilicon layer 144 exposed by opening 316. Doping the region of polysilicon layer 144 in this manner will lower the contact electrical resistance to interconnect 356 (FIG. 37).

Figure 37:
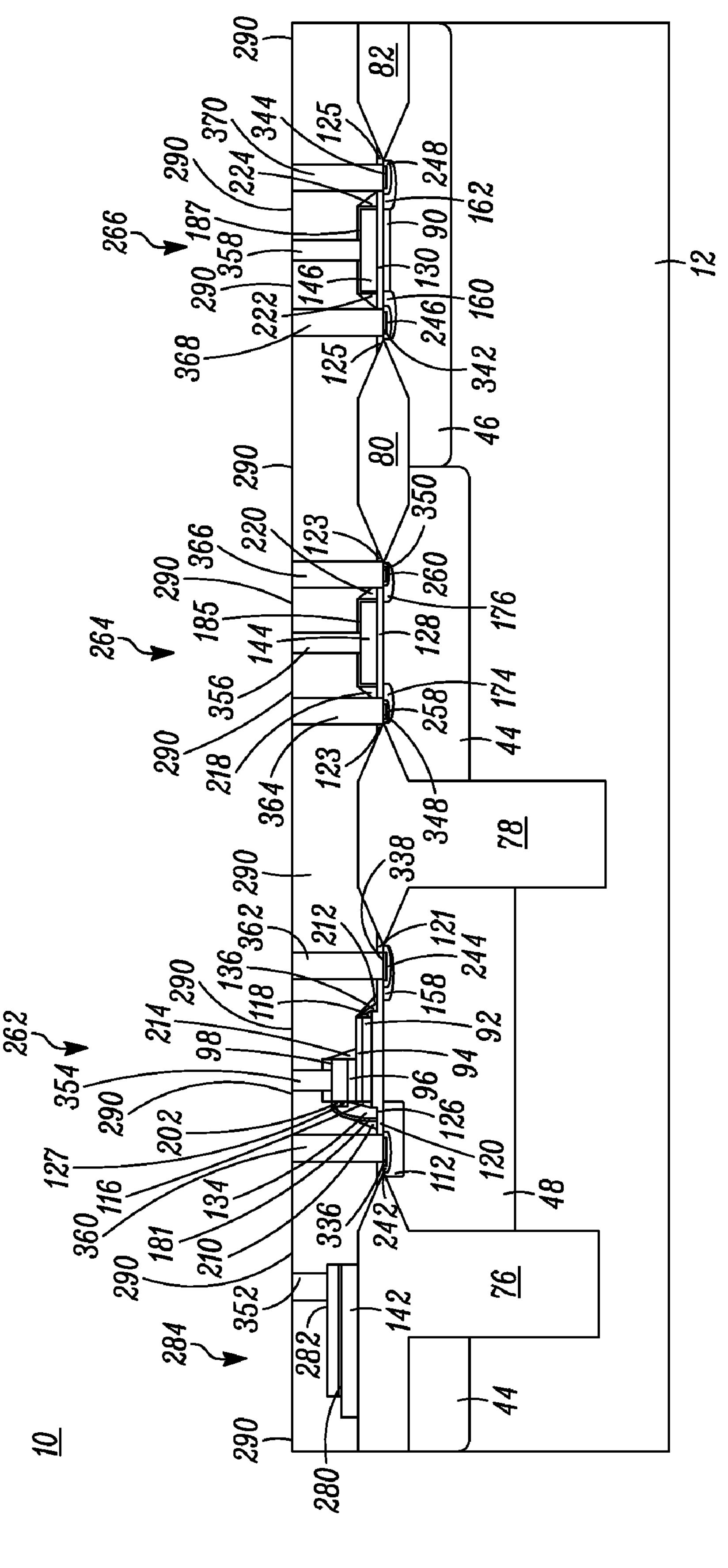
FIG. 37 is a cross-sectional view of the semiconductor structure of FIG. 36 at a later stage of manufacture.

Referring now to FIG. 37, the masking structure (not shown) used to form doped regions 348 and 350 can be removed, and openings 312 (FIG. 35), 314 (FIG. 35), 316 (FIG. 35), 318 (FIG. 35), 320 (FIG. 35), 322 (FIG. 35), 324 (FIG. 35), 326 (FIG. 35), 328 (FIG. 35), and 330 (FIG. 35) can be lined with titanium nitride. Then tungsten can be formed over the titanium nitride that lines openings 312 (FIG. 35), 314 (FIG. 35), 316 (FIG. 35), 318 (FIG. 35), 320 (FIG. 35), 322 (FIG. 35), 324 (FIG. 35), 326 (FIG. 35), 328 (FIG. 35), and 330 (FIG. 35). The combination of the titanium nitride and tungsten forms titanium nitride/tungsten (TiN/W) plugs 352, 354, 356, 358, 360, 362, 364, 366, 368, and 370 in openings 312 (FIG. 35), 314 (FIG. 35), 316 (FIG. 35), 318 (FIG. 35), 320 (FIG. 35), 322 (FIG. 35), 324 (FIG. 35), 326 (FIG. 35), 328 (FIG. 35), and 330 (FIG. 35), respectively. The tungsten can be planarized using, for example, CMP. Although interconnects to shield layer 94 and lower electrode 142 of capacitor 142 are not shown, interconnects can be formed to layers 142 and 94.

Figure 38:
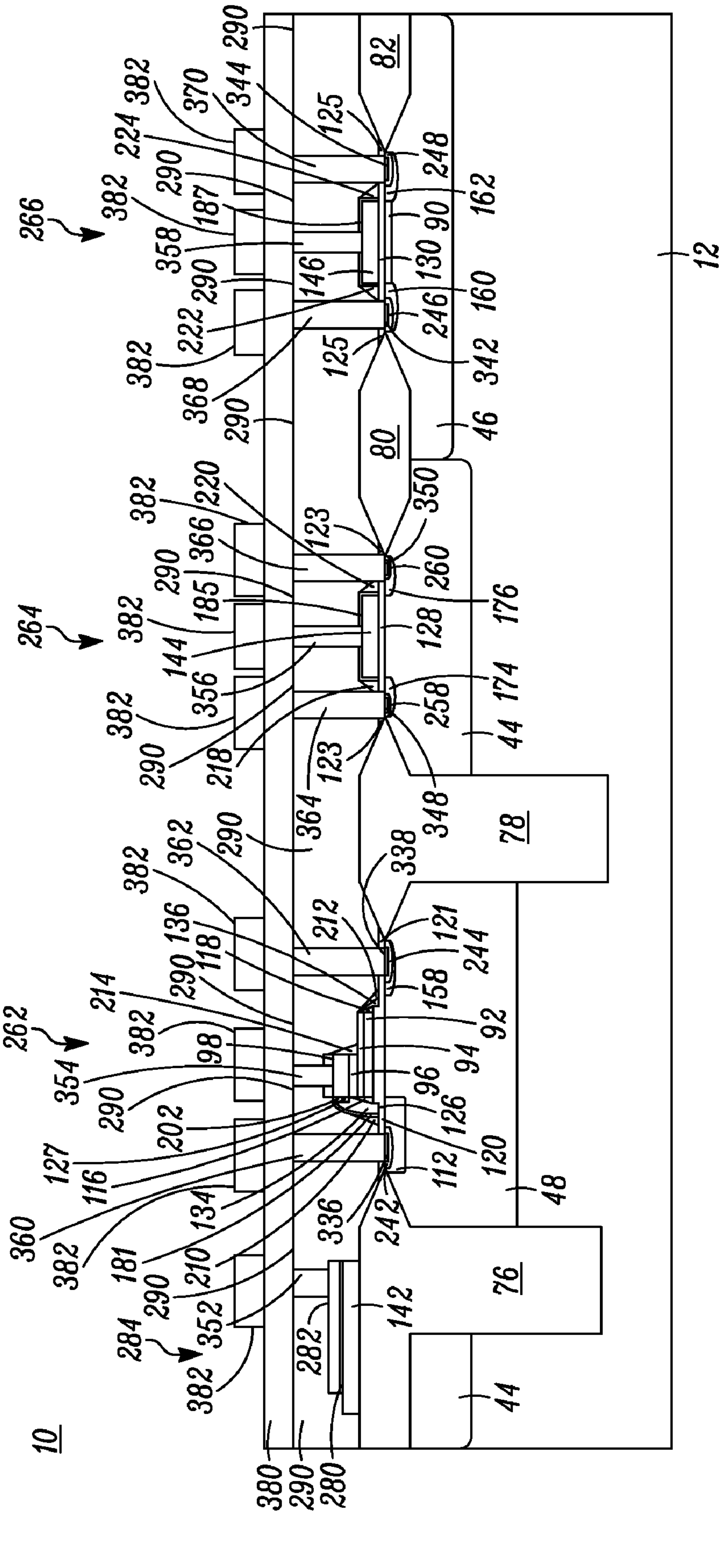
FIG. 38 is a cross-sectional view of the semiconductor structure of FIG. 37 at a later stage of manufacture.

Referring now to FIG. 38, a layer of conductive material 380 can be formed over dielectric layer 290 and titanium nitride/tungsten plugs 352, 354, 356, 358, 360, 362, 364, 366, 368, and 370. A layer of photoresist can be formed over conductive layer 380. The layer of photoresist can be patterned to form a masking structure 382.

Figure 39:
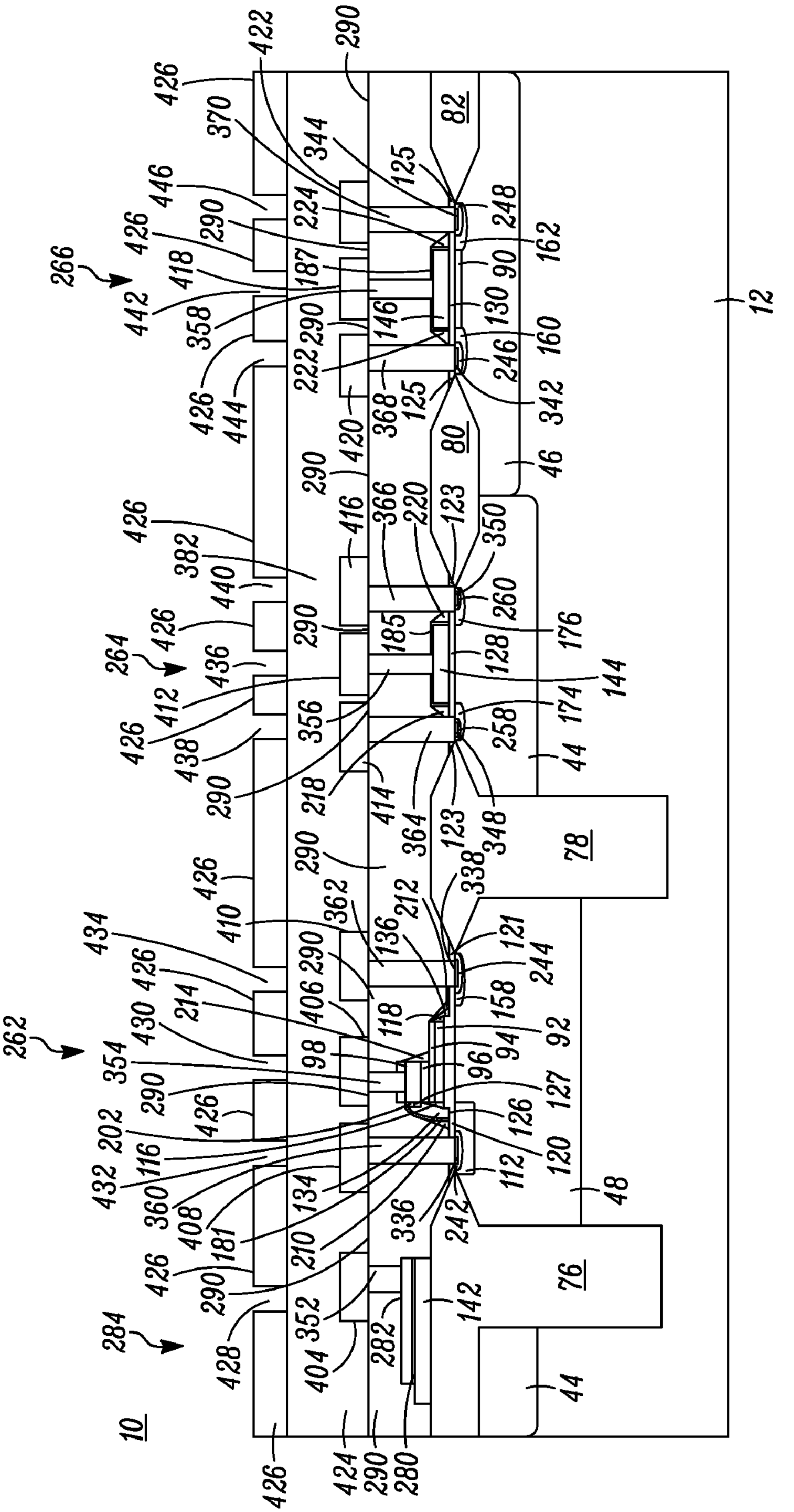
FIG. 39 is a cross-sectional view of the semiconductor structure of FIG. 38 at a later stage of manufacture.

Referring now to FIG. 39, the portions of conductive layer 380 (FIG. 38) unprotected by mask 382 can be anisotropically etched using, for example, a reactive ion etch. Mask 382 can be removed leaving metal 1 interconnect structures 404, 406, 408, 410, 412, 414, 416, 418, 420, and 422. A layer of dielectric material 424 such as, for example, PSG, PBSG, or an oxide formed using TEOS can be formed over dielectric material 290 and Metal 1 interconnect structures 404, 406, 408, 410, 412, 414, 416, 418, 420, and 422. A layer of photoresist can be formed over dielectric layer 424. The layer of photoresist can be patterned to form a masking structure 426 having openings 428, 430, 432, 434, 436, 438, 440, 442, 444, and 446 that are above Metal 1 interconnect structures 404, 406, 408, 410, 412, 414, 416, 418, 420, and 422, respectively. In other embodiments, a damascene process may be used to form electrical interconnects 352, 404, 360, 408, 354, 406, 362, 410, 364, 414, 356, 412, 366, 416, 368, 420, 358, 418, 370, and 422.

Figure 40:
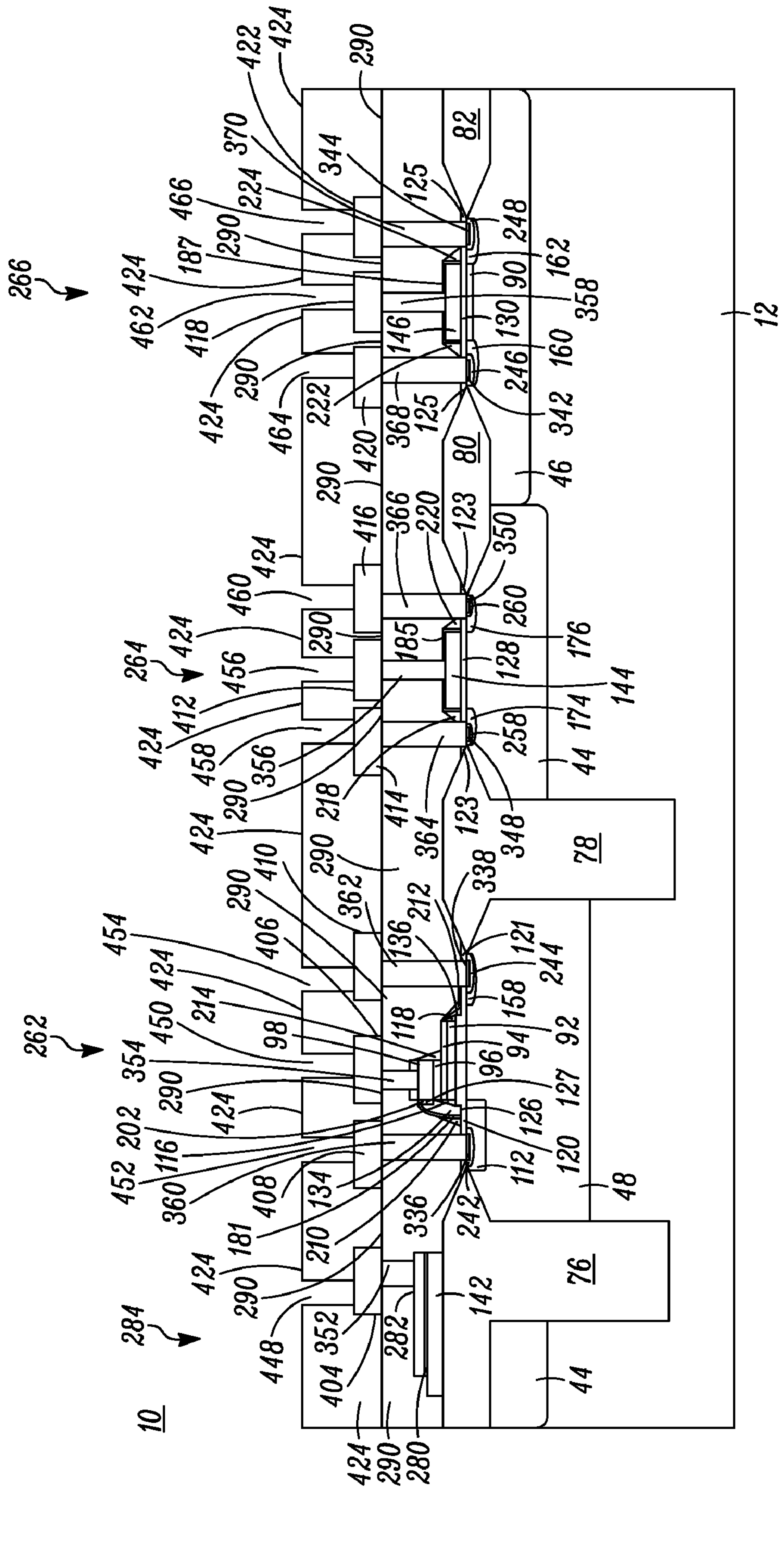
FIG. 40 is a cross-sectional view of the semiconductor structure of FIG. 39 at a later stage of manufacture.

Referring now to FIG. 40, the portions of dielectric layer 424 exposed by openings 428, 430, 432, 434, 436, 438, 440, 442, 444, and 446 can be removed using an anisotropic etch such as, for example, a reactive ion etch to form openings 448, 450, 452, 454, 456, 458, 460, 462, 464, and 466 that expose Metal 1 interconnect structures 404, 406, 408, 410, 412, 414, 416, 418, 420, and 422, respectively. Afterwards, masking structure 426 (FIG. 39) can be removed. Dielectric layer 424 may be referred to as an intermetal dielectric (IMD) layer or an interlayer dielectric (ILD) layer.

Figure 41:
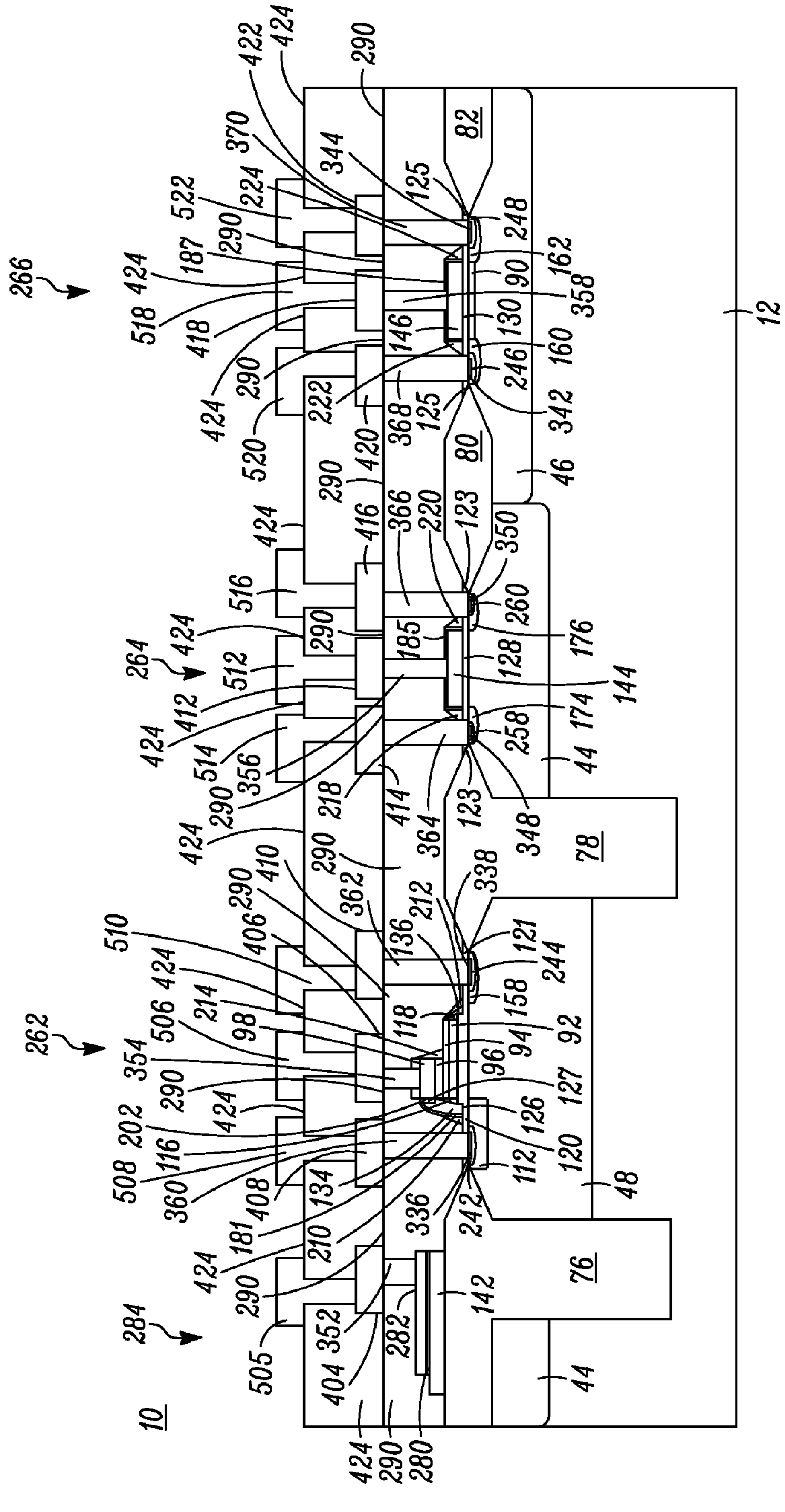
FIG. 41 is a cross-sectional view of the semiconductor structure of FIG. 40 at a later stage of manufacture.

Referring now to FIG. 41, openings 448 (FIG. 40), 450 (FIG. 40), 452 (FIG. 40), 454 (FIG. 40), 456 (FIG. 40), 458 (FIG. 40), 460 (FIG. 40), 462 (FIG. 40), 464 (FIG. 40), and 466 (FIG. 40) can be lined with titanium nitride. Then aluminum (Al), copper (Cu), aluminum silicon (AlSi), aluminum silicon copper (AlSiCu), or aluminum copper tungsten (AlCuW) can be formed over the titanium nitride that lines openings 448 (FIG. 40), 450 (FIG. 40), 452 (FIG. 40), 454 (FIG. 40), 456 (FIG. 40), 458 (FIG. 40), 460 (FIG. 40), 462 (FIG. 40), 464 (FIG. 40), and 466 (FIG. 40). The combination of the titanium nitride and the metals or alloys discussed above form plugs in openings 448 (FIG. 40), 450 (FIG. 40), 452 (FIG. 40), 454 (FIG. 40), 456 (FIG. 40), 458 (FIG. 40), 460 (FIG. 40), 462 (FIG. 40), 464 (FIG. 40), and 466 (FIG. 40). The plugs in openings 448 (FIG. 40), 450 (FIG. 40), 452 (FIG. 40), 454 (FIG. 40), 456 (FIG. 40), 458 (FIG. 40), 460 (FIG. 40), 462 (FIG. 40), 464 (FIG. 40), and 466 (FIG. 40) can be planarized using, for example, CMP. Metal 2 interconnect structures 505, 506, 508, 510, 512, 514, 516, 518, 520, and 522 can be formed using a method similar to that for forming Metal 1 interconnect structures 404, 406, 408, 410, 412, 414, 416, 418, 420, and 422, respectively.

Figure 42:
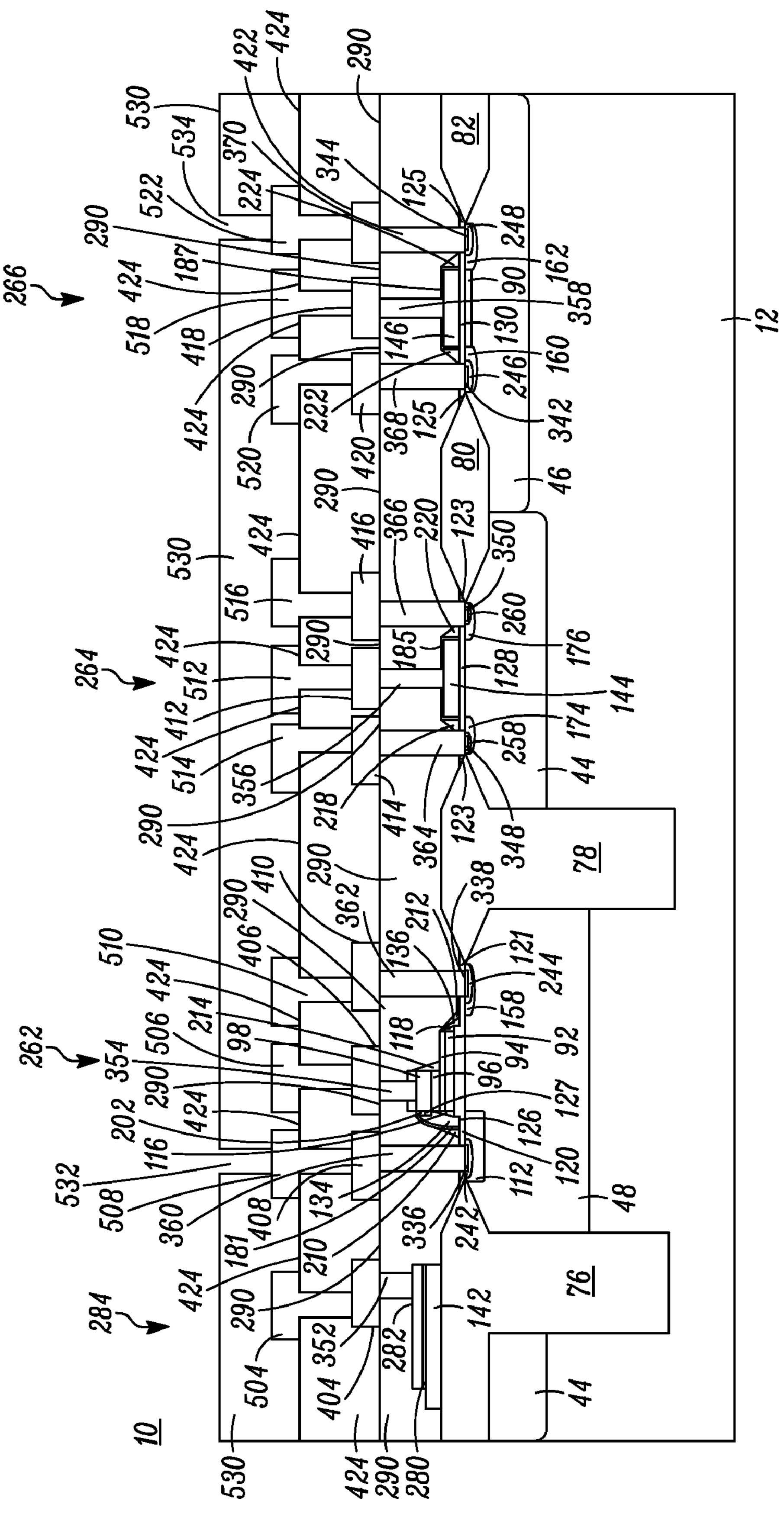
FIG. 42 is a cross-sectional view of the semiconductor structure of FIG. 41 at a later stage of manufacture.

Referring now to FIG. 42, a passivation layer 530 can be formed over dielectric layer 424 and Metal 2 interconnect structures 504, 506, 508, 510, 512, 514, 516, 518, 520, and 522. Openings 532 and 534 can be formed in passivation layer 530 to expose Metal 2 interconnect structures 508 and 522, respectively. The number of openings formed in passivation layer 530 is not a limitation of the claimed subject matter.

A semiconductor component or integrated circuit 10 comprising a higher voltage power FET 262 and a method for manufacturing the FET 262 have been provided. The higher voltage power FET 262 can be a lateral asymmetric transistor that includes a pedestal structure that increases the distance between the gate and the drain region of FET 262, that is, provides vertical separation between the gate electrode and the drain region. The vertical separation decreases the gate-to-drain capacitance of the semiconductor component. The pedestal structure can also include a gate shield to shield gate 134 from the drain region of the semiconductor device to reduce gate-to-drain capacitance. A portion of the pedestal region may be removed to provide lateral separation between the gate electrode and the drain region. The lateral separation provides an additional reduction in the gate-to-drain capacitance. Decreasing the gate-to-drain capacitance of a semiconductor device increases its speed or frequency of operation.

As is discussed above, FET 262 is formed to have a channel region that has a uniform doping profile. FET 262 can be integrated with CMOS devices such as, PMOS transistor 264 and NMOS transistor 266, as well as with integrated passive devices such as integrated capacitor 284. FET 262 can be used for analog, higher power or higher frequency applications, and CMOS devices 264 and 266 can be used for digital applications. Thus, forming an integrated device, such as integrated circuit 10, can result in an integrated device that can integrate the functions of analog, higher power, higher frequency, and digital. Further, portions of higher voltage FET 262 can be formed simultaneously with portions of CMOS FETs 264 and 266 so that some of the materials and operations used to form CMOS FETs 264 and 266 can be used to form elements of higher voltage FET 262. For example, as is discussed above, the gates, gate oxides, doped regions (e.g., source, drain, and channel regions) of higher voltage FET 262 and CMOS FETs 264 and 266 can be formed simultaneously using the same materials and operations. In addition, portions of integrated capacitor 284 and portions of FET 262 can be formed simultaneously.

The use of isolation structures such as dielectric structures 76 and 78 provide for electrical isolation, so that a higher voltage device such as, for example, FET 262, can be integrated together with lower voltage devices such as, for example, FETs 264 and 266. Isolation structures 76 and 78 are relatively deep (e.g., greater than one micron, and up to 100 microns in some embodiments), subsurface structures that provide for isolation between FET 262 and FETs 264 and 266. In addition, an isolation structure such as dielectric structure 76 that has an effective dielectric constant of about two, enables the formation of higher quality integrated passive devices such as, for example, capacitor 284, since the use of a relatively deep dielectric structure 76 having a relatively lower dielectric constant reduces the parasitic capacitance between capacitor 284 and substrate 12. Both the increased separation of capacitor 284 from substrate 12 due to the presence of dielectric structure 76, and the relatively lower dielectric constant of dielectric structure 76, contribute to the formation of a higher quality integrated passive device such as capacitor 284.

Figure 43:
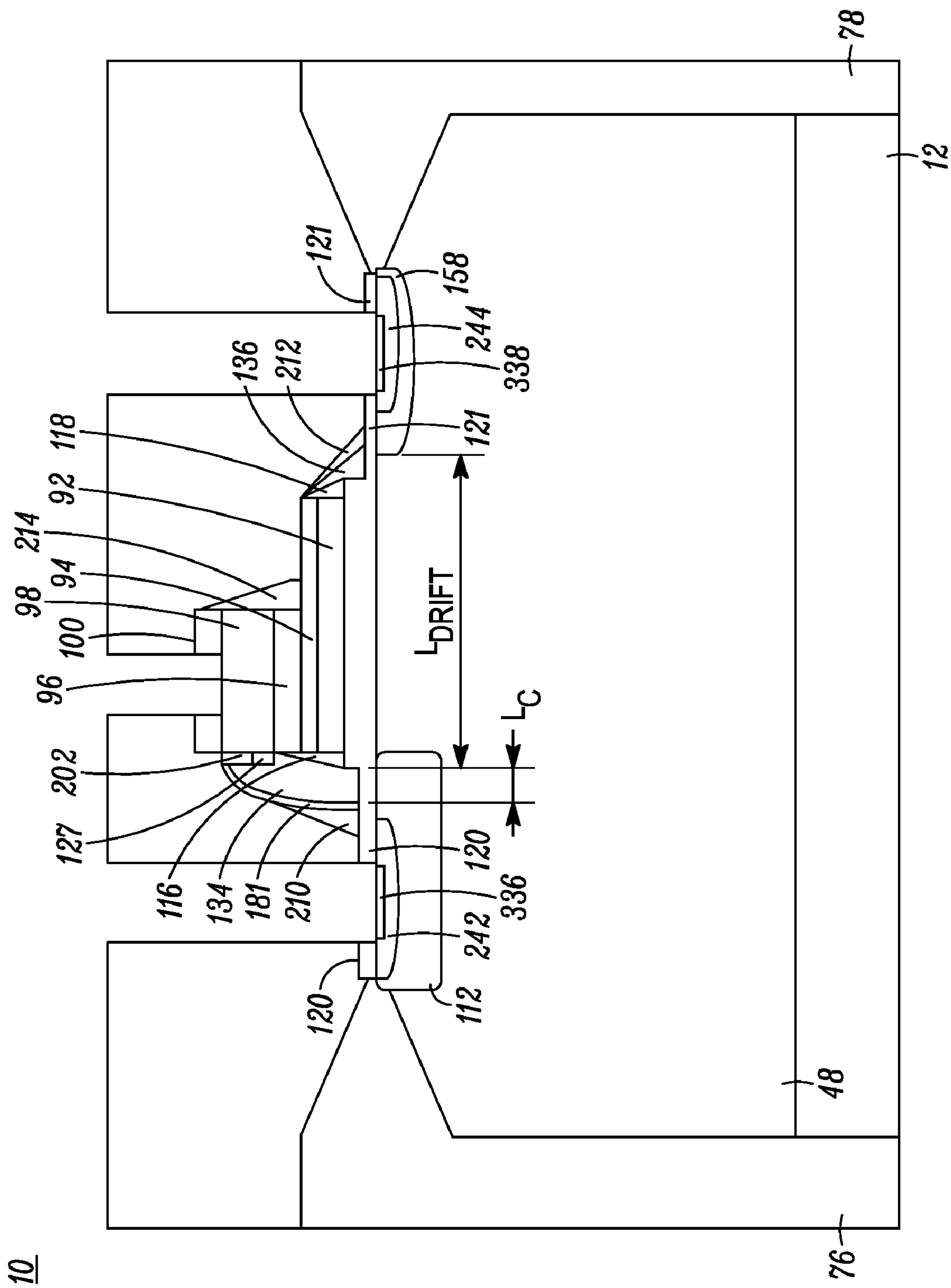
FIG. 43 is an enlarged cross-sectional view of a transistor of the integrated circuit of FIG. 42.

Briefly referring to FIG. 43, a cross-sectional view of lateral asymmetric higher voltage FET 262 is shown. FIG. 43 illustrates that the channel length, Lc, of semiconductor device 262 is set by the deposition thickness of gate electrode 134 rather than the lithographic limitations of the semiconductor lithography tools. Thus, the channel length can be reliably and repeatably controlled without using lithographic techniques. Additionally, the channel length of lateral higher voltage FET 262 is relatively smaller than that of a laterally diffused metal oxide semiconductor ("LDMOS") device type structure, which results in a faster semiconductor device that occupies less area than an LDMOS device. The relatively higher frequency of operation of FET 262 is achieved at least in part since the relatively shorter channel length results in a relatively smaller amount of charge that is modulated during operation. In addition, the length of the drift region, $L_{DRIFT}$, can be reliably controlled by the width of the pedestal structure. Thus, the on-resistance ("$R_{DSON}$") of transistor 262 is lower than that for an LDMOS device, since the channel length is relatively smaller than an LDMOS device, which has a channel length that is dependant on the lithographic limitations of the lithography equipment used to form the gate of the LDMOS device. The channel length of the HV lateral FET 262 is a function of the gate length of the gate electrode 134 of FET 262 which is substantially equal to the deposition thickness of the material used to form the gate 134 of FET 262 and is not dependent on lithographic dimensions. Referring briefly back to FIG. 42, in some embodiments, the gate length of gate electrode 134 of FET 262 is less than the gate length of gate electrode 144 of FET 264 and less than the gate length of gate electrode 146 of FET 266.

Figure 44:
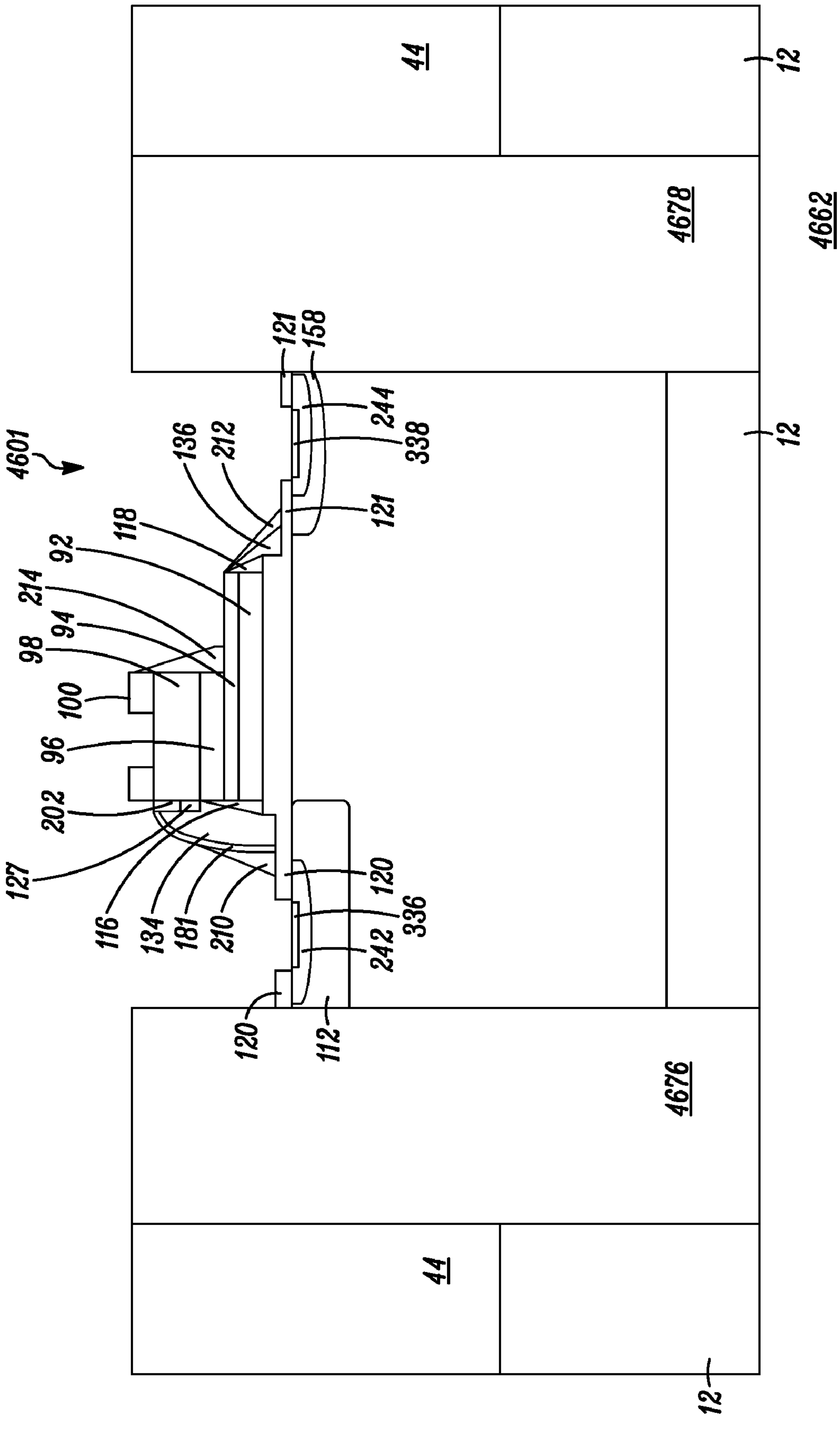
FIG. 44 is a cross-sectional view of another transistor in accordance with an embodiment.

Briefly referring to FIG. 44, a cross-sectional view of lateral asymmetric higher voltage semiconductor device 4662 is shown. Semiconductor device 4662 can be similar to semiconductor device 262 (FIG. 42), except that semiconductor device 4662 is located within a recess 4601 formed in a top surface of substrate 12. Isolation structures 4676 and 4678 can be similar to isolation structures 76 and 78, respectively (FIG. 42). In one embodiment, CMOS devices can be located in a different region of substrate 12 and are not located in recess 4601. The use of recess 4601 can improve the planarity of the wafer. The use of recess 4601 can also improve the planarization process described with reference to FIG. 33 because the pedestal structure 104 is higher than portions 144 and 146 (FIG. 21), which serve as gate electrodes for the CMOS devices.

FIGS. 45 to 48 illustrate another embodiment of dielectric structures 676 and 678 (FIG. 48) that may be used in place of isolation structures 76 and 78 (FIGS. 13-43). Dielectric structures 676 and 678 may be referred to as air-gap dielectric structures that include voids.

Figure 45:
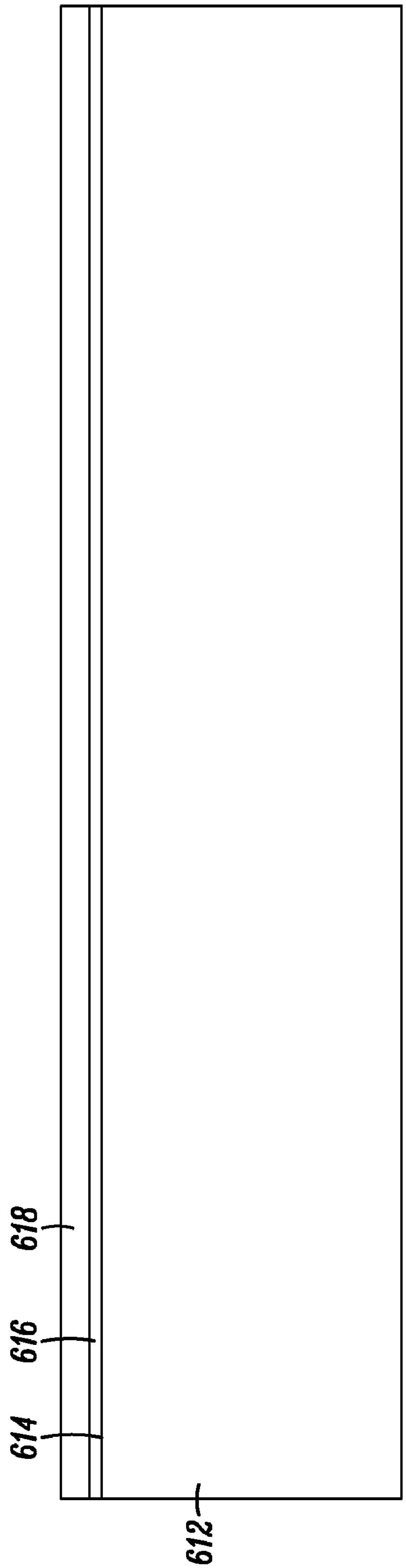
FIG. 45 is a cross-sectional view of another structure in accordance with an embodiment.

Referring to FIG. 45, a substrate 612 having a surface 614 comprises silicon doped with an impurity material of P-type conductivity such as, for example, boron. By way of example, the conductivity of substrate 612 ranges from about 5 ohm-centimeters (Ω-cm) to about 20 Ω-cm, although the methods and apparatuses described herein are not limited in this regard.

A layer of dielectric material 616 is formed over surface 614, and a layer of dielectric material 618 is formed over dielectric layer 616. In accordance with one embodiment, dielectric material 616 comprises a thermally grown oxide having a thickness ranging from about 50 Angstroms (Å) to about 800 Å, and dielectric material 618 comprises silicon nitride ($Si_3N_4$) having a thickness ranging from about 100 Å to about 2,500 Å. Oxide layer 616 may also be referred to as a buffer oxide layer. Silicon nitride layer 618 can be formed using Chemical Vapor Deposition ("CVD") techniques such as, for example, Lower Pressure Chemical Vapor Deposition ("LPCVD") or Plasma Enhanced Chemical Vapor Deposition ("PECVD").

Figure 46:
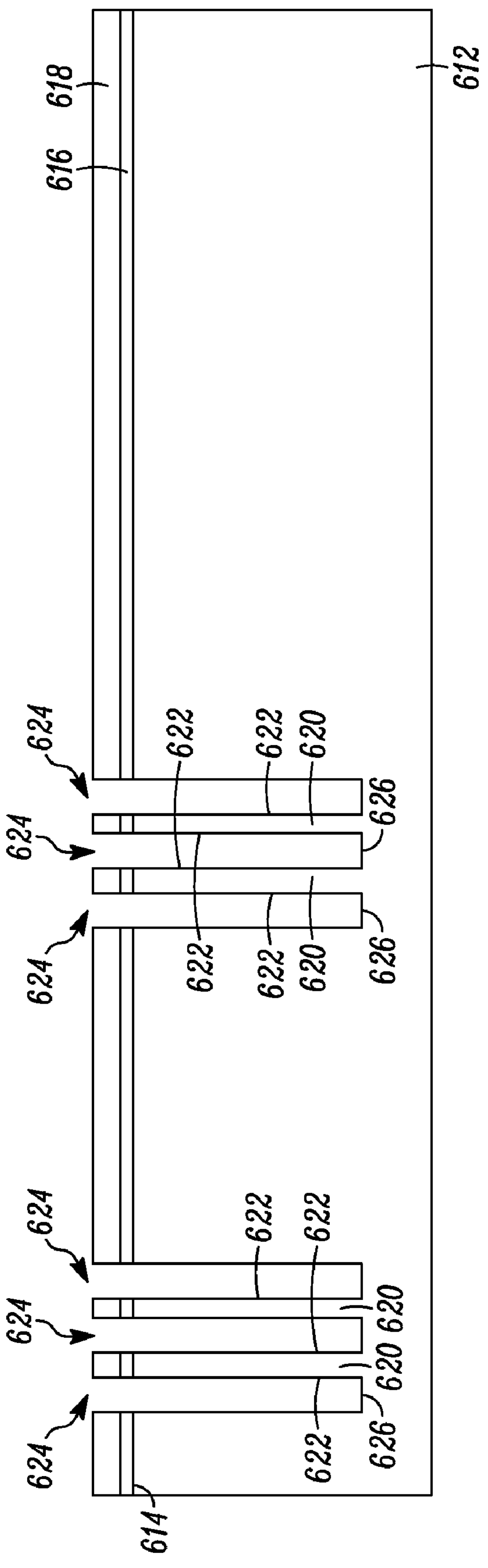
FIG. 46 is a cross-sectional view of the structure of FIG. 45 at a later stage of manufacture.

FIG. 46 is a cross-sectional side view of the structure of FIG. 45 at a later stage of manufacture. A layer of photoresist (not shown) can be formed on silicon nitride layer 618. This layer of photoresist can be patterned to form a mask (not shown) having openings (not shown) that may be used to form trenches or openings 624 by exposing portions of silicon nitride layer 618. Openings 624 having floors 626 extends from surface 614 into substrate 612. The exposed portions of silicon nitride layer 618 and the portions of silicon dioxide layer 616 and substrate 612 that are below the exposed portions of silicon nitride layer 618 are removed by, for example, etching, to form a plurality of structures 620 having sidewalls 622. In other words, the etch forms openings 624 that have floors 626 from which structures 620 extend. Structures 620 extend from floor 626 to surface 614. Structures 620 may be pillars, columns, or walls and are also referred to as protrusions, projections, or vertical structures. Although structures 620 are described and shown as pillars, the methods and apparatuses described herein are not limited in this regard. Although not shown, as mentioned above, in other embodiments, pillars 620 may be walls such as, for example, elongated walls. Openings 624 are also referred to as a trenches, cavities, voids, gaps, air gaps, empty regions, or empty space.

Trenches 624 may have a depth ranging from about one micron to about 100 microns. Trenches 624 may have a width ranging from about 0.5 microns to about 1.5 microns. The width of pillars 620 may range from about 0.5 microns to about 1.5 angstroms.

In some embodiments, trenches 624 may be formed using at least one etch operation to remove portions of layers 616 and 618, and substrate 612. In other embodiments, two or three etching operations may be used to form trenches 624. For example, one etch operation may be used to remove portions of layers 616 and 618 and another etch operation may be used to remove portions of substrate 612. As another example, three etch operations may be used to remove portions of layer 618, layer 616, and substrate 612.

Silicon nitride layer 618 may be etched using a wet chemical etch or a dry etch process such as, for example, a reactive ion etch (RIE). Silicon dioxide layer 616 may be etched using a wet chemical etch or a dry etch process such as, for example, a reactive ion etch (RIE). A portion of substrate 612 may next be removed using an anisotropic etch process such as, for example, reactive ion etching (RIE). The photoresist mask (not shown) used to form trenches 624 is stripped or removed after the removal of portions of 612, 616, and 618.

Figure 47:
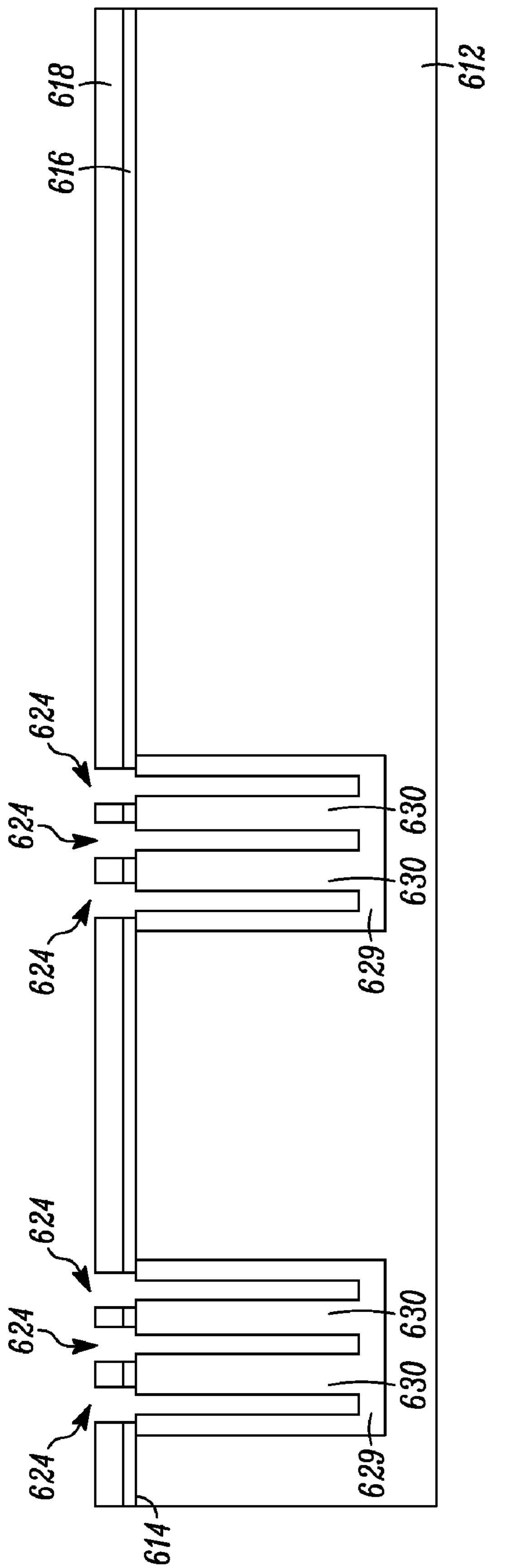
FIG. 47 is a cross-sectional view of the structure of FIG. 46 at a later stage of manufacture.

FIG. 47 is a cross-sectional view of the semiconductor structure of FIG. 46 at a later stage of manufacture. A thermal oxidation process is performed so that the exposed silicon of the structure of FIG. 46 is converted to silicon dioxide, thereby forming a silicon dioxide layer or region 629 which includes silicon dioxide structures 630. In particular, the silicon of silicon pillars 620 (FIG. 46) may be partially, or in the embodiment illustrated in FIG. 47, completely converted to silicon dioxide to form silicon dioxide structures 630. In other words, the silicon between the sidewalls 622 (FIG. 46) of structures 620 (FIG. 46) may be substantially converted to silicon dioxide in some embodiments. In addition, as shown in FIG. 47, during the thermal oxidation process, the bottom of trench 624, that is floor 626 (FIG. 46), is also converted to silicon dioxide to form the lower portion of region 629. Since the dielectric constant of silicon is greater than the dielectric constant of silicon dioxide, reducing the amount of silicon in structures 630 will reduce the effective dielectric constant of dielectric structures 676 and 678.

About 2.2 units of silicon dioxide is formed from about one unit of silicon during thermal oxidation. In other words, about 2.2 Angstroms of thermal oxide may be formed from about one Angstrom of silicon. As a result, the formation of silicon dioxide during the thermal oxidation process illustrated with reference to FIG. 47 has the effect of decreasing the spacing between structures 620 (FIG. 46) during the thermal oxidation process. Thus, the spacing between the resulting silicon dioxide structures 630 is less than the spacing between silicon structures 620 (FIG. 46). In some embodiments, the width of trenches 624 after the thermal oxidation process ranges from about 0.25 microns to about 1.3 microns and the width or diameter of silicon dioxide structures 630 ranges from about 0.6 microns to about 2 microns Although the thickness or the amount of the silicon dioxide of structures 70 is limited after all of the silicon of structures 70 is consumed during the thermal oxidation process, the thermal oxidation process may continue longer to increase the thickness of the silicon dioxide at the lateral and lower boundaries of dielectric region 629. In other words, the oxidation process may continue longer to increase the amount of silicon dioxide at the bottom of trenches 624 and along the lateral perimeter of trenches 624.

Figure 48:
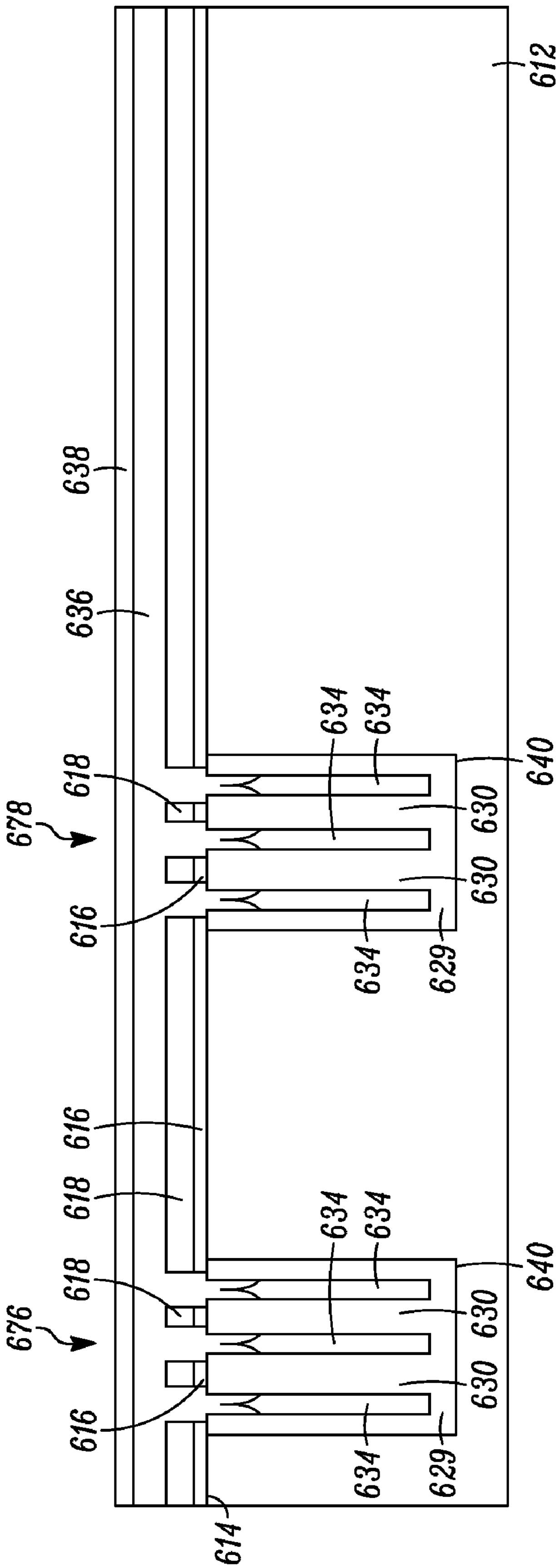
FIG. 48 is a cross-sectional view of the structure of FIG. 47 at a later stage of manufacture.

Referring now to FIG. 48, a capping structure 636 is formed over the structure shown in FIG. 47. In some embodiments of the claimed subject matter, trenches 624 (FIG. 47) may be enclosed or capped and also may be hermetically sealed to prevent any contamination from undesirable particles, gasses or moisture that may propagate into, or get trapped in trenches 624 (FIG. 47). When capped, is the trenches are identified by reference number 634 and may be referred to as a sealed trench, a sealed cavity, a sealed gap, a sealed void, a closed cell, or a closed cell void.

Capping structure 636 can be a non-conformal material formed over dielectric structures 630 and over and in a portion of trenches 624 (FIG. 47) and seals trenches 624 (FIG. 47) to form sealed trenches 634. Capping structure 636 may also referred to as a capping layer, and may comprise, for example, silicon dioxide (SiO2), and have a thickness ranging from about 1000 Angstroms (Å) to about 4 microns (μm). In some embodiments, if the openings between the upper portions of dielectric region 629 are relatively small, capping structure 636 may enter into a portion of trenches 634 or a region between the upper portions of adjacent structures 630, but not fill trenches 634 due in part to the relatively small size of the openings between the upper portions of dielectric region 629.

In some embodiments, capping structure 636 may comprise silicon dioxide and may be formed by lower temperature chemical vapor deposition (CVD). In other embodiments, capping structure 636 may be silicon nitride, silicon oxide, phosphorus silicate glass (PSG), boron phosphorus silicate glass (BPSG), an oxide formed using tetraethylorthosilicate (TEOS), or the like. During formation of capping structure 636, the material of capping structure 636 may enter the portions of trenches 624 (FIG. 47), that is the material of capping structure 636 may enter between the upper portions of adjacent structures 630, but not fill trenches 634 due in part to the relatively small size of the openings between the upper portions of structures 630, thereby forming capped or sealed trenches 634. Capping structure 636 can be planarized using, for example, a Chemical Mechanical Planarization ("CMP") technique. In an alternate embodiment, the material of capping structure 636 may substantially or completely fill trenches 624 (FIG. 47).

An optional sealing layer 638 such as, for example, silicon nitride ($Si_3N_4$), may be formed over dielectric layer 636 to hermetically seal trenches 634. In other words, in embodiments where capping layer 636 is a silicon dioxide layer, the optional conformal silicon nitride layer 638 may prevent diffusion through and/or fill in any openings or cracks in the silicon dioxide capping layer 636, and in general prevent the propagation of gases or moisture into trenches 634 through capping layer 636. Silicon nitride layer 638 may be formed using a lower pressure chemical vapor deposition (LPCVD) and may have a thickness of ranging from about 100 Angstroms to about 2000 Angstroms. In one embodiment, the thickness of silicon nitride layer 638 is about 500 Angstroms. A partial vacuum may be formed in sealed trenches 634 as part of the LPCVD process. If optional sealing layer 638 is used, the CMP is performed prior to the formation of optional sealing layer 638 since the CMP may completely remove the relatively thin sealing layer 638.

Accordingly, the capping or sealing of trenches 634 may be accomplished by forming a non-conformal material followed by a conformal material. In this example, the non-conformal layer such as, for example, layer 636, may enter into a portion of trenches 634 or a region between the upper portions of dielectric region 629, but not fill trenches 634 due in part to the relatively small size of the openings between the upper portions of dielectric region 639 and since layer 636 is a non-conformal layer. Then a conformal material such as, for example, layer 638, may be formed on layer 636.

In some embodiments, trenches 634 are evacuated to a pressure less than atmospheric pressure. In other words, the pressure in sealed trenches 634 is below atmospheric pressure. As an example, the pressure in cavity 64A may range from approximately 0.1 Torr to approximately 10 Torr. The type of substance or material within cavity 64A is not a limitation of the claimed subject matter. For example, cavity 64A may contain a gas, a fluid, or a solid matter.

Although a multiple trenches 634 are described with reference to FIG. 48, the methods and apparatuses described herein are not limited in this regard. In other embodiments, substrate 612 may be etched in such as way as to form a single trench or so that dielectric structures 676 and 678 has greater or fewer trenches than are shown in FIG. 48. In some embodiments, structures 630 may be walls or partitions so that trenches 634 can be are physically isolated from each other. The multiple trenches may be laterally bounded by dielectric walls, dielectric partitions, or the like. In embodiments in which multiple trenches 634 are formed in dielectric structures 676 and 678, dielectric structures 676 and 678 have a closed-cell configuration in that the trenches 634 of dielectric structures 676 and 678 may be physically isolated from each other by, for example, the dielectric walls. Accordingly, if capping structure 636 or isolated dielectric structures 630 experience a rupture or fracture, this rupture or fracture is contained in a limited area so that any contamination external to dielectric structures 676 and 678 that propagates into cavities 634 through the rupture or fracture may be contained in a limited area of dielectric structures 676 and 678 due to the physical isolation of the multiple trenches from each other. For example, a closed cell configuration would prevent a fracture or rupture from introducing ambient gas into all of the multiple cavities of dielectric structures 676 and 678.

In some embodiments, the formation of dielectric structures 676 and 678 may be formed in the beginning of the fabrication of integrated circuit 10. In other words, dielectric structures 676 and 678 may be formed prior to the formation of any of the other components or elements of integrated circuit 10 such as, for example, before the formation of actives devices 262 (FIG. 37), 264 (FIG. 37), or 266 (FIG. 37) or the formation of passive device 284 (FIG. 37). In the embodiments where actives devices 262 (FIG. 37), 264 (FIG. 37), or 266 (FIG. 37) and passive device 284 (FIG. 37) are formed after dielectric structures 676 and 678, the structure shown in FIG. 48 can be used as the starting substrate for integrated circuit 10 so that the process flow discussed above that begins with the description of FIG. 1 could start with the structure shown in FIG. 48 that includes dielectric structures 676 and 678. If the process flow discussed above for forming integrated circuit 10 is modified to use dielectric structures 676 and 678 instead of isolation structures 76 and 78, then the process steps for forming isolation structures 76 and 78 may be omitted.

One advantage of forming dielectric structures 676 and 678 prior to forming actives devices 262 (FIG. 37), 264 (FIG. 37), or 266 (FIG. 37) may be that the thermal processes used to form dielectric structures 676 and 678 will not affect the elements of active devices 262 (FIG. 37), 264 (FIG. 37), or 266 (FIG. 37). Accordingly, any thermally sensitive elements of active devices 262 (FIG. 37), 264 (FIG. 37), or 266 (FIG. 37) will not be subjected to the thermal processes used to form dielectric structures 676 and 678.

Dielectric structures 676 and 678 may also be referred to as dielectric structures, dielectric regions, dielectric platforms, isolation regions, or isolation structures. Dielectric structures 676 and 678 may be two separate dielectric structures, or in other embodiments, structures 676 and 678 can be parts of a single isolation structure having that may be formed surrounding a portion of substrate 612. This may be desirable to isolate a portion of substrate 612 from another portion of substrate 612 using dielectric structures 676 and 678.

Although dielectric structures 676 and 678 are described as having one or more sealed trenches 634, the methods and apparatuses described herein are not limited in this regard. For example, in alternate embodiments, trenches 624 (FIG. 47) could be filled with a material, such as, for example, a material comprising an oxide, nitride, or silicon if so desired, to form a solid or filled dielectric platform such as, for example, dielectric structures 76 and 78 (FIG. 13) that are devoid of any voids or cavities. Such a solid or filled dielectric platform would have a relatively higher dielectric constant compared to an "air-gap" dielectric structure such as dielectric structures 676 and 678 since the material used to fill trenches 624 (FIG. 47) would have a higher dielectric constant compared to empty space. Examples of materials that may be used to fill, or backfill, trenches 624 (FIG. 47) may include silicon nitride, polycrystalline silicon, or an oxide material formed using, for example, a hot wall TEOS process.

After the formation of sealing layer 638, portions of layers 636, 638, 616, and 618 can be removed to prepare for the formation of active devices and/or passive devices using the semiconductor structure shown in FIG. 48. As is discussed above, active and passive semiconductor devices, or portions thereof, may be formed in or from the portions of substrate 612 adjacent dielectric structures 676 and 678, including on or over dielectric structures 676 and 678. For example, passive device 284 (FIG. 37) can be formed on dielectric structure 676 and active devices 262 (FIG. 37), 264 (FIG. 37), and 266 (FIG. 37) can be formed adjacent to dielectric structures 676 and 678.

Accordingly, as is discussed above, dielectric structures 676 and 678 comprise dielectric regions 629, trenches 634, and portions of dielectric layers 636, 638, 616, and 618. In some embodiments, the depth or thickness of dielectric structures 676 and 678 may range from about one μm to about 100 μm and the width of dielectric platform 18 may be at least about 3 μm or greater. The depth or thickness of dielectric structures 676 and 678 may be measured from top surface 614 of substrate 612 to a lower boundary or surface 640 of dielectric regions 629. In some embodiments, lower surface 640 of structures 676 and 678 is parallel to, or substantially parallel to surface 614 of substrate 612. In some embodiments, lower surface 640 of each of dielectric structures 676 and 678 is at a distance of at least about one micron or greater below surface 614 and the width of each of dielectric structures 676 and 678 is at least about three microns or greater. In other embodiments, lower surface 640 of each of dielectric structures 676 and 678 is at a distance of at least about three microns or greater below surface 614 and the width of dielectric structures 676 and 678 is at least about five microns or greater. In one example, the thickness of each of dielectric structures 676 and 678 may be about 10 μm and the width of each of dielectric structures 676 and 678 may be about 10 μm. In yet other embodiments, it may be desirable that the thickness of each of the dielectric structures 676 and 678 be equal to, or approximately equal to, the thickness of semiconductor substrate 612, for example, the thickness of the semiconductor die and the width of each of dielectric structures 676 and 678 may be up to about 100 μm. The thickness and width of dielectric structures 676 and 678 may be varied depending on the application for dielectric platform 18 and the desired die size of the resulting semiconductor devices that use semiconductor substrate 612. For example, a relatively thicker dielectric structure may be desired in applications where dielectric structures 676 and 678 are used to form higher Q passive devices compared to an application where dielectric structures 676 and 678 are used for electrical and physical isolation.

In some embodiments, the height of structures 630 is equal to, or approximately equal to, the height of the portion of dielectric region 629 that is below surface 614 of substrate 612. For example, if lower surface 640 of dielectric region 629 is about three microns below surface 614, then dielectric structures 630 have a height of about three microns or greater. In other words, if lower surface 640 of dielectric region 629 is at least about three microns or greater from upper surface 614 of substrate 612, then dielectric structures 630 extend a distance of at least about three microns or greater from lower surface 640 of dielectric region 629. In one example, lower surface 640 extends to a distance of about one micron from upper surface 614 of substrate 612 and dielectric structures 630 have a height of about one micron. Although the dielectric structures 630 are illustrated as having a height that is approximately equal to the depth or thickness of dielectric region 629, this is not a limitation of the claimed subject matter. In other embodiments, the height of a dielectric structure 630 may be greater than, or less than, the thickness of dielectric region 629. For example, dielectric region 629 may extend a distance of at least about ten microns below surface 614 and dielectric structures 630 may extend a distance of about seven microns from lower surface 629.

The combination of dielectric material 629 and trenches 634 reduces the overall permittivity of the dielectric structures 676 and 678 so that dielectric structures 676 and 678 have a relatively lower dielectric constant. In other words, sealed trenches 634 and dielectric material 629 together reduce the dielectric constant of dielectric structures 676 and 678. To minimize the dielectric constant of structures 676 and 678, it is desirable to increase the depth of dielectric structures 676 and 678, increase the volume of sealed trenches 634 and reduce the extent of semiconductor material 110 contained in structures 630. In some embodiments, a dielectric constant of at least about 1.5 or lower may be achieved by increasing the volume of trenches 634. The dielectric constant of dielectric structures 676 and 678 is reduced compared to, for example, what would be provided by a dielectric structure that has no cavities or voids. The dielectric constant of dielectric structures 676 and 678 may also be reduced by increasing the volume of dielectric material in structure 630. Since empty space has the lowest dielectric constant (the dielectric constant of empty space is 1), the more empty space or void space incorporated into dielectric structures 676 and 678, the lower the overall dielectric constant of structures 676 and 678. Accordingly, increasing the volume of sealed cavities 634 relative to the volume of structures 630 is more effective in decreasing the dielectric constant of dielectric structures 676 and 678 compared to increasing the volume of dielectric material in structures 630.

Additionally, less stress is induced in substrate 612 by dielectric structures 676 and 678 compared to a solid or filled dielectric structure, because dielectric structures 676 and 678 includes substantial volumes that are not occupied by solids having coefficients of thermal expansion that differ from that of substrate 612. A solid or filled dielectric structure (not shown) that includes, for example, an oxide material with no voids may generate stress in an adjacent silicon region during heating and cooling of the dielectric structure and the silicon region due to the coefficient of thermal expansion (GTE) mismatch of silicon and oxide. The stress on the silicon lattice may lead to defects or dislocations in the silicon region. The dislocations may lead to undesirable excessive leakage currents in active devices formed in the active region, and therefore, forming a dielectric structure such as dielectric structures 676 and 678 which has trenches 634, can reduce or prevent the formation of dislocations in the adjacent active regions, since trenches 634 can provide relief for the stress. Furthermore, less stress is generated in the formation of dielectric structures 676 and 678 compared to a solid or substantially solid dielectric structure in which the solid or substantially solid regions are formed by oxidation because, for example, in silicon, oxidation is accompanied by a 2.2× volume increase.

Silicon dioxide has a dielectric constant of about 3.9. Accordingly, a solid or filled dielectric structure that includes no voids and includes silicon dioxide may have a dielectric constant of about 3.9. As is discussed above, since empty space has the lowest dielectric constant (the dielectric constant of empty space is 1), the more empty space or void space incorporated into the dielectric platform, the lower the overall dielectric constant.

Passive elements formed over dielectric structures 676 and 678 have reduced parasitic capacitances to the substrate 612. The parasitic substrate capacitance is reduced by both the reduced effective dielectric constant of dielectric structures 676 and 678 and the increased thickness of dielectric structures 676 and 678.

In addition, dielectric platform 18 may be used to increase the frequency of operation of any devices formed using the semiconductor structure shown in FIG. 48. For example, passive components such as, for example, inductors, capacitors, or electrical interconnects, may be formed over the embedded dielectric structures 676 and 678 and may have reduced parasitic capacitive coupling between these passive components and semiconductor substrate 612 since the embedded dielectric structures 676 and 678 have a relatively lower dielectric constant or permittivity and since embedded dielectric structures 676 and 678 increase the distance between the passive components and the conductive substrate. Reducing parasitic substrate capacitances may increase the frequency of operation of any devices formed using dielectric structures 676 and 678. As an example, the passive component may comprise electrically conductive material, such as, for example, aluminum, copper, or doped polycrystalline silicon. In various examples, the passive component may be an inductor, a capacitor, a resistor, or an electrical interconnect and may be coupled to one or more active devices formed in the active regions.

Since at least a portion of dielectric structures 676 and 678 are formed in and below the surface of the silicon substrate, dielectric structures 676 and 678 may be referred to as an embedded dielectric structure. Embedded may mean that at least a portion of dielectric structures 676 and 678 is below a plane (not shown) that is coplanar to, or substantially coplanar to, top surface 614 of substrate 612. In some embodiments, the portion of dielectric structures 676 and 678 below the plane extends from the plane to a depth of at least about three micron or greater below the plane and the portion of dielectric structures 676 and 678 below the plane has a width of at least about five microns or greater. In other words, a least a portion of dielectric structures 676 and 678 is embedded in substrate 612 and extends a distance of at least about three microns or greater from upper surface 614 toward the bottom surface of substrate 612 and the portion of dielectric structures 676 and 678 embedded in substrate 612 has a width of at least about five microns or greater in some embodiments.

Further, dielectric structures 676 and 678 may be used to form relatively higher quality passive devices such as, for example, capacitors and inductors having a relatively higher Q since dielectric structures 676 and 678 have relatively lower dielectric constants had and may be used to isolate and separate the passive devices from the substrate. Active devices, such as transistors or diodes, may be formed in regions adjacent to, or abutting, dielectric structures 676 and 678, and these active devices may be coupled to passive components such as spiral inductors, interconnects, microstrip transmission lines and the like that are formed on planar upper surfaces of dielectric structures 676 and 678. Increasing the distance between the passive components and silicon substrate 612 allows higher Qs to be realized for these passive components.

Dielectric structures 676 and 678 may be used to provide electrical isolation. For example, dielectric structures 676 and 678 may be used to electrically isolate active regions from each other, which may also result in electrical isolation between any active devices formed in the isolated active regions.

Figure 49:
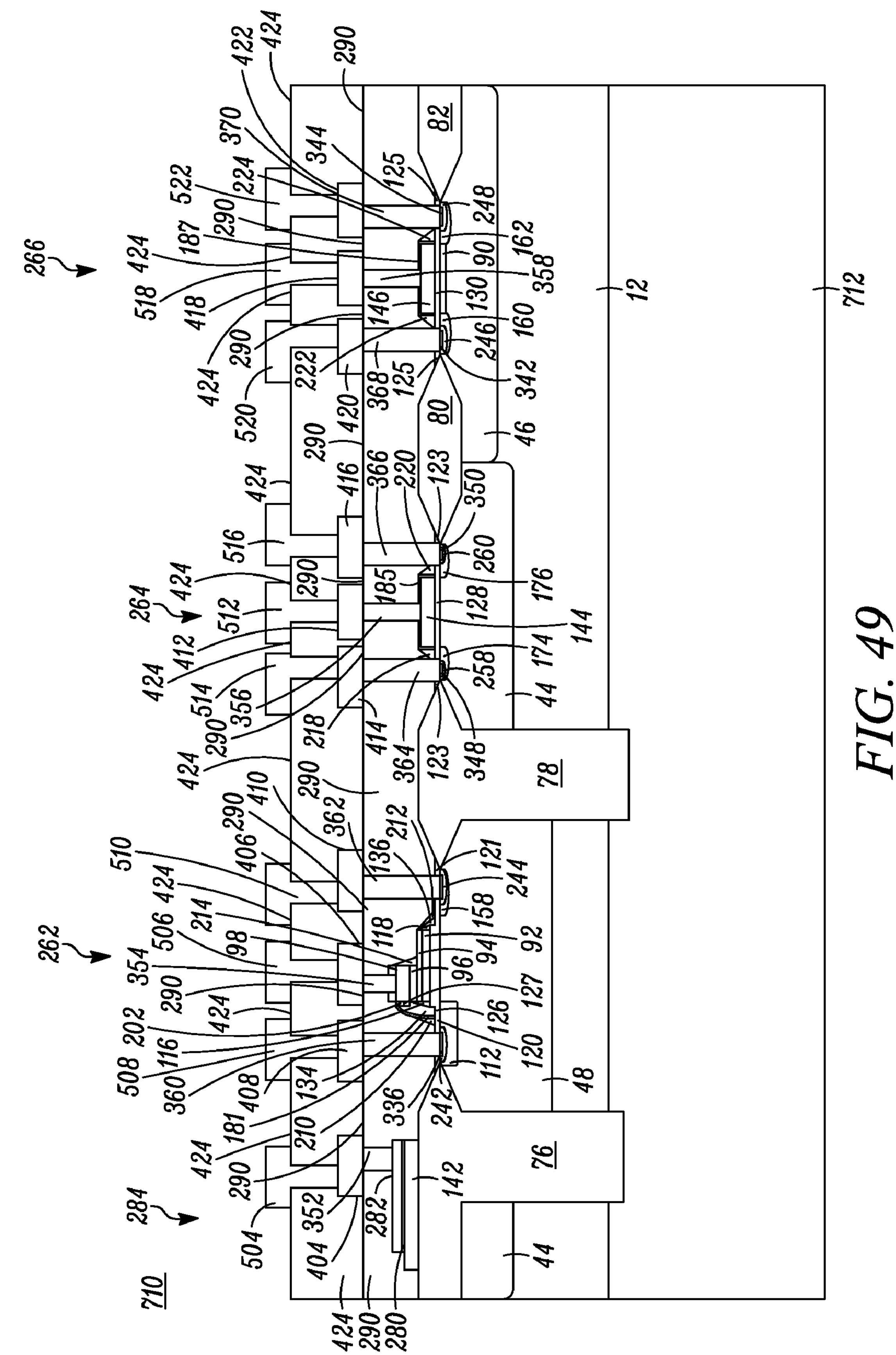
FIG. 49 is a cross-sectional view of another integrated circuit in accordance with an embodiment.

FIG. 49 is a cross-sectional view of another embodiment of an integrated circuit 710. Integrated circuit 710 is similar to integrated circuit 10 (FIG. 41) described above except that in this embodiment, integrated circuit 710 is formed using a heavily doped P-type substrate 712. For example, substrate 712 comprises silicon doped with an impurity material of P-type conductivity such as, for example, boron. The conductivity of substrate 712 ranges from about 0.001 Ω-cm to about 0.005 Ω-cm, although the methods and apparatuses described herein are not limited in this regard. In addition, dielectric structures 76 and 78 are formed to extend on or into substrate 710.

Forming integrated circuit 710 in this manner may provide better electrical isolation between higher voltage FET 262 and CMOS FETs 264 and 266. In integrated circuit 10 any injection current into the substrate can be better eliminated through recombination using a heavily doped substrate. For example, minority carriers may be injected from N-well 48 into substrates 12 and 712. The heavily doped substrate 712 will have better recombination of the minority carriers and can absorb the minority carriers to eliminate the substrate current. The substrate currents can cause noise which can adversely affect performance of the active devices of integrated circuit 710. Accordingly, in some applications, it may be desirable to use a heavily doped substrate such as substrate 712 in combination with dielectric structures 76 and 78 extending on or into substrate 712 to provide electrical isolation between FET 262 and FETs 264 and 266.

Figure 50:
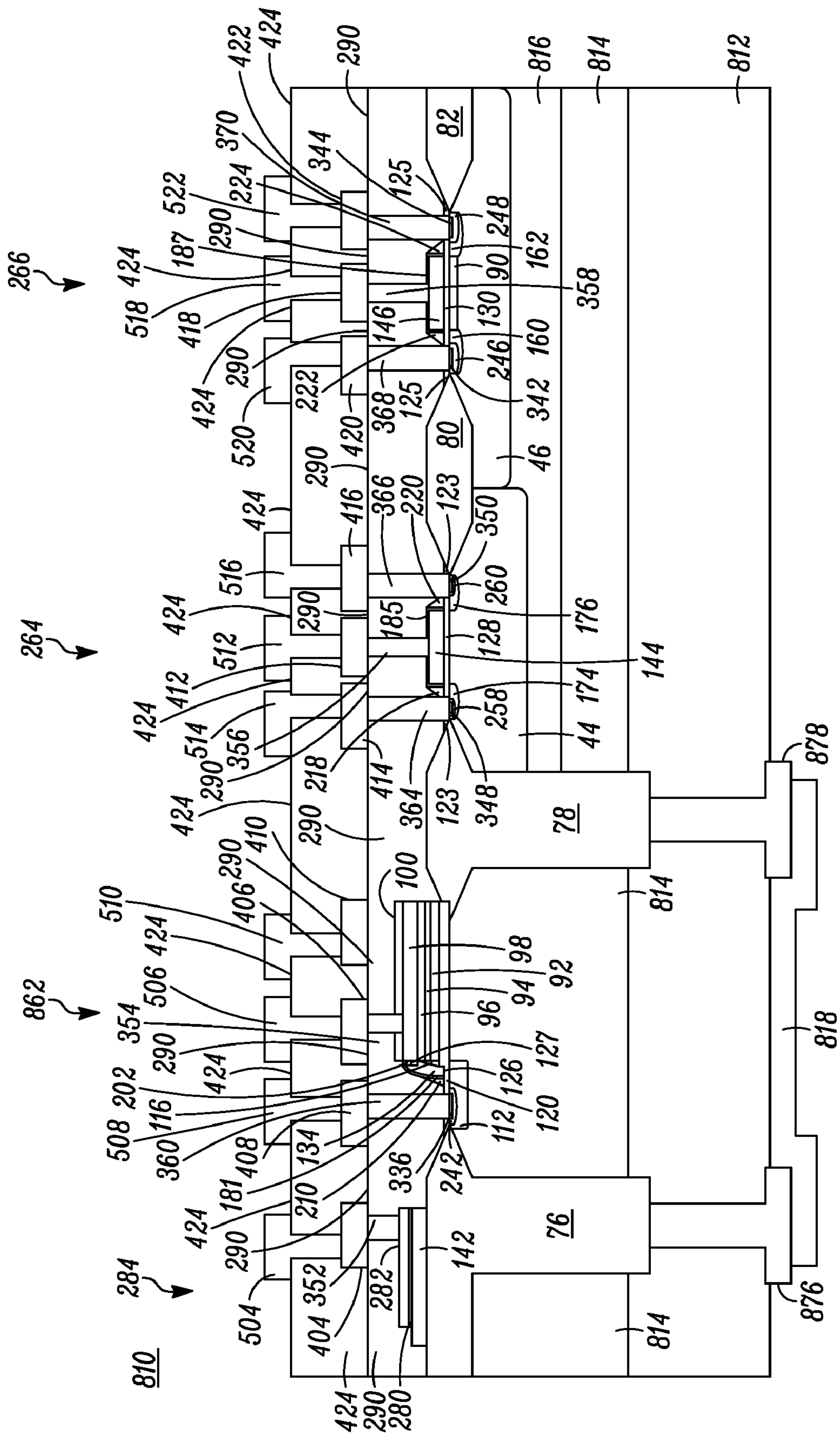
FIG. 50 is a cross-sectional view of another integrated circuit in accordance with an embodiment.

FIG. 50 is a cross-sectional view of another embodiment of an integrated circuit 810. Integrated circuit 810 is similar to integrated circuits 10 (FIG. 41) and 710 (FIG. 49) described above except that in this embodiment, integrated circuit 810 is formed using a heavily doped N-type substrate 812, an N-type epitaxial layer 814, a P-type epitaxial layer 816, and isolation structures 876 and 878. In addition, integrated circuit 810 comprises a higher voltage vertical FET 862 and includes a conductive material 818.

In some embodiments, substrate 812 comprises silicon doped with an impurity material of N-type conductivity such as, for example, phosphorous. The conductivity of substrate 812 ranges from about 0.001 Ω-cm to about 0.005 Ω-cm, although the methods and apparatuses described herein are not limited in this regard.

An N-type epitaxial layer 814 can be grown on substrate 812. Epitaxial layer 814 can be doped with an impurity material of N-type conductivity such as, for example, phosphorous, during the formation or growth of epitaxial layer 814. The conductivity of N-type epitaxial layer 814 can range from about one Ω-cm to about two Ω-cm although the methods and apparatuses described herein are not limited in this regard. The conductivity of epitaxial layer 814 may be varied and based on the type of active devices to be formed using epitaxial layer 814. In the embodiment illustrated in FIG. 50, a higher voltage vertical FET 862 is formed using epitaxial layer 814.

After the formation of N-type epitaxial layer 814, a region of N-type epitaxial layer 814 can be removed and then a P-type epitaxial layer 816 can be formed in the region of N-type epitaxial layer 814 that was removed. In other words, a recess etch can be performed to remove a portion of N-type epitaxial layer 814, and in place of the removed portion of N-type epitaxial layer 814, a P-type epitaxial layer can be grown in the recessed region. P-type epitaxial layer 816 can be doped with an impurity material of P-type conductivity such as, for example, boron, during the formation or growth of epitaxial layer 816. The conductivity of P-type epitaxial layer 816 can range from about 5 Ω-cm to about 20 Ω-cm, although the methods and apparatuses described herein are not limited in this regard. The conductivity of epitaxial layer 816 may be varied and based on the type of active devices to be formed using epitaxial layer 816. In the embodiment illustrated in FIG. 50, lower voltage CMOS FETs 264 and 266 are formed using epitaxial layer 816.

After the formation of P-type epitaxial layer 816, a CMP process may be used to planarize the upper surfaces of layers 814 and 816 so that the upper surfaces of layers 814 and 816 are flush or coplanar with each other.

After the CMP process, isolation structures 76, 78, 80, and 82, active devices 862, 264, and 266 and passive device 284 can be formed using the same or similar processes as described above. There may be some interface defects between P-type epitaxial layer 816 and N-type epitaxial layer 814 after the formation of P-type epitaxial layer 816. Isolation structure 78 may be formed at the vertical interface of epitaxial layers 814 and 816.

Higher voltage vertical FET 862 may be formed using portions of substrate 812 and epitaxial layer 814 that are between isolation structures 76, 78, 876 and 878. FETs 264 and 266 can be formed using epitaxial layer 816.

Vertical FET 262 has a spacer gate 134, a gate oxide 126, and a source region 242. A portion of doped region 112 under gate 134 can serve as the channel region for vertical FET 862 and portions of epitaxial layer 814 and substrate 812 can serve as the drain region of vertical FET 862. In addition, conductive material 360 can serve as the source electrode for vertical FET 862 and conductive material 818 can serve as the drain electrode for vertical FET 862. In addition, vertical FET 862 includes faraday shield layer 94, which can be used to reduce gate-to-drain parasitic capacitance. Electrically conductive shield layer 94 can be electrically coupled to ground and/or to source region 242 and at least a portion of conductive layer 94 can be formed between at least a portion of gate interconnect 98 and at least a portion of epitaxial layer 814, and this configuration can reduce parasitic capacitive coupling between gate interconnect 98 and epitaxial layer 814, thereby reducing gate-to-drain capacitance in vertical FET 862. Reducing gate-to-drain capacitance in vertical FET 862 can increase the operating frequency of vertical FET 862.

FET 862 may be referred to as vertical FET since during operation, the electrical current flow from source electrode 360 to drain electrode 818 in the vertical FET 862 is substantially perpendicular to the upper and lower surfaces of epitaxial layer 814. In other words, current flows essentially vertically through vertical FET 862 from source electrode 360 located adjacent a top surface of layer 814 to drain electrode 818 located adjacent to the bottom surface of semiconductor substrate 812.

Although one type of vertical transistor has been described, the methods and apparatuses described herein are not limited in this regard. In other embodiments, other vertical transistors such as, for example, TrenchFETs or double-diffused metal-on-semiconductor (DMOS) type vertical transistors may be formed using the structure shown in FIG. 50.

After devices 284, 862, 264, and 266 are formed, the wafer or die comprising integrated circuit 810 can be thinned. In other words, a lower portion of substrate 812 can be removed using wafer thinning techniques such as, for example, grinding.

After the wafer thinning, one or more openings or trenches can be formed by remove portions of substrate 812 so that the trenches can be formed to contact the lower surfaces of dielectric structures 76 and 78. Then a dielectric material can be used to fill these trenches to form isolation structures 876 and 878 that contact isolation structures 76 and 78, respectively. The dielectric material used to form isolation structures 876 and 878 can be formed using a lower temperature process and lower temperatures deposition films. In some embodiments, the dielectric material of isolation structures 876 and 878 can comprise an oxide and can be formed using PECVD, atmospheric CVD, or subatmospheric CVD. As an example, the dielectric material of isolation structures 876 and 878 can be formed using a temperature of about 400° C., and this may be advantageous if devices 284, 862, 264, and 266 have any thermally sensitive elements. Isolation structures 876 and 878 may also be referred to as dielectric structures.

After the formation of isolation structures 876 and 878, an electrically conductive material 818 can be formed contacting epitaxial layer 812 and isolation structures 876 and 878. Electrically conductive material can comprise a metal such as, for example, aluminum or copper, formed using a metallization process.

Isolation structures 76, 78, 876, and 878 provide physical and electrical isolation between portions of substrate 812 and layers 814, so that a vertical and/or higher voltage devices such as FET 862 may be integrated with lateral and/or lower voltage devices such as FETs 264 and 266. Dielectric structures 676 (FIG. 48) and 678 (FIG. 48) may be used in place of isolation structures 76 and 78.

Figure 51:
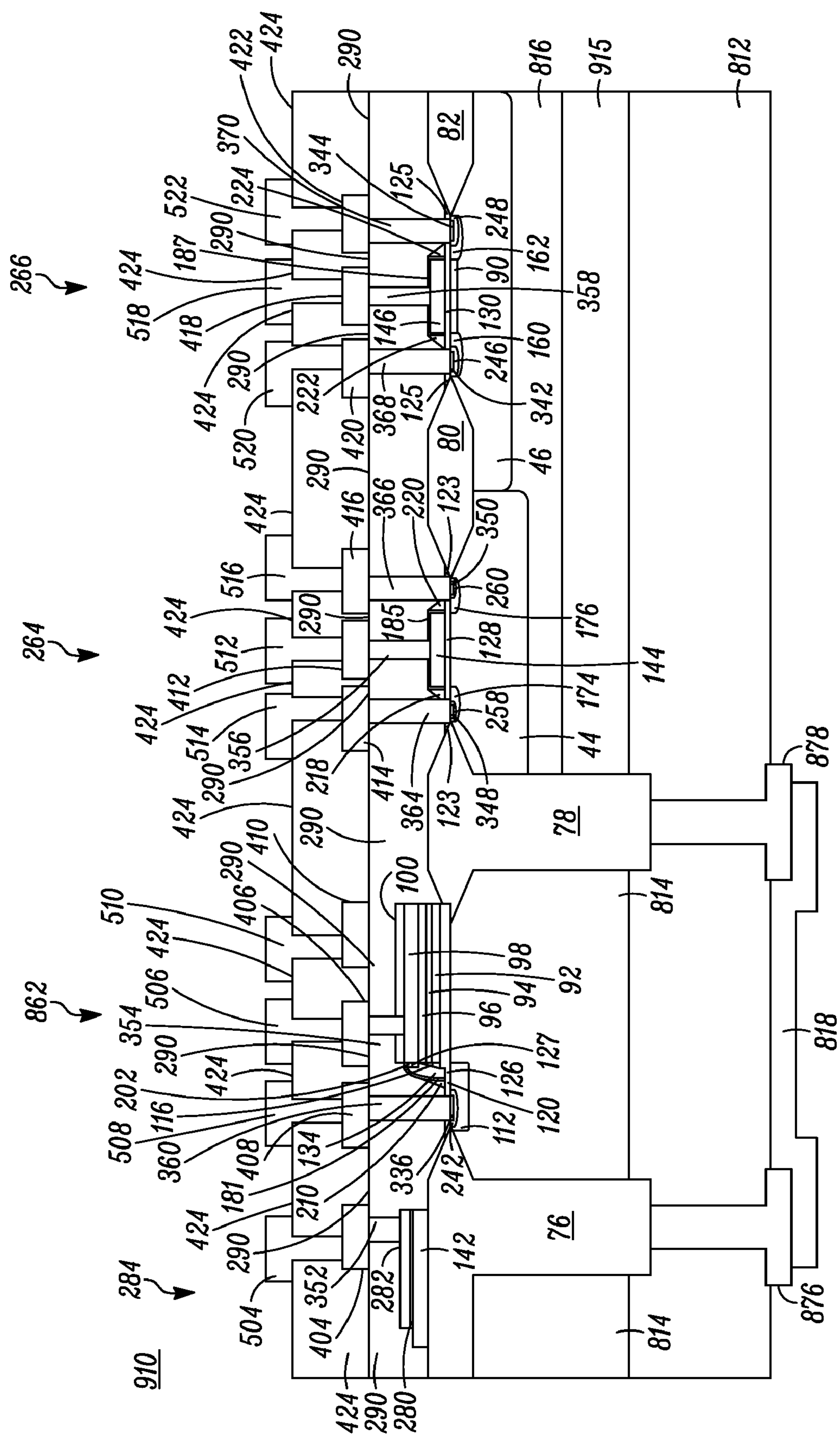
FIG. 51 is a cross-sectional view of another integrated circuit in accordance with an embodiment.

FIG. 51 is a cross-sectional view of another embodiment of an integrated circuit 910. Integrated circuit 910 is similar to integrated circuit 810 (FIG. 50) described above except that in this embodiment, integrated circuit 910 is formed using a dielectric layer 915 in place of semiconductor layer 814 below devices 264 and 266.

Dielectric layer 915 may comprise, for example, silicon dioxide ($SiO_2$) and have a thickness ranging from about 1000 Angstroms (Å) to about 2 microns. In some embodiments, dielectric layer 915 can be a buried oxide (BOX) layer or buried oxide region. In these embodiments, the combination of semiconductor layers 812 and 816 and buried oxide layer 915 may be referred to as a silicon-on-insulator (SOI) substrate or structure. In some embodiments, the SOI structure may be formed by bonding two silicon wafers with oxidized surfaces. For example, a silicon dioxide layer may be formed on two wafers using deposition techniques or thermal growth techniques such as, for example, thermal oxidation of silicon. After forming the interface oxide layers, the wafers may be bonded together by placing the interface oxides in contact with each other. The combined interface oxide layers form buried oxide layer 915. In other embodiments, the SOI structure may be formed by separation by implantation of oxygen (SIMOX). SIMOX may include implanting oxygen ions into a silicon substrate and using a relatively higher temperature anneal to form buried oxide 915.

Dielectric layer 915 can provide isolation between semiconductor material 812 and devices 264 and 266, and this isolation may reduce capacitive coupling or parasitic capacitance between semiconductor material 812 and devices 264 and 266. As a result, the frequency of operation or speed of devices 264 and 266 may be increased by including dielectric layer 915.

Figure 52:
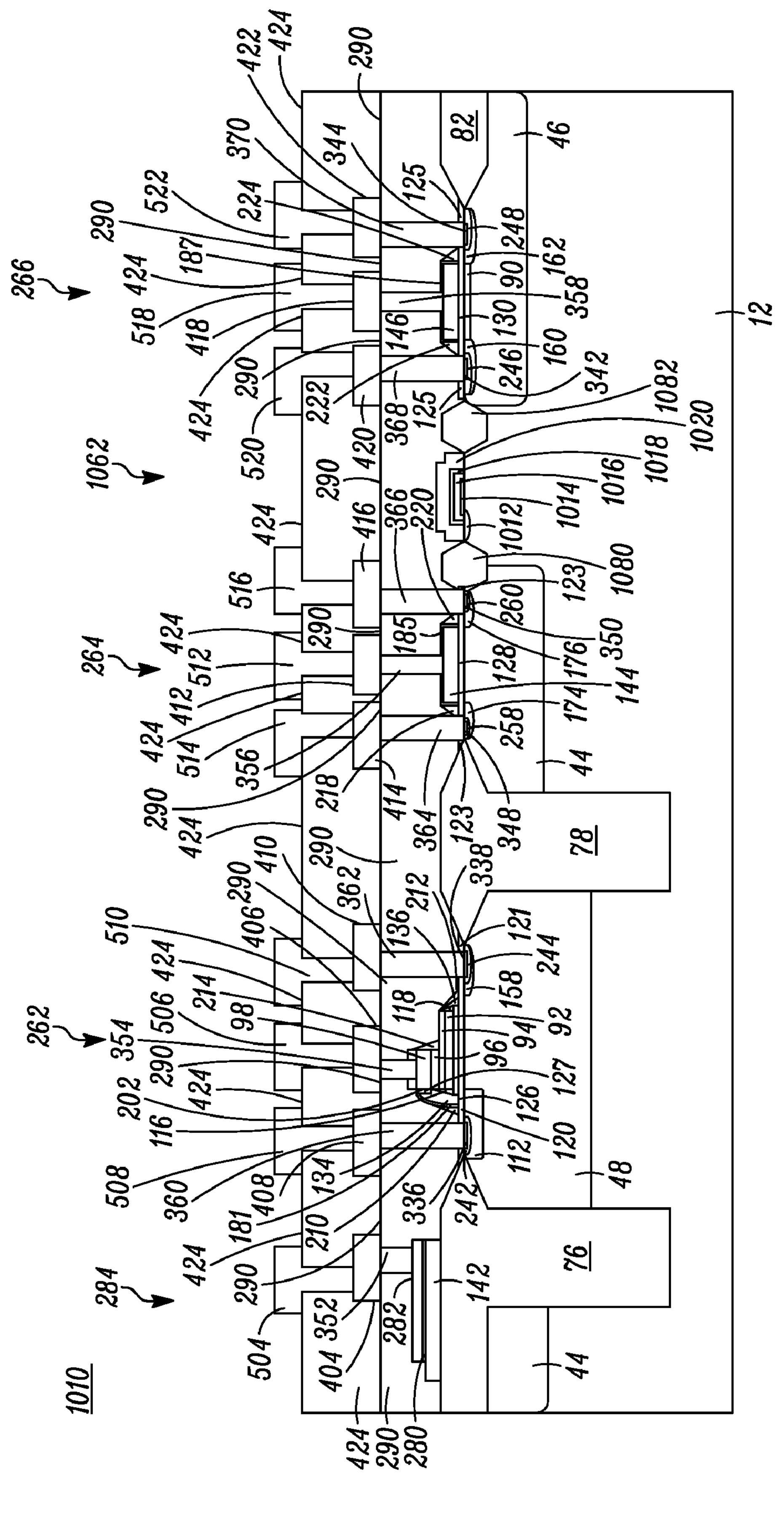
FIG. 52 is a cross-sectional view of another integrated circuit in accordance with an embodiment.

FIG. 52 is a cross-sectional view of another embodiment of an integrated circuit 1010. Integrated circuit 1010 is similar to integrated circuit 10 (FIG. 41) described above except that in this embodiment, integrated circuit 1010 includes a non-volatile memory (NVM) device 1062, isolation regions 1080 and 1082, and does not include an isolation structure 80 (FIG. 41). Isolation structures 76, 78, and 82, active devices 262, 264, and 266 and passive device 284 can be formed using the same or similar processes as described above.

NVM device 1062 includes a control gate 1020, a gate oxide 1018, a floating gate 1016, a tunnel oxide 1014, and an extension implant region 1012. Isolation regions 1080 and 1082 may be a dielectric material such as, for example, silicon dioxide, and may be formed using the same or similar processes used to form isolation structure 82 (FIG. 41) described above.

In some embodiments, tunnel oxide 1014 may be formed using thermal oxidation to convert a portion of semiconductor substrate 12 to silicon dioxide. Floating gate 1016 may be formed by depositing and patterning a layer conductive material such as, for example, doped polysilicon. In some embodiments, floating gate 1016 and shield layer 94 of device 262 may be formed simultaneously by depositing a layer of polysilicon using for example CVD, and then using photolithography and etching processes to pattern this layer of polysilicon to form shield layer 94 and floating gate 1016.

In some embodiments, extension implant region 1012 may be formed after forming floating gate 1016. Extension implant region 1012 can be an n-type doped region formed by using a mask (not shown) and implanting an impurity material of N-type conductivity into a portion of substrate 12. During operation of NVM device 1062, extension implant region 1012 can be the source of the tunneling electrons that are stored as charge in floating gate 1016.

Gate oxide 1018 may be an oxide formed using deposition techniques or thermal growth techniques such as, for example, thermal oxidation of a portion of polysilicon layer 1018. In some embodiments, gate oxide 1018 of device 1062 and gate oxide 126 of device 262, gate oxide 128 of device 264, and gate oxide 130 of device 266 may be formed simultaneously by performing a thermal oxidation to form gate oxides 1018, 126, 128, and 130 simultaneously.

Control gate 1020 may be formed by depositing and patterning a layer conductive material such as, for example, doped polysilicon. In some embodiments, control gate 1020 and gate electrodes 134, 142, and 146 may be formed simultaneously by depositing a layer of polysilicon using for example CVD, and then using photolithography and etching processes to pattern this layer of polysilicon to simultaneously form control gate 1020 of NVM device 1062, gate electrode 134 of FET 262, gate electrode 142 of FET 264, and gate electrode 146 of FET 266. Further, electrode 142 of passive device 284 may be formed simultaneously with gate electrodes 134, 142, 146 and 1020.

Accordingly, integrated circuit 1010 provides an integrated device that includes lower voltage CMOS FETs 264 and 266, higher voltage and higher frequency FET 262, integrated capacitor 284, and NVM 1062 integrated together which can be used to provide a higher performance integrated circuit that can be used to form a system-on-a-chip (SOC). As discussed, elements of devices 262, 264, 266, 284, and 1062 can be formed simultaneously. By forming elements of integrated circuit 1010 simultaneously, additional process steps can be eliminated, thereby reducing the cost and/or complexity of fabricating integrated circuit 1010.

Accordingly, various structures and methods have been disclosed to provide a higher voltage (HV) semiconductor transistor and a method for manufacturing the higher voltage semiconductor transistor. In accordance with one embodiment, a higher voltage semiconductor transistor such as, for example, FETs 262 (FIG. 41) and 862 (FIG. 49), is manufactured having a sidewall gate electrode or spacer gate electrode coupled to a gate interconnect structure. In some embodiments, a higher voltage semiconductor transistor can be a field effect transistor (FET) that has a drain-to-source breakdown voltage (BVdss) of at least about ten volts or greater. The higher voltage semiconductor transistor may be used to implement analog functions or circuitry. The higher voltage semiconductor transistor may be referred to as an analog device, a higher voltage (HV) device, or a higher power device. In some embodiments, the HV transistor is a non-symmetrical or unilateral device such that the source and drain of the HV transistor are not symmetrical and can not be interchanged without affecting the operation or performance of the HV transistor. The HV transistor may be a lateral transistor or a vertical transistor.

In accordance with another embodiment, the lateral higher voltage semiconductor transistor such as, for example, FET 262 (FIG. 41) is integrated with other active devices such as, for example, complementary metal-oxide semiconductor (CMOS) devices 264 (FIG. 41) and 266 (FIG. 41), although the methods and apparatuses described herein are not limited in this regard. In some embodiments, the FETs of the CMOS devices may have a breakdown voltage of about six volts or less. The CMOS devices may be used to implement digital functions or circuitry. The CMOS devices or transistors may be referred to as a digital device, a lower voltage (LV) device, or a lower power device. In some embodiments, the CMOS transistors are symmetrical or bilateral devices such that the source and drain of each of the CMOS FETs are symmetrical and can be interchanged without affecting the operation or performance of the CMOS transistors.

In accordance with another embodiment, a higher voltage semiconductor transistor such as, for example, FETs 262 (FIG. 41) and 862 (FIG. 49), is monolithically integrated with an integrated passive device such as, for example, capacitor 284 (FIG. 41). In accordance with yet another embodiment, the higher voltage semiconductor transistor is monolithically integrated with an active device and an integrated passive device.

Although specific embodiments have been disclosed herein, it is not intended that the claimed subject matter be limited to the disclosed embodiments. Those skilled in the art will recognize that modifications and variations can be made without departing from the spirit of the claimed subject matter. It is intended that the claimed subject matter encompass all such modifications and variations as fall within the scope of the appended claims.

What is claimed is:

1. A method to form an integrated circuit, the method comprising:

forming a first portion of an active device wherein the active device is a higher voltage higher frequency non-symmetrical analog transistor and comprises a plurality of doped regions in a semiconductor material;

forming a first portion of a lower voltage digital CMOS device;

forming a first portion of a passive device;

forming a first portion of a memory device; and forming a dielectric structure;

wherein the first portion of the active device, the first portion of the lower voltage digital CMOS device, the first portion of the passive device, or the first portion of the memory device, or combinations thereof, are formed simultaneously or nearly simultaneously;

wherein the higher frequency of the active device is based at least in part on a relatively shorter channel length of the active device, wherein the channel length of the active device is a function of a deposition thickness of a gate material of the active device;

wherein the dielectric structure extends from a surface of the semiconductor material to a distance below all of the doped regions of the plurality of doped regions of the active device;

wherein the memory device has a doped region;

wherein the dielectric structure is between the plurality of doped regions of the active device and the doped region of the memory device and the dielectric structure surrounds the plurality of doped regions of the active device; and wherein at least a portion of the passive device is disposed over the dielectric structure.

2. The method of claim 1, wherein:

the active device is a transistor having a control electrode, the passive device is a capacitor having a first plate, and the memory device is a non-volatile memory (NVM) device having a control electrode;

wherein said forming the first portion of the active device, forming the first portion of the passive device, or forming the first portion of the memory device, or combinations thereof, comprise forming the control electrode of the transistor, the control electrode of the NVM device, or the first plate of the capacitor, or combinations thereof simultaneously or nearly simultaneously.

3. An integrated circuit, comprising:

an active device having a first portion and a plurality of doped regions in a semiconductor material, wherein the active device comprises a higher voltage higher frequency non-symmetrical analog transistor;

a lower voltage digital CMOS device having a first portion;

a passive device having a first portion;

a memory device having a first portion; and a dielectric structure extending from a surface of the semiconductor material to a distance below all or nearly all of the doped regions of the plurality of doped regions of the active device;

wherein the first portion of the active device, the first portion of the lower voltage digital CMOS device, the first portion of the passive device, or the first portion of the memory device, or combinations thereof, are formed simultaneously or nearly simultaneously;

wherein the higher frequency of the active device is based at least in part on a relatively shorter channel length of the active device, wherein the channel length of the active device is a function of a deposition thickness of a gate material of the active device;

wherein the memory device has a doped region;

wherein the dielectric structure is disposed between the plurality of doped regions of the active device and the doped region of the memory device;

wherein the dielectric structure at least partially surrounds the plurality of doped regions of the active device; and wherein at least a portion of the passive device is disposed over the dielectric structure.

4. The integrated circuit of claim 3, wherein the active device comprises a transistor having a control electrode, the passive device is a capacitor having a first plate, and the memory device is a non-volatile memory (NVM) device having a control electrode;

wherein the control electrode of the transistor, the control electrode of the NVM device, or the first plate of the capacitor, or combinations thereof, are formed simultaneously or nearly simultaneously.

* * * * *